(12) United States Patent
Ikemoto et al.

(10) Patent No.: US 7,313,307 B2
(45) Date of Patent: Dec. 25, 2007

(54) WAVEGUIDE AND DEVICE INCLUDING THE SAME

(75) Inventors: Kiyokatsu Ikemoto, Yokohama (JP); Akinari Takagi, Yokosuka (JP); Hikaru Hoshi, Yokohama (JP); Kazuya Nobayashi, Kawasaki (JP); Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/558,561

(22) Filed: Nov. 10, 2006

(65) Prior Publication Data
US 2007/0110381 A1 May 17, 2007

(30) Foreign Application Priority Data
Nov. 14, 2005 (JP) ............... 2005-329025

(51) Int. Cl.
*G02B 6/10* (2006.01)
(52) U.S. Cl. ....................... 385/129; 385/131
(58) Field of Classification Search ............... 385/129, 385/131
See application file for complete search history.

(56) References Cited

U.S. PATENT DOCUMENTS

| 5,335,240 | A  | * | 8/1994 | Ho et al. ........................ 372/39 |
| 6,521,136 | B1 | * | 2/2003 | Sfez et al. ..................... 216/24 |
| 6,993,235 | B2 | * | 1/2006 | Takagi et al. ................ 385/129 |
| 7,085,467 | B2 | * | 8/2006 | Ikemoto et al. ............. 385/129 |
| 7,274,849 | B2 | * | 9/2007 | Nobayashi et al. ......... 385/131 |
| 2004/0264903 | A1 |  | 12/2004 | Dridi et al. |

FOREIGN PATENT DOCUMENTS

| EP | 1574884 A | 9/2005 |
| JP | 2001-074955 A | 3/2001 |

OTHER PUBLICATIONS

Eli Yablonovitch, "Inhibited Spontaneous Emission in Solid-State Physics and Electronics", Physical Review Letters, vol. 58, pp. 2059-2062, 1987.
Extended Abstract of the 65th Meeting of the Japan Society of Applied Physics, No. 3, pp. 936, Sep. 2004, Tohoku Gakiun University.
Sell, Curtis et al. "Waveguide networks in three-dimensional layer-by-layer photonic cyrstals", Applied Physics Letters, AIP, American Institute of Physics, Melville, NY, vol. 84, No. 23, Jun. 7, 2004, pp. 4605-4607.

* cited by examiner

*Primary Examiner*—Ellen E. Kim
(74) *Attorney, Agent, or Firm*—Canon USA, Inc., IP Division

(57) ABSTRACT

At least one exemplary embodiment is directed to a waveguide including a plurality of linear defects of a three-dimensional photonic crystal, the plurality of linear defects include a first defect formed by changing the medium of some of columnar structures to a medium different from that of the columnar structures and a second linear defect formed by shifting the position or changing the shape of some of the columnar structures extending in the same direction as the first linear defect, and the first linear defect and the second linear defect are disposed apart by 0.5 times the out-of-plane lattice period or more in the stacking direction of the three-dimensional photonic crystal.

14 Claims, 36 Drawing Sheets

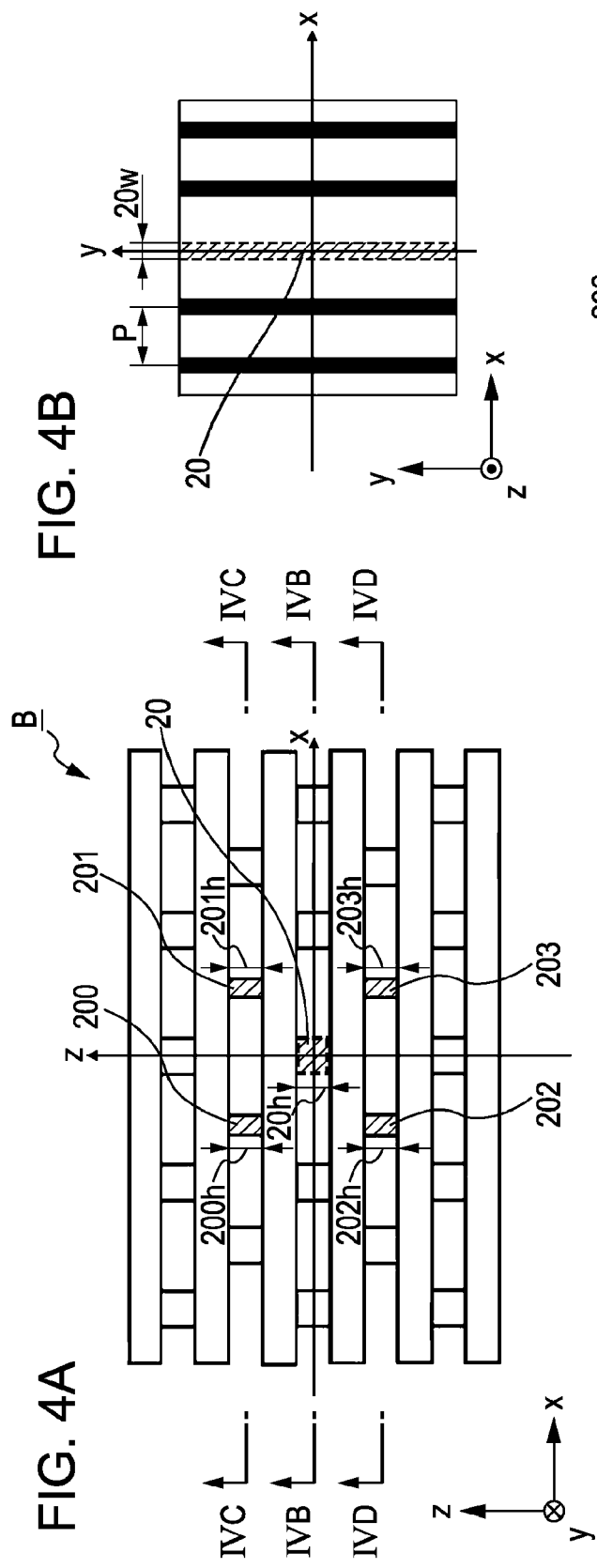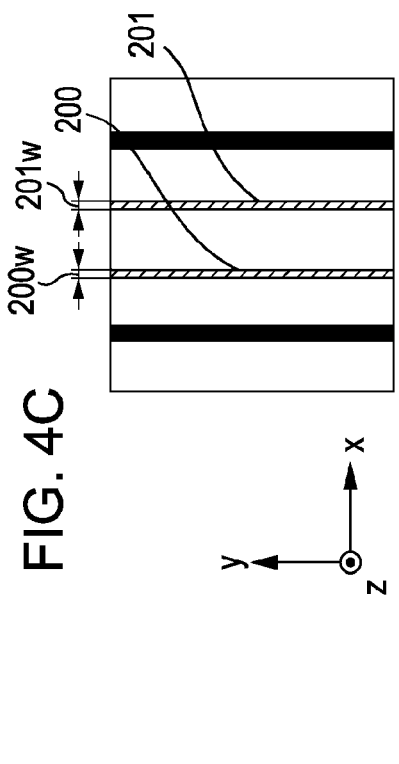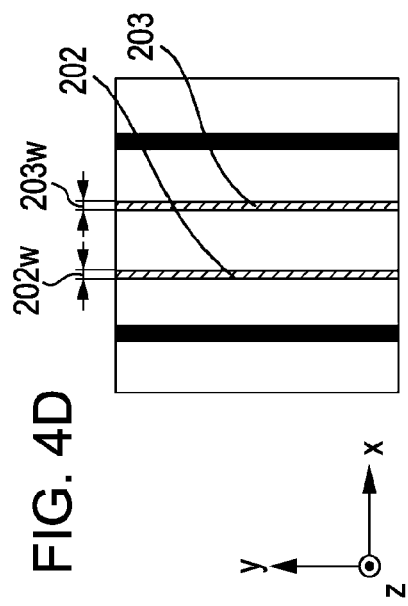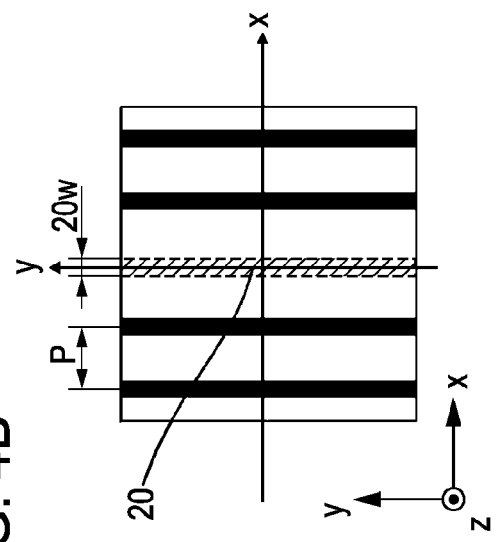

x-z CROSS-SECTION

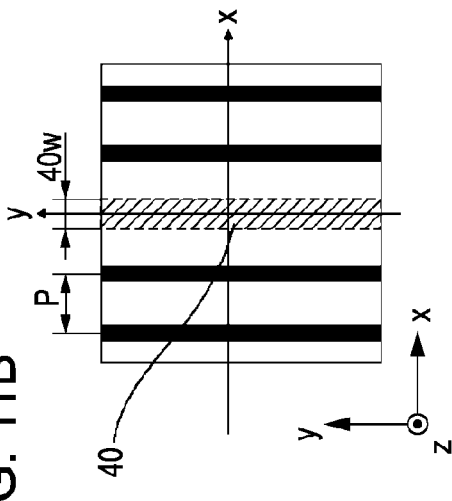
FIG. 11B
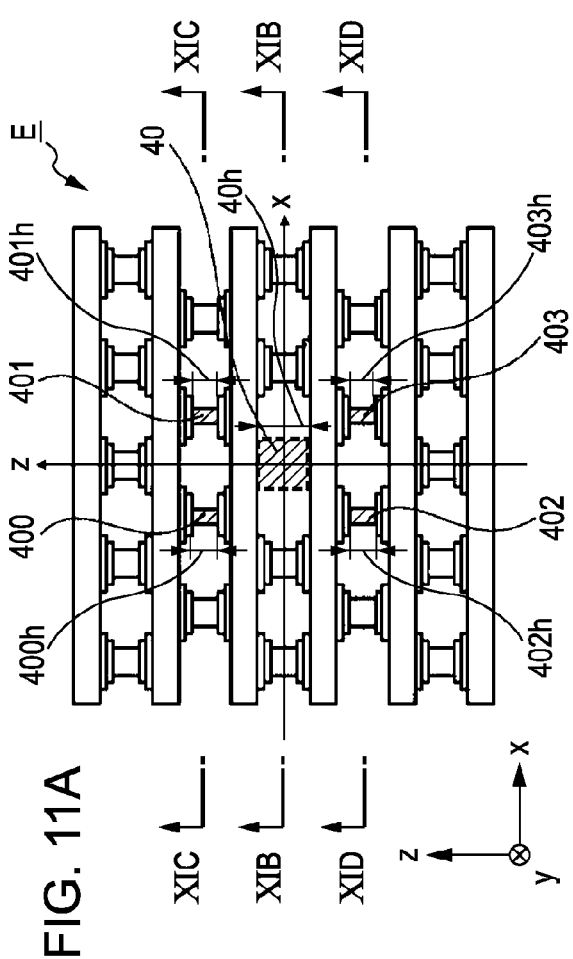
FIG. 11A
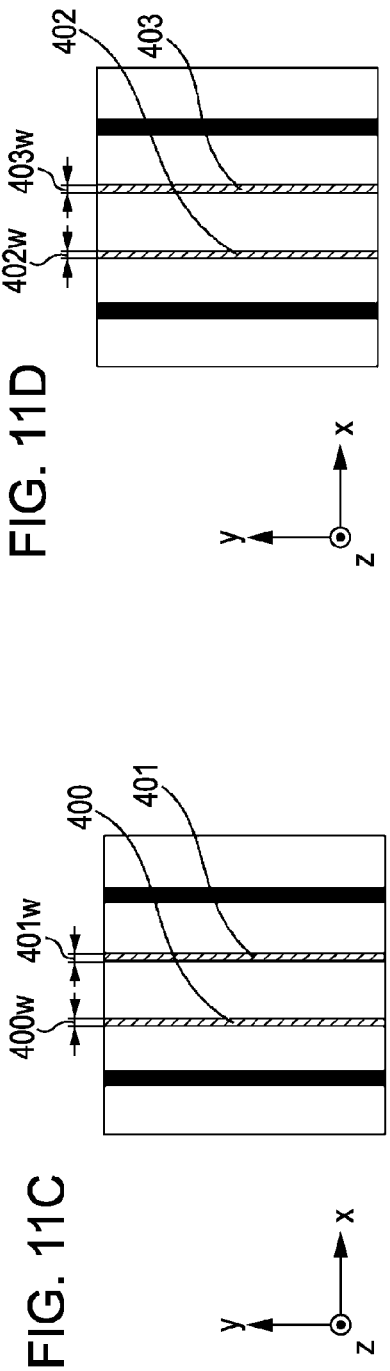
FIG. 11D
FIG. 11C x-z CROSS-SECTION 600w2, 601w2, 602w2, 603w2

400w, 401w, 402w, 403w x, y z, y x-z CROSS-SECTION

1200Δx, 1201Δx, 1202Δx, 1203Δx

1200Δx, 1201Δx, 1202Δx, 1203Δx x-z CROSS-SECTION

1500Δx, 1501Δx, 1502Δx, 1503Δx

1400Δx, 1401Δx, 1402Δx, 1403Δx

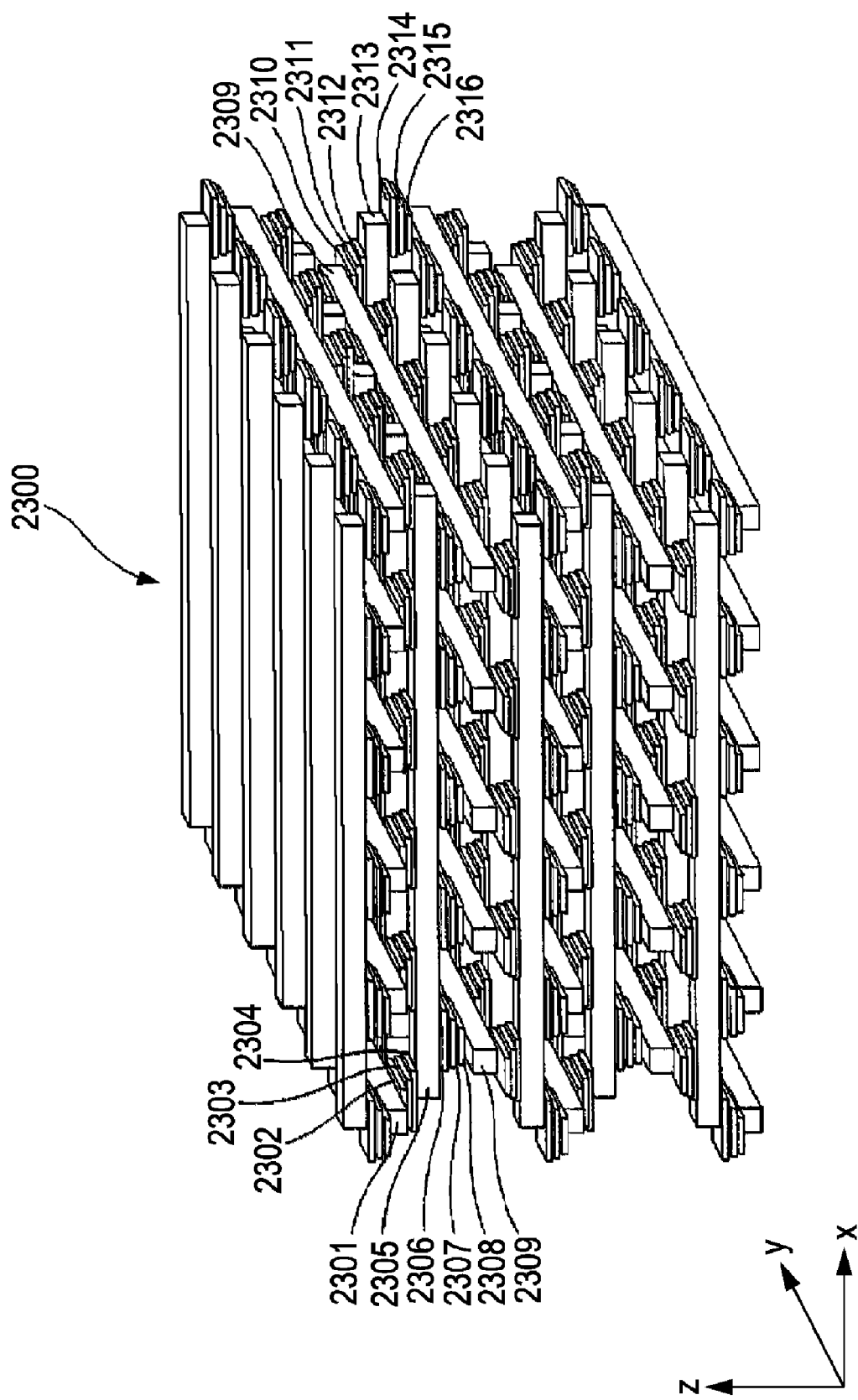

WAVEGUIDE AND DEVICE INCLUDING THE SAME

CROSS-REFERENCE TO RELATED APPLICATIONS

This application is related to the following applications, all of which are filed on the same day and assigned to the same assignee as the present application:

"WAVEGUIDE AND DEVICE INCLUDING THE SAME" U.S. application Ser. No. 11/558,563

BACKGROUND OF THE INVENTION

1. Field of the Invention

The present invention relates to a waveguide using a three-dimensional photonic crystal having a three-dimensional periodic-refractive-index structure, and to a device including the waveguide.

2. Description of the Related Art

The concept of controlling transmission and reflection characteristics of electromagnetic waves with structures having a size equal to or smaller than the wavelength has been proposed by Yablonovitch (Physical Review Letters, Vol. 58, pp. 2059, 1987). According to this document, transmission and reflection characteristics of electromagnetic waves can be controlled by periodically arraying structures having a size equal to or smaller than the wavelength. When the electromagnetic waves are visible light, transmission and reflection characteristics of the light can be controlled. Such a structure is known as a photonic crystal. It has been suggested that photonic crystals can be used to realize a reflective mirror having a reflectance of 100%, at which the optical loss is zero, in a certain wavelength range. Thus, the concept in which a reflectance of 100% can be realized in a certain wavelength range is referred to as a photonic bandgap, making reference to the energy gap of semiconductors.

In addition, when the structures having a size equal to or smaller than the wavelength have a three-dimensional fine periodic structure, the photonic bandgap can be realized for light incident from all directions. Hereinafter, this is referred to as "complete photonic bandgap". Optical devices having a new function can be realized using the complete photonic bandgap. For example, by forming a periodic defect such as a point defect or a linear defect in a photonic crystal, the photonic crystal can operate as a resonator or a waveguide. It is known that, in particular, when a linear defect is appropriately provided, a waveguide with a steep bend and an add-drop waveguide can be realized while light is strongly confined in the linear defect (Japanese Patent Laid-Open No. 2001-74955 and the extended abstracts of the 65th meeting of the Japan Society of Applied Physics, No. 3, pp. 936).

Examples of three-dimensional photonic crystals that can realize the complete photonic bandgap include structures shown in FIGS. 23A to 23F. FIG. 23A shows a diamond opal structure, FIG. 23B shows a woodpile structure, FIG. 23C shows a spiral structure, FIG. 23D shows a unique three-dimensional periodic structure, FIG. 23E shows an inverse structure of a three-dimensional periodic structure, and FIG. 23F shows a diamond woodpile structure.

When a waveguide is produced utilizing the complete photonic bandgap (PBG) by a three-dimensional photonic crystal, in general, a frequency range in which light is guided in a single mode and a frequency range in which light is guided in a multiple mode are present for light having a certain frequency in the PBG. Among the modes in which light is guided in the waveguide, the term "single mode" means the mode in which light is guided in a state in which a single wavenumber vector is possessed for the light having a certain frequency. Each waveguide mode has an intrinsic periodic electromagnetic field intensity distribution in the waveguide.

In a waveguide used for an optical circuit, a light-emitting device, or the like, the waveguide must have a desired confinement effect and light must be guided in the single mode at a desired frequency. In addition, when light guided in the waveguide is supplied to the outside, it is important that the electromagnetic field intensity distribution of the light at an end of the waveguide is a single-peaked intensity distribution having a satisfactory symmetry in a cross-section perpendicular to the waveguide direction. The electromagnetic field intensity distribution of the light at the end of the waveguide is formed according to the electromagnetic field intensity distribution of each waveguide mode in a plane perpendicular to the waveguide direction. Therefore, it is important that the waveguide mode has a single-peaked electromagnetic field intensity distribution concentrated in a predetermined area in a plane perpendicular to the waveguide direction.

According to the description of Japanese Patent Laid-Open No. 2001-74955, linear defects are provided inside the woodpile structure shown in FIG. 23B to form a waveguide. Some of the columnar structures are removed to form the linear defects. This structure can realize a waveguide in which light can be guided in a single mode in a specific range, and in a mode having an electromagnetic field intensity distribution that is close to a single-peaked distribution. However, light is guided in a multiple mode in a part of the frequency range of the photonic bandgap, and thus the available range is limited. Furthermore, when a medium constituting the three-dimensional photonic crystal is composed of a medium having a low refractive index, the width of the photonic bandgap is small. Accordingly, the frequency range that can be used in the single mode is markedly decreased.

The extended abstracts of the 65th meeting of the Japan Society of Applied Physics, No. 3, pp. 936 describes a waveguide in which linear defects are provided inside the woodpile structure shown in FIG. 23B, and columnar structures are additionally formed in layers adjacent to the linear defects. According to this waveguide structure, light can be guided in a single mode over a relatively wide frequency range. FIGS. 24A and 24B show the electromagnetic field intensity distribution in a plane perpendicular to the waveguide direction of the waveguide mode and the electromagnetic field intensity distribution in a plane parallel to the waveguide direction and the stacking direction, respectively. In FIG. 24A, the white central part represents higher electromagnetic field intensity. This electromagnetic field intensity distribution is not suitable in view of the application because this distribution has a double-peaked electromagnetic field intensity distribution in which the electromagnetic field is highly concentrated at the added columnar structures. In addition, the electromagnetic field intensity distribution markedly changes in the waveguide (FIG. 24B). Therefore, in the case where this waveguide structure is arranged with another resonator structure or another waveguide structure, when the arrangement of each structure is slightly shifted by an error in the preparation, the positional relationship in the electromagnetic field intensity distribution markedly changes. The propagation characteristic of the electromagnetic field of the individual structures depends on the positional relationship of the electromagnetic field intensity distribution of the structures. Therefore, when the arrangement of the structures changes slightly, the propagation characteristic of electromagnetic field between the individual structures changes markedly, resulting in a significant change in the performance of the device. Accordingly, in order to obtain a desired performance using the device having the waveguide structure described in the extended abstracts of the 65th meeting of the Japan Society of Applied Physics, No. 3, pp. 936, the individual structures must be arranged with high accuracy, and it is difficult to produce such a device.

Furthermore, the above-described waveguide structures do not include an element for changing the frequency of the waveguide mode. Therefore, these structures cannot provide a waveguide that can guide light in a single mode over a desired frequency range.

SUMMARY OF THE INVENTION

At least one exemplary embodiment of the present invention is directed to a waveguide using a three-dimensional photonic crystal in which light can be guided in a mode that is a single mode and has a single-peaked electromagnetic field intensity distribution in a plane perpendicular to the waveguide direction, and guided over a desired frequency range, and a device including the waveguide.

According to a waveguide of at least one exemplary embodiment of the present invention, in a waveguide including a plurality of linear defects of a three-dimensional photonic crystal, the three-dimensional photonic crystal includes a first layer including a plurality of columnar structures disposed at a predetermined interval; a second layer including a plurality of columnar structures disposed at the predetermined interval, the columnar structures extending in a direction different from that in which the columnar structures in the first layer extend; a third layer including a plurality of columnar structures disposed at the predetermined interval, the columnar structures extending in the same direction as the columnar structures in the first layer; and a fourth layer including a plurality of columnar structures disposed at the predetermined interval, the columnar structures extending in the same direction as the columnar structures in the second layer, wherein the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures. In the waveguide of at least one exemplary embodiment of the present invention, the plurality of linear defects include a first linear defect formed by changing the medium of some of the columnar structures to a medium different from that of the unchanged columnar structures and a second linear defect formed by shifting the position or changing the shape of some of the columnar structures extending in the same direction as the first linear defect, and the first linear defect and the second linear defect are disposed apart by 0.5 times the out-of-plane lattice period or more in the stacking direction of the three-dimensional photonic crystal.

Further features of the present invention will become apparent from the following description of exemplary embodiments with reference to the attached drawings.

BRIEF DESCRIPTION OF THE DRAWINGS

FIGS. 4A to 4D are schematic views of the relevant parts according to a first exemplary embodiment of the present invention.

FIGS. 11A to 11D are schematic views of the relevant parts according to a second exemplary embodiment of the present invention.

FIG. 40A is a view illustrating a photonic crystal having discrete structures.

DESCRIPTION OF THE EMBODIMENTS

First Exemplary Embodiment

Figure 1:
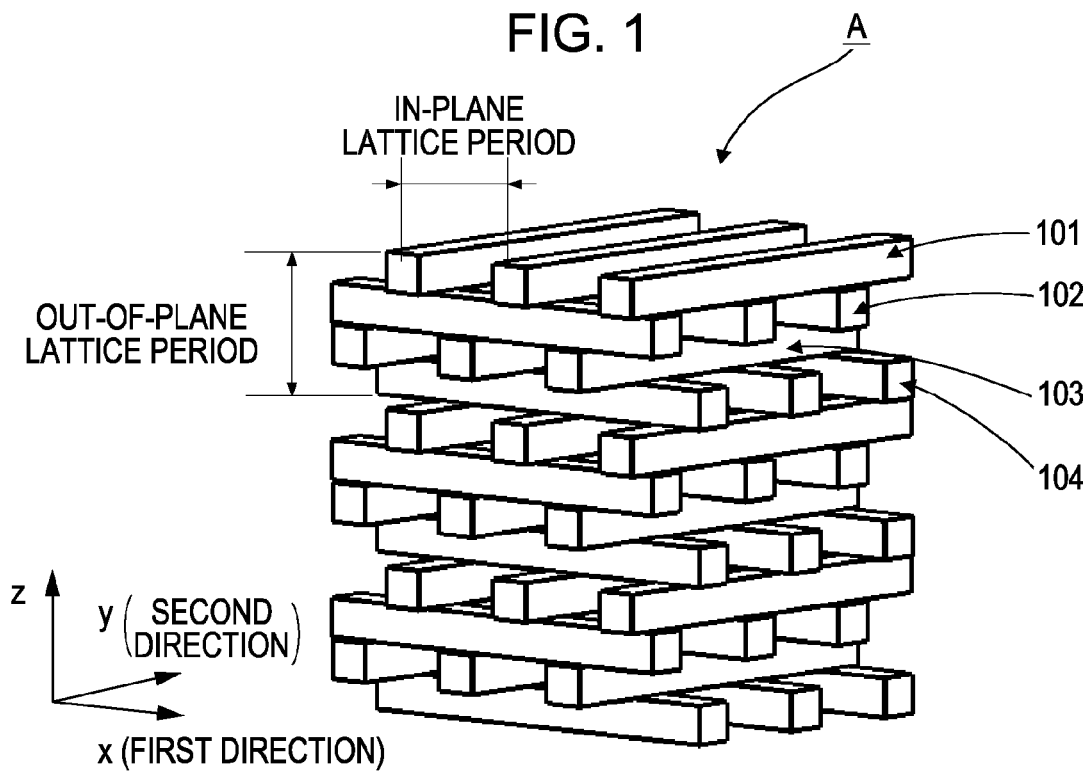
FIG. 1 is a view illustrating a woodpile structure A.

FIG. 1 is a view of a woodpile structure A. The woodpile structure A includes four layers 101 to 104 forming the fundamental period in the x-y plane.

Figure 2:
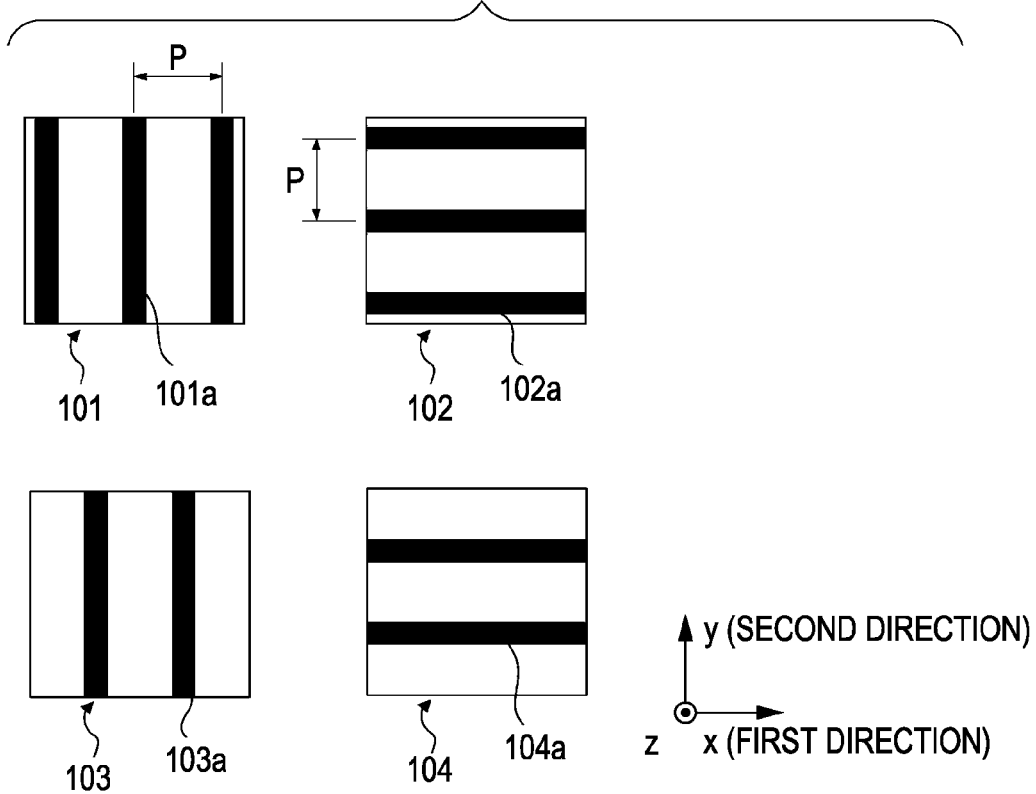
FIG. 2 includes views illustrating individual layers of the woodpile structure A.

FIG. 2 shows x-y cross-sectional views of the individual layers of the woodpile structure A. In the first layer 101 and the third layer 103, a plurality of columnar structures 101a and 103a extending in the y-axis direction are periodically disposed at regular intervals P in the x-axis direction. Each of the columnar structures 101a is disposed at a position shifted by P/2 from the position of the corresponding columnar structure 103a in the x-axis direction. In the second layer 102 and the fourth layer 104, a plurality of columnar structures 102a and 104a extending in the x-axis direction are periodically disposed at regular intervals P in the y-axis direction. Each of the columnar structures 102a is disposed at a position shifted by P/2 from the position of the corresponding columnar structure 104a in the y-axis direction. The refractive index of the material constituting the columnar structures 101a to 104a, the shape of the columnar structures, the intervals at which the columnar structures are disposed, and the thickness of the layers can be optimized, thereby obtaining a complete photonic bandgap over a desired frequency range.

Table 1 shows structural parameters of the woodpile structure A. Herein, the term "in-plane lattice period" represents the interval P of the columnar structures 101a to 104a shown in FIG. 2. The term "out-of-plane lattice period" represents the fundamental period formed by a plurality of layers. In the woodpile structure A, the out-of-plane lattice period represents the total length corresponding to the four layers 101 to 104 in the stacking direction. The term "refractive index" described in Table 1 represents the refractive index of a medium constituting the columnar structures 101a to 104a of the woodpile structure. A medium constituting parts other than the columnar structures of the woodpile structure is for example air, and the refractive index thereof is 1.0. The term "columnar structure width" represents the length of the columnar structure in the direction perpendicular to the direction in which the columnar structure in the layer extends. The term "columnar structure height" represents the length of the columnar structure in the stacking direction (z-axis direction).

TABLE 1

| ♦Structure A •Woodpile structure A | |
| --- | --- |
| Refractive index | 2.4 |
| In-plane lattice period | P |
| Out-of-plane lattice period | 1.4 P |
| Columnar structure width | 0.35 P |
| Columnar structure height | 0.35 P |

Figure 3:
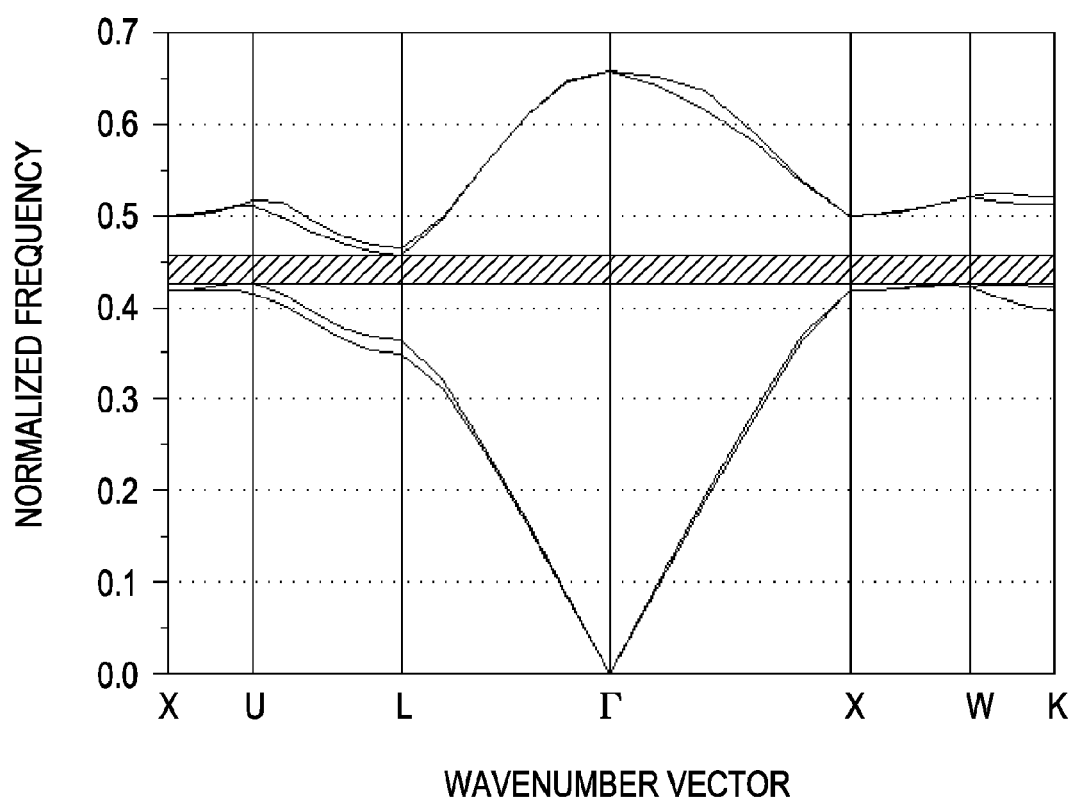
FIG. 3 is a graph showing the normalized frequency of the woodpile structure A.

FIG. 3 is a graph showing the photonic bandgap of the woodpile structure A calculated by the plane-wave expansion method. The abscissa of the graph represents the wavenumber vector, that is, the incident direction of electromagnetic waves incident on the photonic crystal. For example, point K represents a wavenumber vector parallel to the x-axis (or y-axis), and point X represents a wavenumber vector having a slope of 45° with respect to the x-axis (or y-axis) in the x-y plane. The ordinate of the graph represents a normalized frequency normalized by a lattice period.

A complete photonic bandgap in which light cannot be present regardless of the incident direction of the light is formed in the frequency range shown by the shaded area in FIG. 3. When a defect that causes disorder in the period is provided inside such a three-dimensional photonic crystal, a defect mode having a frequency within the complete photonic bandgap is generated. The frequency and the wavenumber vector of this defect mode are determined by the shape or the medium of the defect. When a linear defect is provided, the dimension of the wavenumber vector is not limited in the direction of extension of the linear defect. Consequently, in the defect mode, light is guided in the direction of extension of the linear defect.

FIGS. 4A to 4D are schematic views of a waveguide structure B in which linear defects are provided inside the woodpile structure A. FIG. 4A is an x-z cross-sectional view of the waveguide structure B. FIGS. 4B to 4D are x-y cross-sectional views of the waveguide structure B in cross-section IVB, cross-section IVC, and cross-section IVD, respectively. The waveguide structure B includes a linear defect (first linear defect) 20 extending in the y-axis direction inside the woodpile structure A shown in FIG. 1. The waveguide structure B also includes second linear defects 200, 201, 202 and 203 that are disposed in layers different from the layer having the first linear defect 20 and that are provided in some of the columnar structures extending in the y-axis direction. The first linear defect 20 is an area where one of the columnar structures is removed in the first layer 101. The second linear defects 200 to 203 are formed by changing the columnar structure width of some of the columnar structures in the third layer 103.

Table 2 shows the structural parameters of the waveguide structure B. The center of the first linear defect 20 in the x-z cross-section of FIG. 4A is defined as the origin of the coordinates. The length of each defect in the x-axis direction in the layer is defined as a defect width. The length of each defect in the stacking direction (z-axis direction) is defined as a defect height.

In Table 2 and FIGS. 4A to 4D, the defect widths are represented by 20w and 200w to 203w, and the defect heights are represented by 20h and 200h to 203h.

TABLE 2

| ♦Waveguide structure B | |
|---|---|
| •Photonic crystal structure | |
| Refractive index | 2.4 |
| In-plane lattice period | P |
| Out-of-plane lattice period | 1.4 P |
| Columnar structure width | 0.35 P |
| Columnar structure height | 0.35 P |
| •First linear defect 20 | |
| Central coordinates (x, z) | (0.00 P, 0.00 P) |
| Refractive index | 1.0 |
| Defect width 20 w | 0.35 P |
| Defect height 20 h | 0.35 P |
| •Second linear defect 200 | |
| Central coordinates (x, z) | (−0.05 P, 0.70 P) |
| Defect width 200 w | 0.20 P |
| Defect height 200 h | 0.35 P |
| •Second linear defect 201 | |
| Central coordinates (x, z) | (0.50 P, 0.70 P) |
| Defect width 201 w | 0.20 P |
| Defect height 201 h | 0.35 P |
| •Second linear defect 202 | |
| Central coordinates (x, z) | (−0.05 P, −0.70 P) |
| Defect width 202 w | 0.20 P |
| Defect height 202 h | 0.35 P |
| •Second linear defect 203 | |
| Central coordinates (x, z) | (0.50 P, −0.70 P) |
| Defect width 203 w | 0.20 P |
| Defect height 203 h | 0.35 P |

Figure 5A:
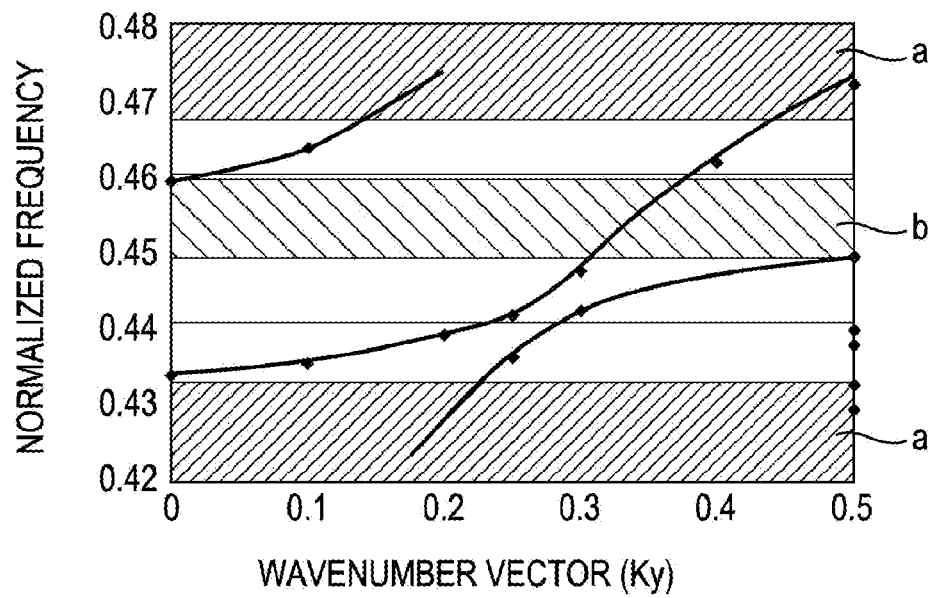
FIGS. 5A and 5B are views showing the waveguide mode of the first exemplary embodiment of the present invention.

FIG. 5A shows the waveguide mode of the waveguide structure B calculated by the finite-difference time-domain (FDTD) method. The abscissa of the graph represents the dimension of a component in the waveguide direction (y-axis direction) of the wavenumber vector normalized by the lattice period P. The ordinate of the graph represents the frequency normalized by the lattice period P (normalized frequency). The frequency ranges shown by areas a in FIG. 5A show the frequency ranges other than the complete photonic bandgap. The mode present in the complete photonic bandgap shows defect modes due to the defects. The frequency range shown by area b in FIG. 5A shows the frequency range in which light can be guided in a single mode among the defect modes.

As shown in FIG. 5A, the frequency range in which light can be guided in single mode is in the range of about 0.449 to about 0.459. When the waveguide mode in the case where only the first linear defect 20 is provided and the second linear defects 200 to 203 are not provided in the waveguide structure B is calculated by the FDTD method (or any other equivalent method capable of solving the Maxwell Equations for the photonic crystal using boundary conditions, as known by one of ordinary skill in the relevant arts), the frequency range in which light can be guided in a single mode is in the range of about 0.433 to about 0.440. These results show that the formation of the second linear defects 200 to 203 can provide a waveguide that can guide light in a single mode over a wider frequency range.

Figure 5B:
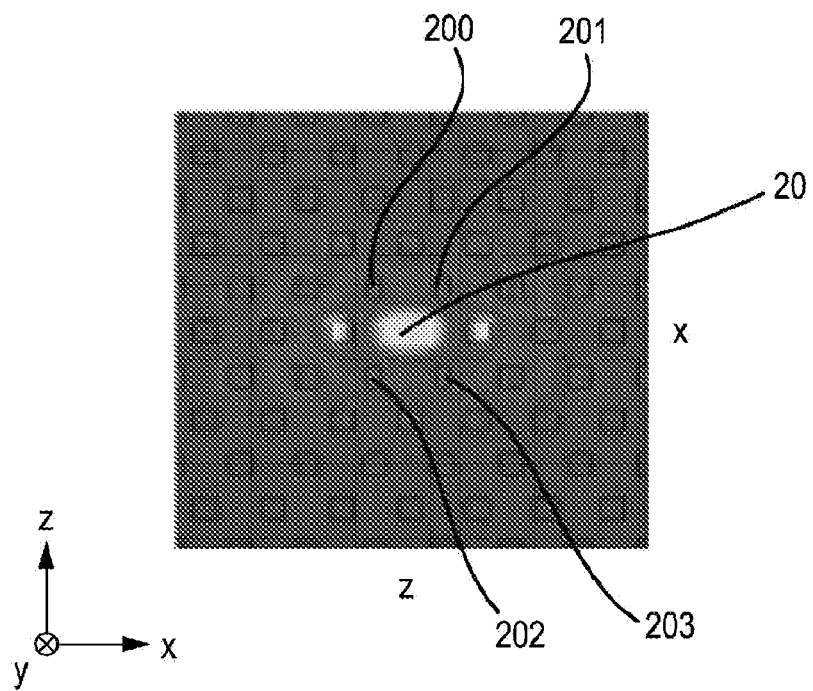

FIG. 5B shows the electromagnetic field intensity distribution in the x-z cross-section of the waveguide mode in the frequency range in which light can be guided in a single mode. The parts shown by the white area represent the area having high electromagnetic field intensity. This result shows that the waveguide mode has a single-peaked electromagnetic field intensity distribution in which the electromagnetic field intensity is highly concentrated near the center of the waveguide.

Figure 6:
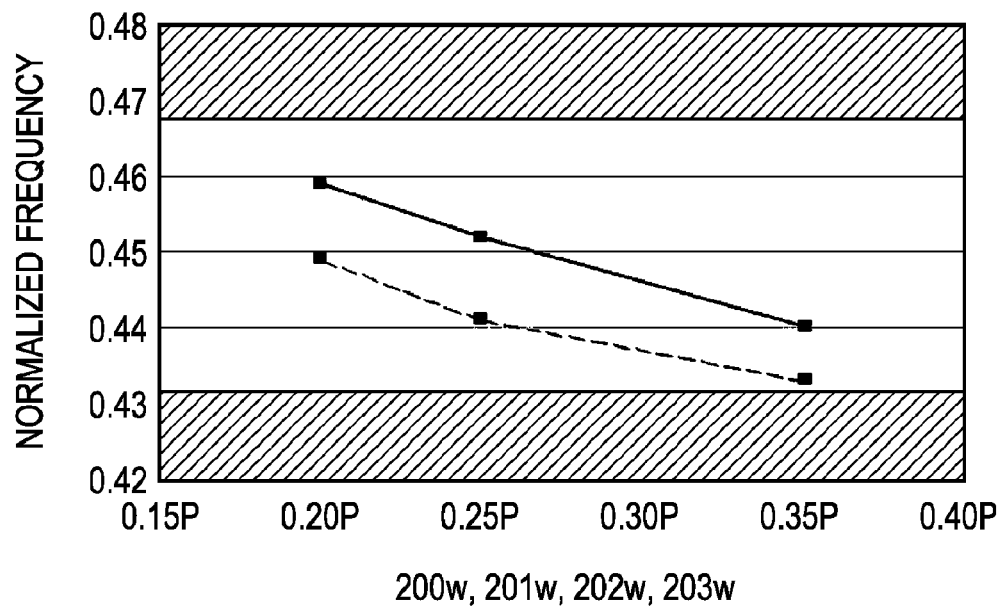
FIG. 6 is a graph showing the normalized frequency of the first exemplary embodiment of the present invention.

FIG. 6 shows the change in the frequency range in which light can be guided in a single mode in the case where the defect widths 200w, 201w, 202w, and 203w of the second linear defects 200 to 203 in the waveguide structure B are changed by the same amount at the same time.

In FIG. 6, the abscissa represents the defect width and the ordinate represents the normalized frequency. The continuous line and the broken line that join the points in FIG. 6 represent the high frequency and the low frequency, respectively, in the frequency range in which light can be guided in a single mode. By changing the defect widths 200w, 201w, 202w, and 203w, the frequency range in which light can be guided in a single mode can be changed. Accordingly, in the waveguide structure B, the frequency range in which light can be guided in a single mode can be controlled by changing the shape of the second linear defects 200 to 203.

The waveguide structure B of the present exemplary embodiment can control the frequency range in which light can be guided in a single mode, and provide a mode having a single-peaked or substantially single-peaked intensity distribution in the plane perpendicular to the waveguide direction. The reason for this will be described.

In the waveguide mode of the waveguide structure B, when the electromagnetic field intensity distribution of the waveguide mode close to the low frequency side of the PBG is compared with the electromagnetic field intensity distribution of the waveguide mode close to the high frequency side, the electromagnetic field intensity distribution of the mode close to the low frequency side is relatively highly concentrated on the linear defects. In contrast, in the mode close to the high frequency side, the electromagnetic field intensity distribution expands to areas distant from the linear defects. In particular, the electromagnetic field intensity distribution expands in the stacking direction with respect to the linear defects.

The relationship between the frequency of light and the wavenumber vector is determined by the refractive index of the space. Similarly, the relationship between the frequency of the waveguide mode and the wavenumber vector is determined by the mode refractive index. Accordingly, when the wavenumber vector is constant, the lower the mode refractive index, the higher the frequency of the mode. In addition, the mode refractive index is determined by the ratio with which the electromagnetic field intensity distribution of the mode is concentrated on a part of the structure having a high refractive index.

When second linear defects are provided at positions distant from a linear defect in the stacking direction and the shape of the second linear defects is changed, the refractive index of the mode close to the high frequency side of the guided mode changes markedly. Thus, the frequency of the mode can be changed markedly. By using this phenomenon, the shape of the second linear defects is appropriately designed so that the frequency of the waveguide mode close to the high frequency side is controlled to a desired frequency. Thus, the frequency range in which light can be guided in a single mode can be controlled.

When the second linear defects are provided near the first linear defect, the electromagnetic field intensity distribution of the waveguide mode is strongly affected by the second linear defects. Since the electromagnetic field intensity distribution of the waveguide mode has a property of being easily concentrated on a part, which includes a material with a high refractive index, the electromagnetic field intensity distribution of the waveguide mode is concentrated on the second linear defects. Consequently, the electromagnetic field intensity distribution in the plane perpendicular to the waveguide direction becomes a double-peaked distribution.

In contrast, in the waveguide structure B, since the second linear defects are provided at positions distant from the first linear defect, the second linear defects do not markedly affect the electromagnetic field intensity distribution of the waveguide mode. Therefore, the electromagnetic field intensity distribution in the plane perpendicular to the waveguide direction is a single-peaked distribution in which the intensity distribution is highly concentrated on the first linear defect.

In this exemplary embodiment, layers that include columnar structures extending in the same direction as the first linear defect and that are disposed nearest to the first linear defect are selected, and the second linear defects are provided at columnar structures disposed nearest to the first linear defect. Alternatively, the second linear defects can be provided at other columnar structures. For example, layers that include columnar structures extending in the same direction as the first linear defect and that are disposed nearest to the first linear defect are selected, and the second linear defects can be provided at columnar structures disposed at positions distant from the first linear defect. In this case, the same features can be achieved. Alternatively, the second linear defects can be provided at columnar structures disposed in layers that are further from the first linear defect in the stacking direction. In this case, the same features can be achieved.

It is effective if the distance between the first linear defect and the second linear defects in the stacking direction is in the range of about 0.5 to about 1.5 times the out-of-plane lattice period. The reason for this is as follows. When the second linear defects are provided at positions nearer than about 0.5 times the out-of-plane lattice period, it is difficult to obtain the waveguide mode in which the electromagnetic field intensity distribution in the plane perpendicular to the waveguide direction is a single-peaked distribution. When the second linear defects are provided at positions farther than about 1.5 times the out-of-plane lattice period, the electromagnetic field of the waveguide mode is weak and the second linear defects do not significantly affect the waveguide mode.

The number of columnar structures having the second linear defects is not limited to that given in this exemplary embodiment. When a plurality of linear defects are provided, the shapes of the linear defects can be different from each other. The frequency of the waveguide mode can be controlled more precisely by controlling the position, the number, and the shape of the second linear defects.

Next, the fact that the features of at least one exemplary embodiment of the present invention can be achieved regardless of the refractive index of the medium of the columnar structures constituting the photonic crystal will be described. A description will be made of a waveguide structure C which includes a three-dimensional photonic crystal having columnar structures with a refractive index of 3.6 and that has the same structure as the waveguide structure B. Table 3 shows the structural parameters of the waveguide structure C.

TABLE 3

| ◆Waveguide structure C | |
|---|---|
| •Photonic crystal structure | |
| Refractive index | 3.6 |
| In-plane lattice period | P |
| Out-of-plane lattice period | 1.2 P |
| Columnar structure width | 0.30 P |
| Columnar structure height | 0.30 P |
| •First linear defect 20 | |
| Central coordinates (x, z) | (0.00 P, 0.00 P) |
| Refractive index | 1.0 |
| Defect width 20 w | 1.70 P |
| Defect height 20 h | 0.30 P |
| •Second linear defect 200 | |
| Central coordinates (x, z) | (−0.05 P, 0.60 P) |
| Defect width 200 w | 0.25 P to 0.20 P |
| Defect height 200 h | 0.30 P |
| •Second linear defect 201 | |
| Central coordinates (x, z) | (0.50 P, 0.60 P) |
| Defect width 201 w | 0.25 P to 0.20 P |
| Defect height 201 h | 0.30 P |
| •Second linear defect 202 | |
| Central coordinates (x, z) | (−0.05 P, −0.60 P) |
| Defect width 202 w | 0.25 P to 0.20 P |
| Defect height 202 h | 0.30 P |
| •Second linear defect 203 | |
| Central coordinates (x, z) | (0.50 P, −0.60 P) |
| Defect width 203 w | 0.25 P to 0.20 P |
| Defect height 203 h | 0.30 P |

Figure 7:
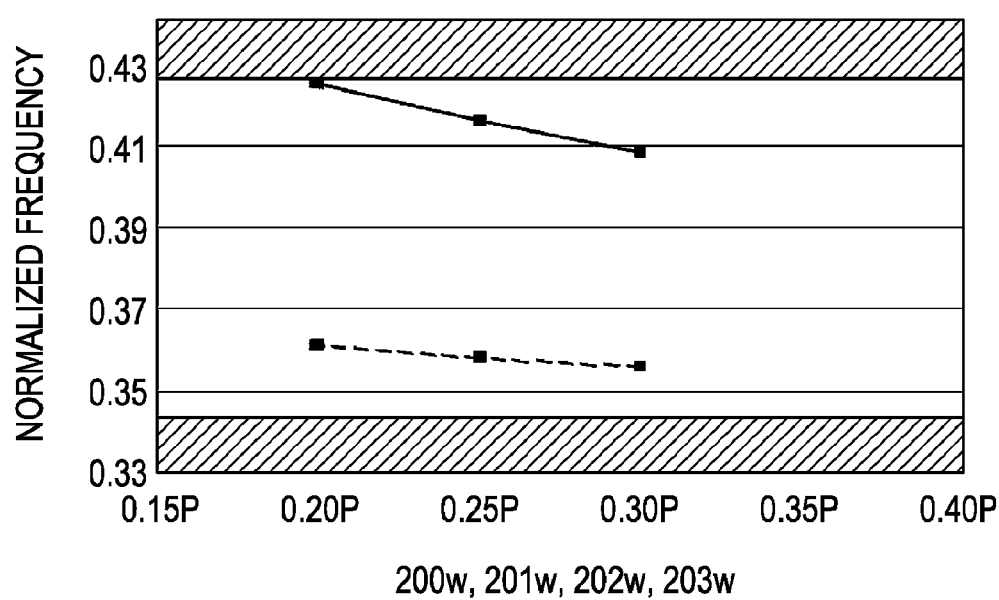
FIG. 7 is a graph showing the normalized frequency of the first exemplary embodiment of the present invention.

FIG. 7 shows the change in the frequency range in which light can be guided in a single mode in the case where the defect widths $200w$, $201w$, $202w$, and $203w$ in the waveguide structure C are changed by the same amount at the same time. In FIG. 7, the abscissa represents the defect width and the ordinate represents the normalized frequency. The continuous line and the broken line that join the points in FIG. 7 represent the high frequency and the low frequency, respectively, in the frequency range in which light can be guided in a single mode. The waveguide mode is calculated by the FDTD method. By changing the defect widths $200w$, $201w$, $202w$, and $203w$, the area in which light can be guided in a single mode changes. Thus, regardless of the refractive index of the medium constituting the three-dimensional photonic crystal structure, the frequency range in which light can be guided in a single mode can be controlled by controlling the shape of the second linear defects.

As described above, according to this exemplary embodiment, regarding structures produced by providing the woodpile structure with a waveguide structure, a waveguide that can guide light in a mode that is a single mode and that has a desired intensity distribution over a desired frequency range can be realized.

As in known structures, it is important that at least two types of medium having a high refractive index ratio are used as the media constituting the above-described waveguide structure using the three-dimensional photonic crystal. The photonic bandgap is obtained on the basis of a refractive index distribution in the crystal. Therefore, a combination of media that provide a larger refractive index ratio can provide a wider photonic bandgap. In order to obtain a photonic bandgap having an effective width, the refractive index ratio can be about 2 or more. A material having a high refractive index, such as Si, GaAs, InP, Ge, $TiO_2$, GaN, $Ta_2O_5$, or $Nb_2O_5$, can be used as the medium of the columnar structures. Furthermore, a transparent material that has no absorption in the wavelength range used can be used. A medium having a low refractive index such as a dielectric substance e.g., $SiO_2$; an organic polymeric material, e.g., polymethylmethacrylate (PMMA); air; or water is used as the medium other than the medium constituting the columnar structures. The medium constituting the first linear defect formed by removing some of the columnar structures is not limited to air and can include the above-described medium having a low refractive index.

For example, regarding the first linear defect, the shape of the defect is the same as or different from the shape of the columnar structure, and the refractive index can be changed. Regarding the second linear defects, the shape of the columnar structures is the same, and in addition, the position of the second linear defects can be changed. Alternatively, the shape of the columnar structure can be changed, and in addition, the position of the defects can be changed. Alternatively, the refractive index of the material of the columnar structure can be changed. These exemplary embodiments can be combined.

A known production method (such as a method of repeating structural patterning using electron beam lithography and stacking, a method of fusion bonding of wafers, or a nanoimprint method) can be employed to produce the waveguide.

Second Exemplary Embodiment

Figure 8:
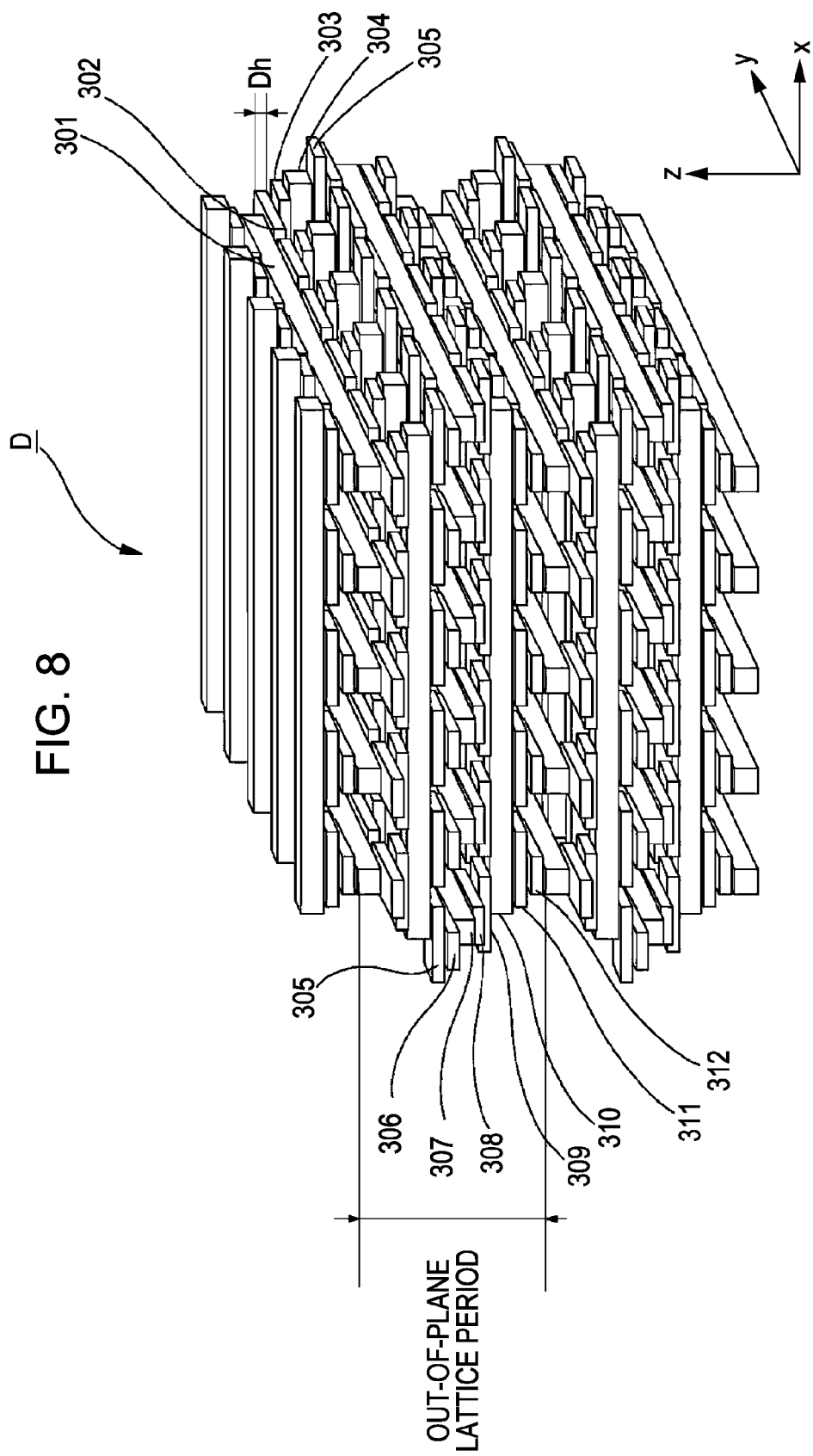
FIG. 8 is a view illustrating a photonic crystal structure D.

FIG. 8 is a schematic view of a three-dimensional photonic crystal structure D exhibiting a photonic bandgap wider than that of the woodpile structure.

Figure 9:
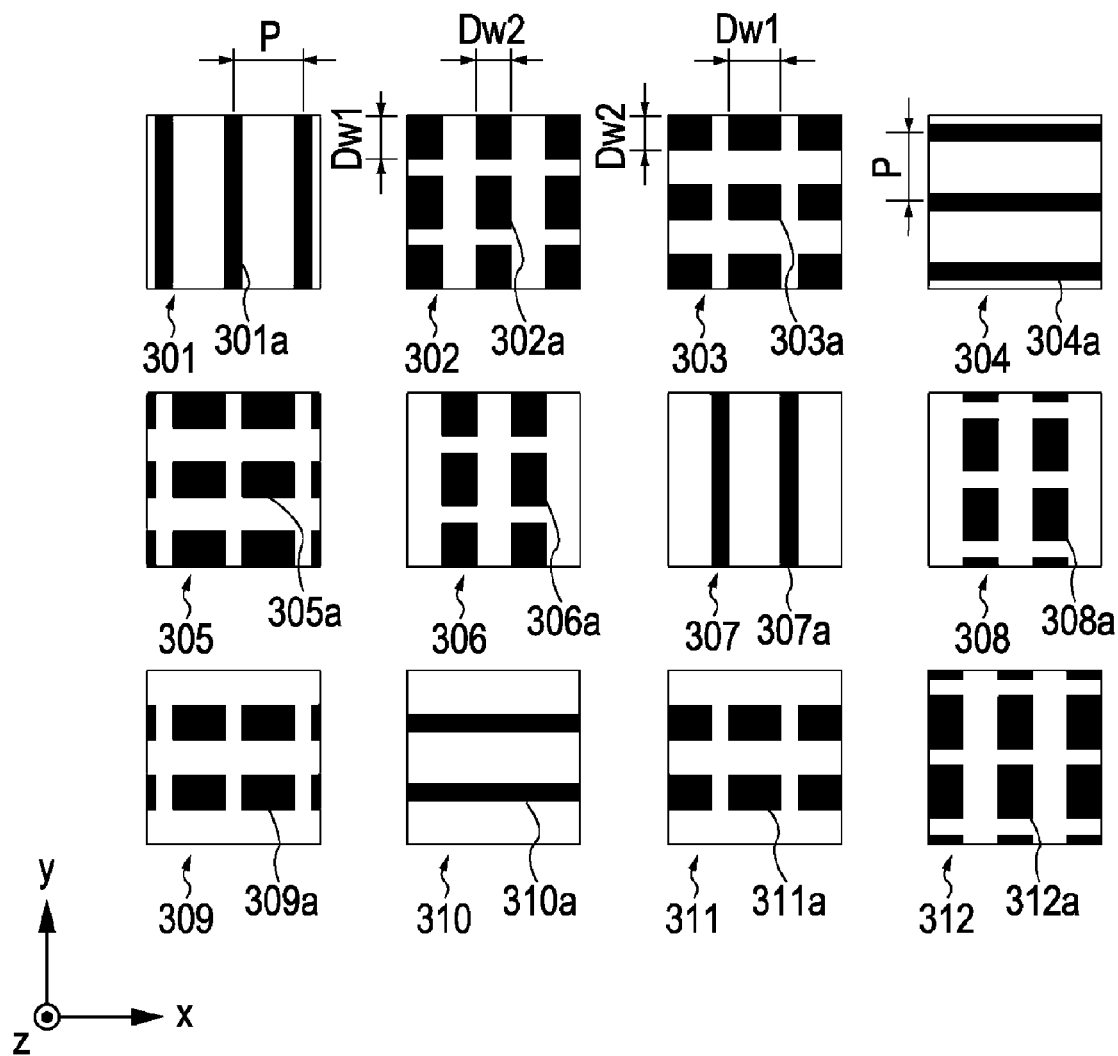
FIG. 9 includes views illustrating individual layers of the photonic crystal structure D.

The three-dimensional photonic crystal structure D includes twelve layers 301 to 312 forming the fundamental period in the x-y plane. FIG. 9 shows a part of the x-y cross-sections of each layer. In a first layer 301 and a seventh layer 307, a plurality of columnar structures 301a and 307a extending in the y-axis direction are disposed at regular intervals P in the x-axis direction. Each of the columnar structures 301a is disposed at a position shifted by P/2 from the position of the corresponding columnar structure 307a in the x-axis direction. In a fourth layer 304 and a tenth layer 310, a plurality of columnar structures 304a and 310a extending in the x-axis direction are disposed at regular intervals P in the y-axis direction. Each of the columnar structures 304a is disposed at a position shifted by P/2 from the position of the corresponding columnar structure 310a in the y-axis direction.

In a second layer 302 and a third layer 303, discrete structures 302a and 303a are arrayed at positions corresponding to the intersections of projections of the columnar structures (referred to herein also as intersections of the columnar structures) 301a of the first layer 301 and the columnar structures 304a of the fourth layer 304a. The discrete structures 302a and 303a are discretely arrayed so as not to be in contact with each other in the x-y plane. The discrete structures 302a and 303a have a symmetry such that the discrete structures have the same shape and overlap with each other when rotated by 90 degrees in the x-y plane. Similarly, a fifth layer 305, a sixth layer 306, an eighth layer 308, a ninth layer 309, an eleventh layer 311, and a twelfth layer 312, which are disposed between layers including the columnar structures, include discrete structures. Specifically, discrete structures 305a, 306a, 308a, 309a, 311a, and 312a are discretely arrayed in the x-y plane at positions corresponding to the intersections of the columnar structures of the adjacent layers.

A wide complete photonic bandgap can be obtained over a desired frequency range (wavelength range) by optimizing the refractive index of the material of the columnar structures and the discrete structures, the shape of the columnar structures or the discrete structures, the intervals at which the columnar structures or the discrete structures are disposed, and the thickness of each layer. The second, third, fifth, sixth, eighth, ninth, eleventh, and twelfth layers are layers including discrete structures.

Table 4 shows the structural parameters of the three-dimensional photonic crystal structure D used in the second exemplary embodiment.

The term "in-plane lattice period" represents the interval P of the columnar structures shown in FIG. 9. The term "out-of-plane lattice period" represents the fundamental period formed by a plurality of layers. In the three-dimensional photonic crystal structure D, the out-of-plane lattice period represents the total length corresponding to the twelve layers 301 to 312 in the stacking direction. The term "refractive index" shown in Table 4 represents the refractive index of a medium constituting the columnar structures and the discrete structures of the three-dimensional photonic crystal structure D. A medium constituting parts other than the columnar structures and the discrete structures of the three-dimensional photonic crystal structure D is air, and the refractive index thereof is 1.0. The term "discrete structure width" represents the length of each discrete structure shown in FIG. 9 in the in-plane direction. The discrete structure widths are represented by Dw1 and Dw2 in Table 4 and FIG. 9. The term "discrete structure height" represents the length of the discrete structure in the stacking direction (z-axis direction). The discrete structure height is represented by Dh in Table 4 and FIG. 8.

TABLE 4

| Three-dimensional photonic crystal structure D • Photonic crystal structure | |
|---|---|
| Refractive index | 2.4 |
| In-plane lattice period | P |
| Out-of-plane lattice period | 1.4 P |
| Columnar structure width | 0.30 P |
| Columnar structure height | 0.25 P |
| Discrete structure width Dw1 | 0.60 P |
| Discrete structure width Dw2 | 0.40 P |
| Discrete structure height Dh | 0.05 P |

Figure 10:
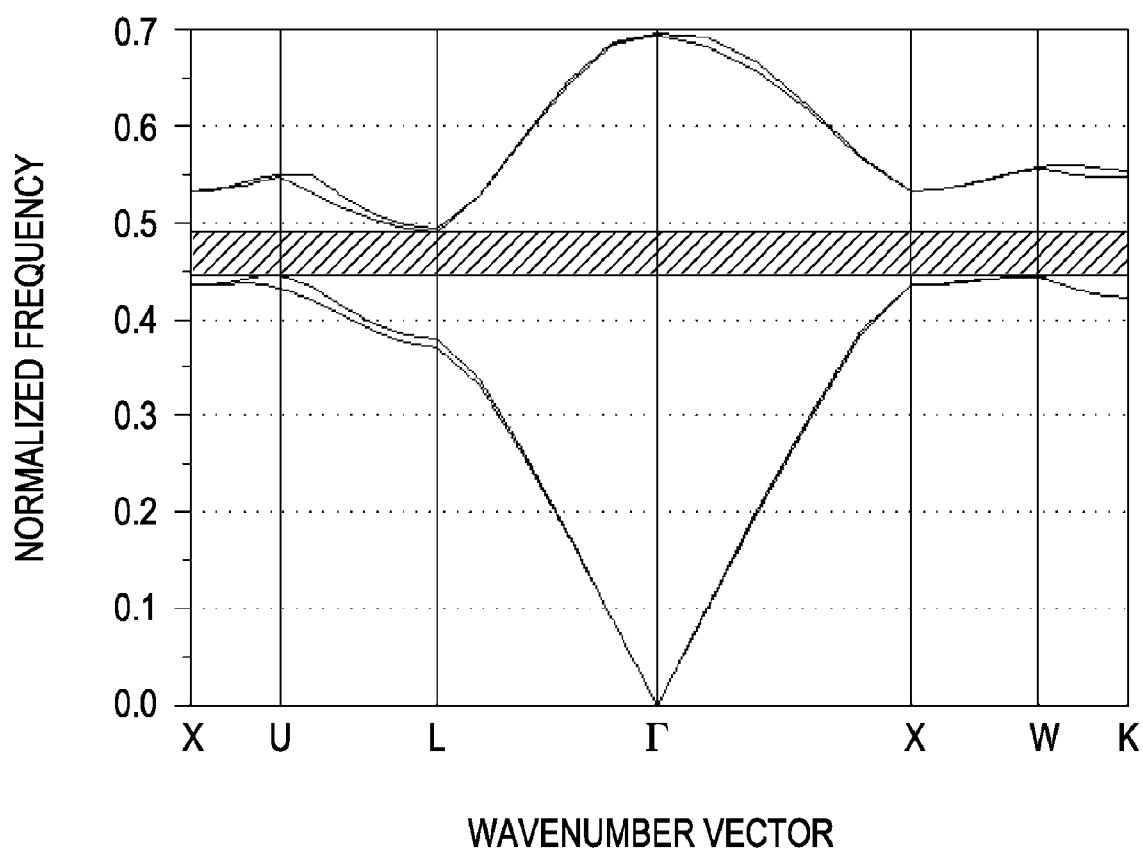
FIG. 10 is a graph showing the normalized frequency of the photonic crystal structure D.

FIG. 10 is a graph showing the photonic bandgap of the three-dimensional photonic crystal structure D calculated by the plane-wave expansion method.

The ordinate and the abscissa in FIG. 10 are the same as those in FIG. 3 of the first exemplary embodiment. A complete photonic bandgap in which light cannot be present regardless of the incident direction of the light is formed in the frequency range shown by the shaded area. When a linear defect is provided inside the three-dimensional photonic crystal structure D, a waveguide mode having a frequency within the complete photonic bandgap can be generated.

FIGS. 11A to 11D are schematic views of a waveguide structure E in which linear defects are provided inside the three-dimensional photonic crystal structure D. The waveguide structure E includes a first linear defect 40 extending in the y-axis direction inside the three-dimensional photonic crystal structure D. The waveguide structure E also includes second linear defects 400, 401, 402, and 403 that are disposed in layers different from the layer having the first linear defect 40 and that are prepared by modifying some of the columnar structures extending in the y-axis direction.

The first linear defect 40 is an area where one of the columnar structures of the first layer and some of the discrete structures of the two adjacent layers disposed on the first layer and the two adjacent layers disposed under the first layer are removed.

This structure is the same as a first linear defect 50 shown in FIG. 14 and a first linear defect 60 shown in FIG. 16, which will be described below.

FIG. 11A shows an x-z cross section of the waveguide structure E. FIGS. 11B to 11D are x-y cross-sectional views of the waveguide structure E in cross-section XIB, cross-section XIC, and cross-section XID, respectively.

Table 5 shows the structural parameters of the waveguide structure E. The waveguide structure E includes second linear defects 400, 401, 402, and 403 in which the width of columnar structures extending in the y-axis direction is 0.20P. A height 40h of the first linear defect 40 is the sum of the height of the first layer 301 and that of the two adjacent layers disposed on the first layer 301 and the two adjacent layers disposed under the first layer 301. A first linear defect width 40w corresponds to the discrete structure width Dw1 of the third layer 303. The term "defect width" represents the length of each defect in the x-axis direction in the layer. The defect widths are represented by 40w and 400w to 403w in Table 5 and FIGS. 11B to 11D. The term "defect height" represents the length of each defect in the stacking direction (z-axis direction). The defect heights are represented by 40h and 400h to 403h in Table 5 and FIG. 11A. The center of the first linear defect 40 provided in the x-z cross-section of FIG. 11A is defined as the origin of the coordinates.

TABLE 5

| ♦Waveguide structure E | |
|---|---|
| •Photonic crystal structure D | |
| Refractive index | 2.4 |
| In-plane lattice period | P |
| Out-of-plane lattice period | 1.4 P |
| Columnar structure width | 0.30 P |
| Columnar structure height | 0.25 P |
| Discrete structure width Dw1 | 0.60 P |
| Discrete structure width Dw2 | 0.40 P |
| Discrete structure height Dh | 0.05 P |
| •First linear defect 40 | |
| Central coordinates (x, z) | (0.00 P, 0.00 P) |
| Refractive index | 1.0 |
| Defect width 40 w | 0.60 P |
| Defect height 40 h | 0.45 P |

TABLE 5-continued

| ♦Waveguide structure E | |
|---|---|
| •Second linear defect 400 | |
| Central coordinates (x, z) | (−0.05 P, 0.70 P) |
| Defect width 400 w | 0.2 P |
| Defect height 400 h | 0.25 P |
| •Second linear defect 401 | |
| Central coordinates (x, z) | (0.50 P, 0.70 P) |
| Defect width 401 w | 0.2 P |
| Defect height 401 h | 0.25 P |
| •Second linear defect 402 | |
| Central coordinates (x, z) | (−0.05 P, −0.70 P) |
| Defect width 402 w | 0.2 P |
| Defect height 402 h | 0.25 P |
| •Second linear defect 403 | |
| Central coordinates (x, z) | (0.50 P, −0.70 P) |
| Defect width 403 w | 0.2 P |
| Defect height 403 h | 0.25 P |

Figure 12A:
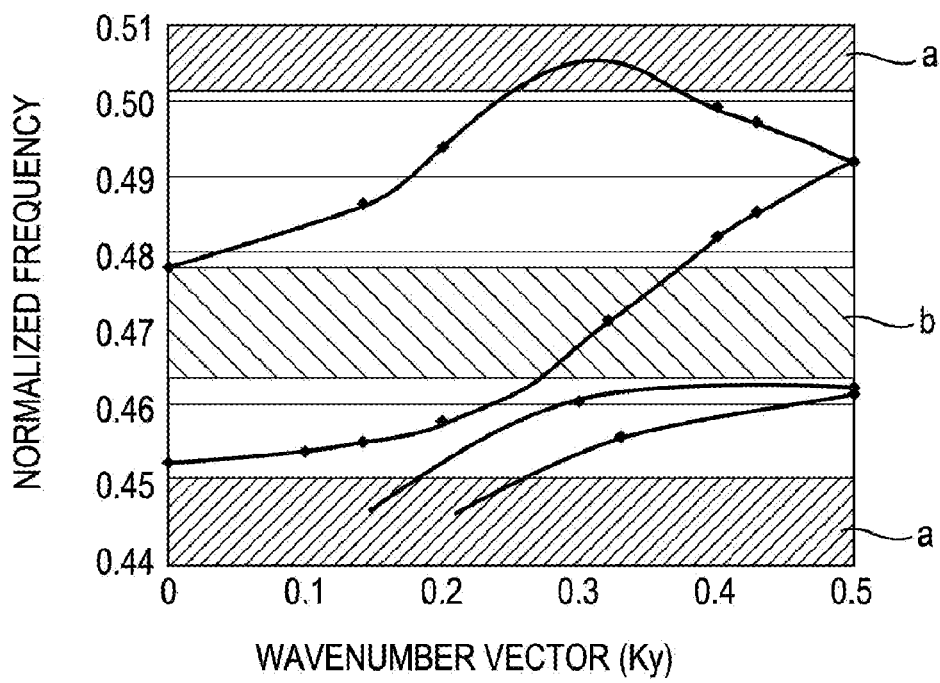
FIGS. 12A and 12B are views showing the waveguide mode of the second exemplary embodiment of the present invention.

FIG. 12A shows the waveguide mode of the waveguide structure E calculated by the FDTD method. The abscissa of the graph represents the dimension of a component in the waveguide direction (y-axis direction) of the wavenumber vector normalized by the lattice period P. The ordinate of the graph represents the frequency normalized by the lattice period P (normalized frequency). The frequency ranges shown by areas a in FIG. 12A show the frequency ranges other than the complete photonic bandgap. In FIG. 12A, the frequency range shown by area b shows the frequency range in which light can be guided in a single mode among waveguide modes. The frequency range in which light can be guided in a single mode is in the range of about 0.462 to about 0.478. When the waveguide mode in the case where only the first linear defect 40 is provided and the second linear defects 400 to 403 are not provided in the waveguide structure E is calculated by the FDTD method, the frequency range in which light can be guided in a single mode is in the range of about 0.452 to about 0.466. These results show that the formation of the second linear defects 400 to 403 can provide a waveguide that can guide light in a single mode over a wider frequency range.

Figure 12B:
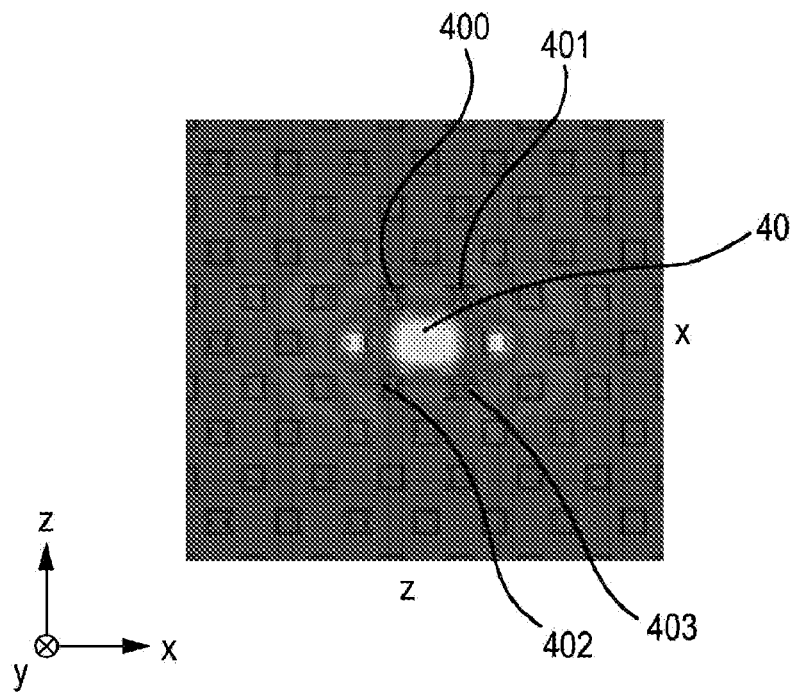

FIG. 12B shows the electromagnetic field intensity distribution in the x-z cross-section of the waveguide mode in the frequency range in which light can be guided in a single mode in the waveguide structure E. The parts shown by the whiter area represent the area having higher electromagnetic field intensity. This result shows that the waveguide mode has a single-peaked electromagnetic field intensity distribution in which the electromagnetic field intensity is highly concentrated near the center of the waveguide.

Figure 13:
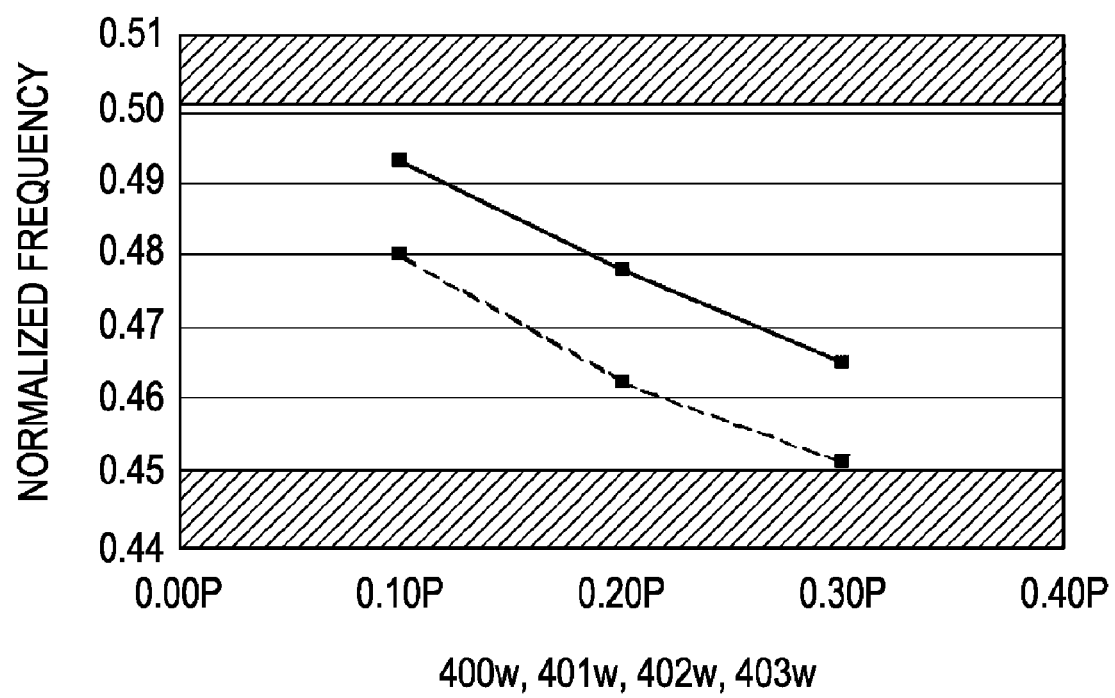
FIG. 13 is a graph showing the normalized frequency of the second exemplary embodiment of the present invention.

FIG. 13 shows the change in the frequency range in which light can be guided in a single mode in the case where the defect widths 400w, 401w, 402w, and 403w of the second linear defects 400 to 403 in the waveguide structure E are changed by the same amount at the same time. In FIG. 13, the abscissa represents the defect width and the ordinate represents the normalized frequency. The continuous line and the broken line that join the points in FIG. 13 represent the high frequency and the low frequency, respectively, in the frequency range in which light can be guided in a single mode. By changing the defect widths 400w, 401w, 402w, and 403w, the frequency range in which light can be guided in a single mode is changed. Accordingly, in the waveguide structure E, the frequency range in which light can be guided in a single mode can be controlled by changing the shape of the second linear defects 400 to 403, which are provided some of the columnar structures disposed in layers different from the layer having the first linear defect 40.

The waveguide structure E of this exemplary embodiment can control the frequency range in which light can be guided in a single mode, and provide a substantially single-peaked intensity distribution in the plane perpendicular to the waveguide direction. The reason for this is the same as in the first exemplary embodiment.

In this exemplary embodiment, layers that include columnar structures extending in the same direction as the first linear defect and that are disposed nearest to the first linear defect are selected, and the second linear defects are provided at columnar structures disposed nearest to the first linear defect. Alternatively, the second linear defects can be provided at other columnar structures. For example, layers that include columnar structures extending in the same direction as the first linear defect and that are disposed nearest to the first linear defect are selected, and the second linear defects can be provided at columnar structures disposed at positions more distant from the first linear defect. In this case, the same features can be achieved. Alternatively, the second linear defects can be provided at columnar structures disposed in layers that are more distant from the first linear defect in the stacking direction. In this case, the same features can be achieved. It is effective if the distance between the first linear defect and the second linear defects in the stacking direction is in the range of about 0.5 to about 1.5 times the out-of-plane lattice period. The reason for this is as follows. At positions nearer than about 0.5 times the out-of-plane lattice period, it is difficult to obtain the waveguide mode in which the electromagnetic field intensity distribution in the plane perpendicular to the waveguide direction is a single-peaked distribution. At positions farther than about 1.5 times the out-of-plane lattice period, the electromagnetic field of the waveguide mode is weak. Therefore, even when the second linear defects are provided, the second linear defects do not significantly affect the waveguide mode.

The number of the second linear defects is not limited to that given in this exemplary embodiment. When a plurality of linear defects are provided, the shapes of the linear defects can be different from each other.

Next, an embodiment of a waveguide structure F including the three-dimensional photonic crystal structure D will be described. In this waveguide structure F, instead of or in addition to the columnar structures extending in the same direction as the first linear defect, the second linear defects are provided at some of the discrete structures.

In a waveguide structure F shown in FIG. 14, a first linear defect 50 extending in the y-axis direction is provided inside the three-dimensional photonic crystal structure D, and the shape of some of the discrete structures disposed in layers different from the layer having the first linear defect 50 is changed. The area of the first linear defect 50 is filled with air.

Figure 14B:
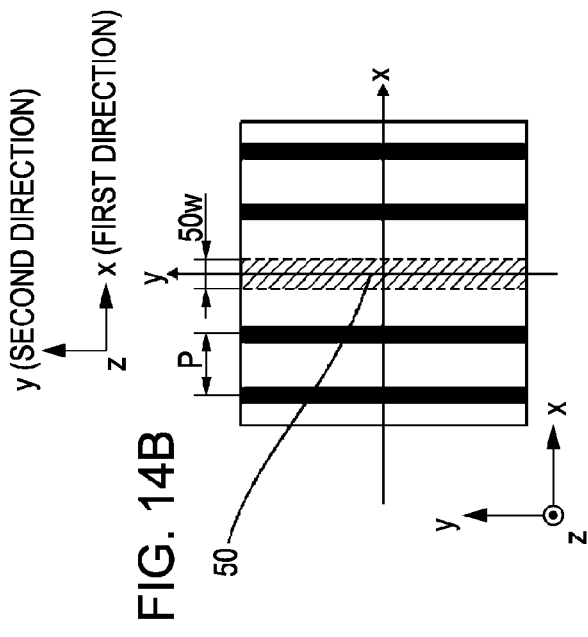
FIGS. 14A to 14D are schematic views of the relevant parts according to the second exemplary embodiment of the present invention.
Figure 14D:
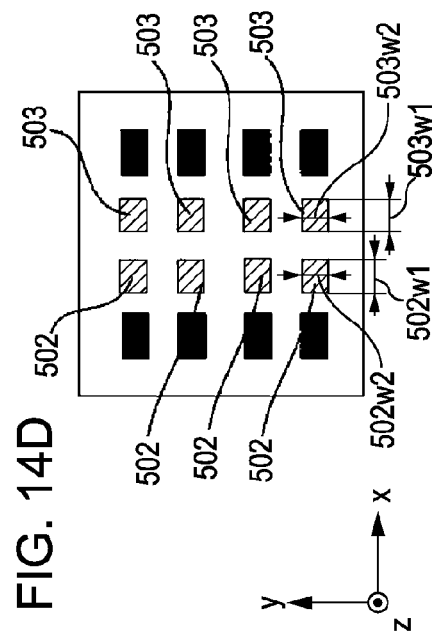
Figure 14A:
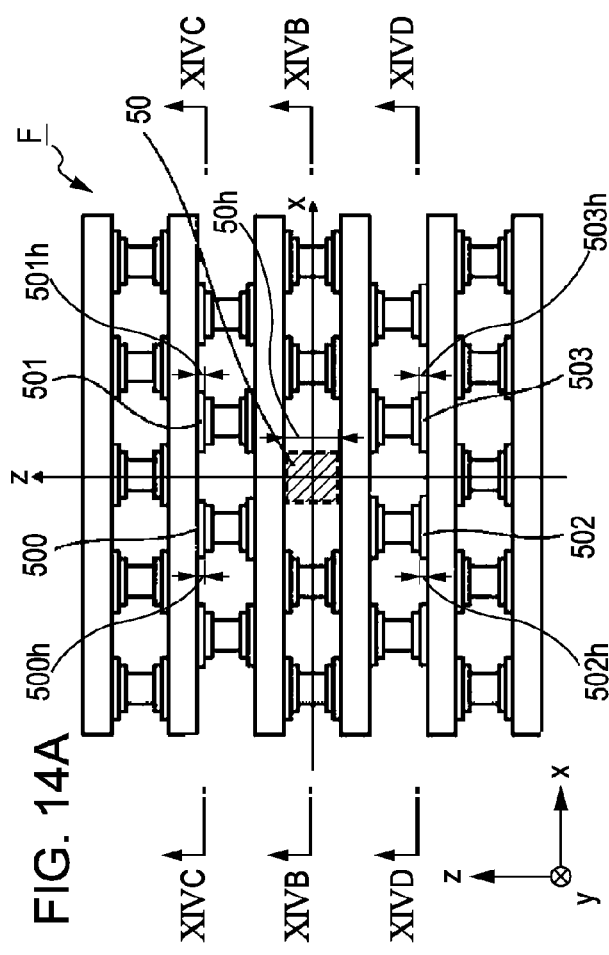
Figure 14C:
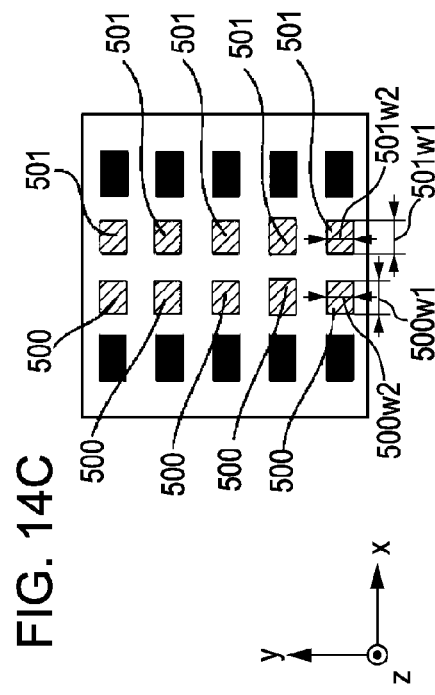

FIG. 14A shows an x-z cross-sectional view of the waveguide structure F. FIGS. 14B to 14D are x-y cross-sectional views. In this exemplary embodiment, in the layers shown in FIGS. 14C and 14D (corresponding to the fifth layer 305 and the ninth layer 309 shown in FIG. 9), the width of the x-axis direction of the discrete structures disposed nearest to the first linear defect 50 is changed. FIGS. 14C and 14D shows structures including second linear defects 500, 501, 502, and 503 formed by changing the width in the x-axis direction.

Table 6 shows the structural parameters of the waveguide structure F. A height 50$h$ of the first linear defect 50 is the sum of the height of the first layer 301 and that of the two adjacent layers disposed on the first layer 301 and the two adjacent layers disposed under the first layer 301. The height of the second linear defects corresponds to the height of the discrete structures. The term "defect width" represents the lengths of each defect in the x-y plane directions in the layer. In Table 6 and FIGS. 14B to 14D, the lengths in the x-axis direction are represented by 50$w$ and 500$w$1 to 503$w$1, and the lengths in the y-axis direction are represented by 500$w$2 to 503$w$2. In the columns of defect widths (500$w$, 501$w$1, 502$w$1, and 503$w$1) in Table 6, the term "0.00P" means that the case where the linear defect is not present. The term "defect height" represents the length of each defect in the stacking direction (z-axis direction). The defect heights are represented by 50$h$ and 500$h$ to 503$h$ in Table 6 and FIG. 14A. The waveguide mode was calculated by the FDTD method.

TABLE 6

| ♦Waveguide structure F | |
|---|---|
| •Photonic crystal structure D | |
| Refractive index | 2.4 |
| In-plane lattice period | P |
| Out-of-plane lattice period | 1.4 P |
| Columnar structure width | 0.30 P |
| Columnar structure height | 0.25 P |
| Discrete structure width Dw1 | 0.60 P |
| Discrete structure width Dw2 | 0.40 P |
| Discrete structure height Dh | 0.05 P |
| •First linear defect 50 | |
| Central coordinates (x, z) | (0.00 P, 0.00 P) |
| Refractive index | 1.0 |
| Defect width 50 w | 0.60 P |
| Defect height 50 h | 0.45 P |
| •Second linear defect 500 | |
| Central coordinates (x, z) | (−0.05 P, 0.90 P) |
| Defect width 500 w1 | 0.00 P to 0.40 P |
| Defect width 500 w2 | 0.40 P |
| Defect height 500 h | 0.05 P |
| •Second linear defect 501 | |
| Central coordinates (x, z) | (0.50 P, 0.90 P) |
| Defect width 501 w1 | 0.00 P to 0.40 P |
| Defect width 501 w2 | 0.40 P |
| Defect height 501 h | 0.05 P |
| •Second linear defect 502 | |
| Central coordinates (x, z) | (−0.05 P, −0.90 P) |
| Defect width 502 w1 | 0.00 P to 0.40 P |
| Defect width 502 w2 | 0.40 P |
| Defect height 502 h | 0.05 P |
| •Second linear defect 503 | |
| Central coordinates (x, z) | (0.50 P, −0.90 P) |
| Defect width 503 w1 | 0.00 P to 0.40 P |
| Defect width 503 w2 | 0.40 P |
| Defect height 503 h | 0.05 P |

Figure 15:
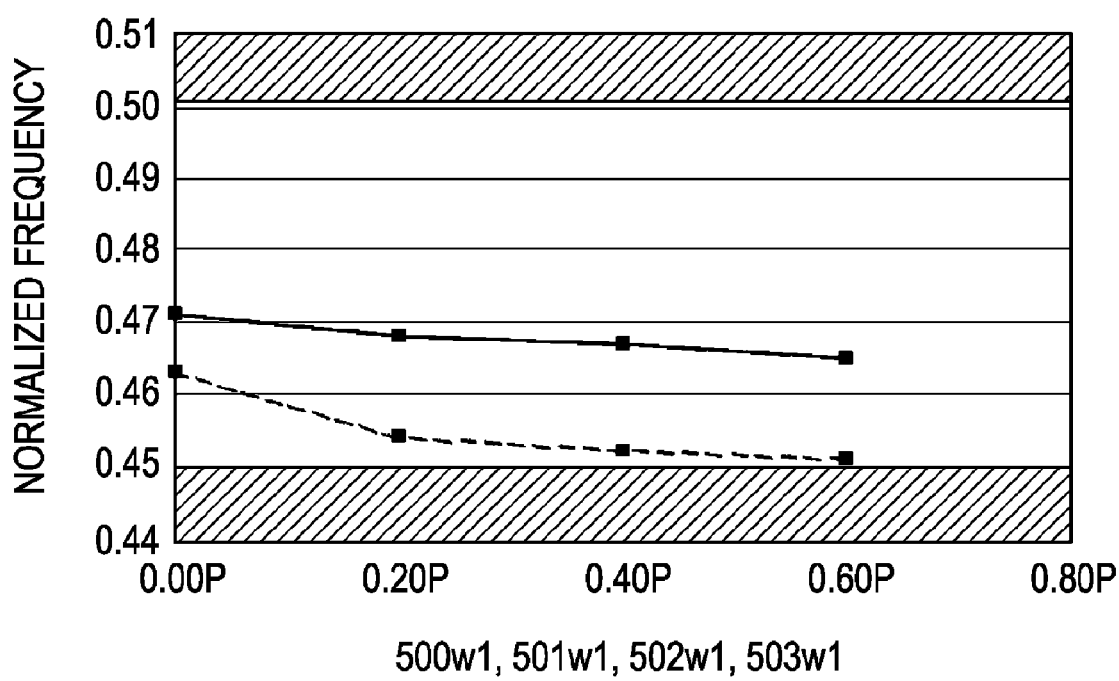
FIG. 15 is a graph showing the normalized frequency of the second exemplary embodiment of the present invention.
Figure 16B:
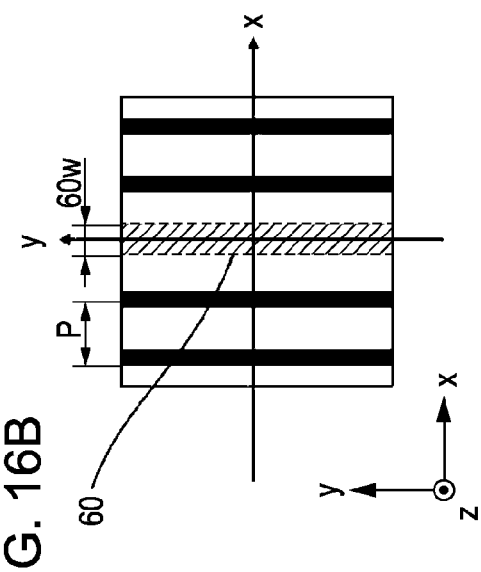
FIGS. 16A to 16D are schematic views of the relevant parts according to the second exemplary embodiment of the present invention.
Figure 16D:
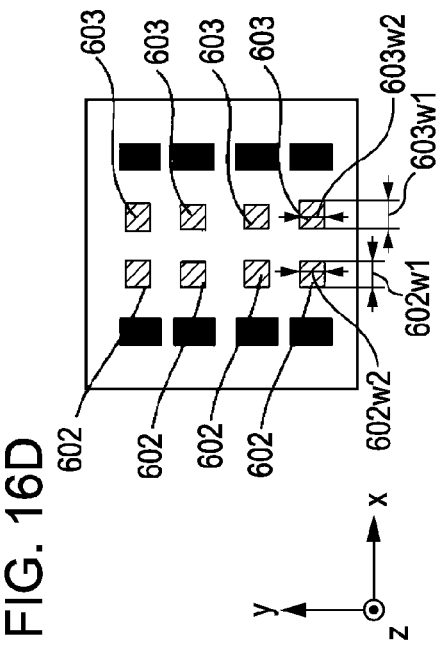
Figure 16A:
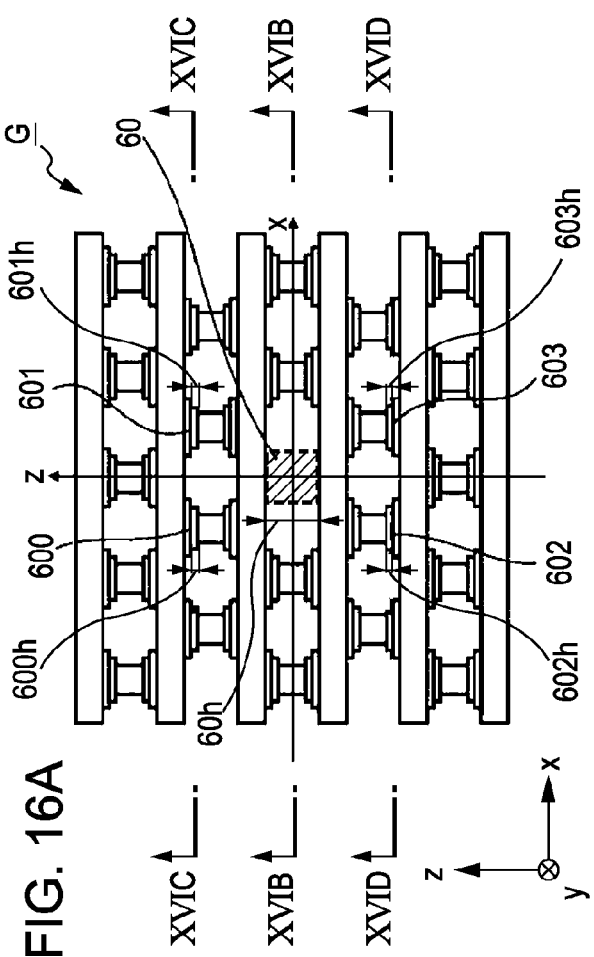
Figure 16C:
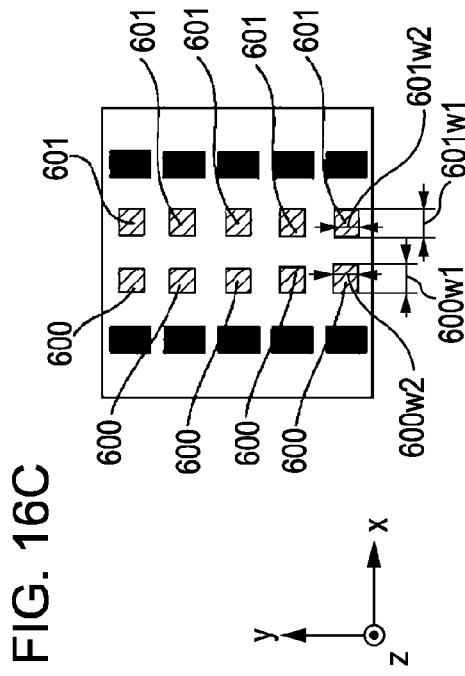

FIG. 15 shows the change in the frequency range in which light can be guided in a single mode in the case where the defect widths 500$w$1, 501$w$1, 502$w$1, and 503$w$1 of the waveguide structure F are changed by the same amount at the same time. In FIG. 15, the abscissa represents the defect width and the ordinate represents the normalized frequency.

The continuous line and the broken line that join the points in FIG. 15 represent the high frequency and the low frequency, respectively, in the frequency range in which light can be guided in a single mode. By changing the defect widths 500w1, 501w1, 502w, and 503w1, the frequency range in which light can be guided in a single mode is changed.

FIGS. 16A to 16D shows a waveguide structure G. In the waveguide structure G, a first linear defect 60 extending in the y-axis direction and second linear defects 600, 601, 602, and 603 are provided inside the three-dimensional photonic crystal structure D. The second linear defects 600, 601, 602, and 603 are formed by changing the width of the y-axis direction of the discrete structures disposed nearest to the first linear defect 60 in the layers shown in FIGS. 16C and 16D. Table 7 shows the structural parameters of the waveguide structure G. In Table 7 and FIGS. 16B to 16D, the lengths in the x-axis direction are represented by 60w and 600w1 to 603w1, and the lengths in the y-axis direction are represented by 600w2 to 603w2. In the columns of defect widths (600w2, 601w2, 602w2, and 603w2) in Table 7, the term "0.00P" means that the case where the linear defect is not present. The term "defect height" represents the length of each defect in the stacking direction. The defect heights are represented by 60h and 600h to 603h in Table 7 and FIG. 16A. The waveguide mode was calculated by the FDTD method.

TABLE 7

| ◆Waveguide structure G | |
|---|---|
| •Photonic crystal structure D | |
| Refractive index | 2.4 |
| In-plane lattice period | P |
| Out-of-plane lattice period | 1.4 P |
| Columnar structure width | 0.30 P |
| Columnar structure height | 0.25 P |
| Discrete structure width Dw1 | 0.60 P |
| Discrete structure width Dw2 | 0.40 P |
| Discrete structure height Dh | 0.05 P |
| •First linear defect 60 | |
| Central coordinates (x, z) | (0.00 P, 0.00 P) |
| Refractive index | 1.0 |
| Defect width 60 w | 0.60 P |
| Defect height 60 h | 0.45 P |
| •Second linear defect 600 | |
| Central coordinates (x, z) | (−0.05 P, 0.85 P) |
| Defect width 600 w1 | 0.40 P |
| Defect width 600 w2 | 0.00 P to 0.40 P |
| Defect height 600 h | 0.05 P |
| •Second linear defect 601 | |
| Central coordinates (x, z) | (0.50 P, 0.85 P) |
| Defect width 601 w1 | 0.40 P |
| Defect width 601 w2 | 0.00 P to 0.40 P |
| Defect height 601 h | 0.05 P |
| •Second linear defect 602 | |
| Central coordinates (x, z) | (−0.05 P, −0.85 P) |
| Defect width 602 w1 | 0.40 P |
| Defect width 602 w2 | 0.00 P to 0.40 P |
| Defect height 602 h | 0.05 P |
| •Second linear defect 603 | |
| Central coordinates (x, z) | (0.50 P, −0.85 P) |
| Defect width 603 w1 | 0.40 P |
| Defect width 603 w2 | 0.00 P to 0.40 P |
| Defect height 603 h | 0.05 P |

Figure 17:
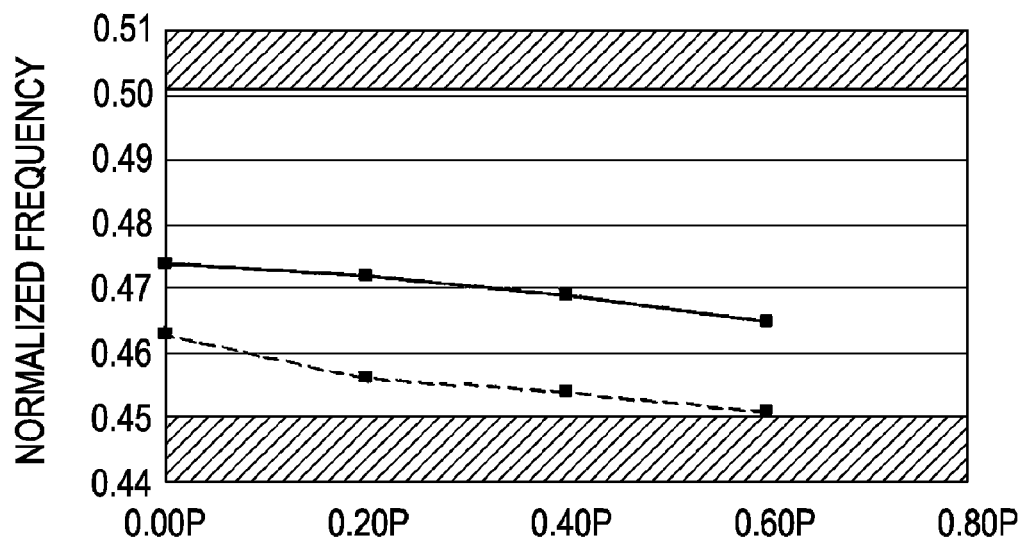
FIG. 17 is a graph showing the normalized frequency of the second exemplary embodiment of the present invention.

FIG. 17 shows the change in the frequency range in which light can be guided in a single mode in the case where the defect widths 600w2, 601w2, 602w2, and 603w2 of the waveguide structure G are changed by the same amount at the same time. In FIG. 17, the abscissa represents the defect width and the ordinate represents the normalized frequency. The continuous line and the broken line that join the points in FIG. 17 represent the high frequency and the low frequency, respectively, in the frequency range in which light can be guided in a single mode. By changing the defect widths 600w2, 601w2, 602w2, and 603w2, the frequency range in which light can be guided in a single mode is changed.

As described above, regarding the second linear defects formed by changing the shape of the discrete structures, the frequency range in which light can be guided in a single mode can be controlled by changing the shape of the second linear defects.

In this exemplary embodiment, the second linear defects are provided at discrete structures that are disposed in layers different from the layer having the first linear defect and that are disposed nearest to the first linear defect. Alternatively, the second linear defects can be provided at other discrete structures.

For example, the second linear defects can be provided at discrete structures that are disposed in layers different from the layer having the first linear defect and that are disposed at positions more distant from the first linear defect or discrete structures that are disposed in layers more distant from the first linear defect in the stacking direction. Alternatively, the second linear defects can be provided at discrete structures adjacent to columnar structures extending in the y-axis direction. In these cases the same features can be achieved. It is effective if the distance between the first linear defect and the second linear defects in the stacking direction is in the range of about 0.5 to about 1.5 times the out-of-plane lattice period.

The reason for this is as follows. At positions nearer than about 0.5 times the out-of-plane lattice period, it is difficult to obtain the waveguide mode in which the electromagnetic field intensity distribution in the plane perpendicular to the waveguide direction is a single-peaked distribution. On the other hand, when the second linear defects are provided at positions farther than about 1.5 times the out-of-plane lattice period, the second linear defects do not significantly affect the waveguide mode.

Furthermore, the second linear defects can be provided at both the columnar structures and the discrete structures. The number of the second linear defects is not limited to that given in this exemplary embodiment. When a plurality of defects are provided, the shapes of the defects can be different from each other.

A description will be made of the fact that the refractive index of the medium constituting the photonic crystal is not limited to that given in the above embodiment. In a photonic crystal, which includes a medium having a refractive index of about 3.6, a waveguide structure H having the same structure as the waveguide structure E shown in FIG. 11 is prepared. Table 8 shows the structural parameters of the waveguide structure H. The waveguide mode was calculated by the FDTD method.

TABLE 8

| ◆Waveguide structure H | |
|---|---|
| •Photonic crystal structure D | |
| Refractive index | 3.6 |
| In-plane lattice period | P |
| Out-of-plane lattice period | 1.4 P |
| Columnar structure width | 0.25 P |
| Columnar structure height | 0.25 P |
| Discrete structure width Dw1 | 0.60 P |

TABLE 8-continued

| ♦Waveguide structure H | |
|---|---|
| Discrete structure width Dw2 | 0.40 P |
| Discrete structure height Dh | 0.05 P |
| •First linear defect 40 | |
| Central coordinates (x, z) | (0.00 P, 0.00 P) |
| Refractive index | 1.0 |
| Defect width 40 w | 0.60 P |
| Defect height 40 h | 0.45 P |
| •Second linear defect 400 | |
| Central coordinates (x, z) | (−0.05 P, 0.70 P) |
| Defect width 400 w | 0.15 P to 0.20 P |
| Defect height 400 h | 0.25 P |
| •Second linear defect 401 | |
| Central coordinates (x, z) | (0.50 P, 0.70 P) |
| Defect width 401 w | 0.15 P to 0.20 P |
| Defect height 401 h | 0.25 P |
| •Second linear defect 402 | |
| Central coordinates (x, z) | (−0.05 P, −0.70 P) |
| Defect width 402 w | 0.15 P to 0.20 P |
| Defect height 402 h | 0.25 P |
| •Second linear defect 403 | |
| Central coordinates (x, z) | (0.50 P, −0.70 P) |
| Defect width 403 w | 0.15 P to 0.20 P |
| Defect height 403 h | 0.25 P |

Figure 18:
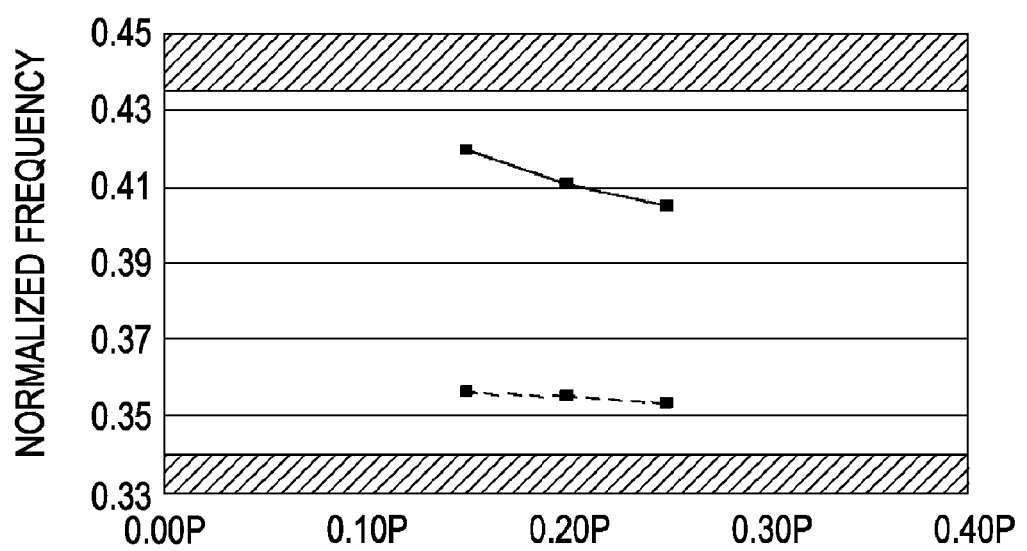
FIG. 18 is a graph showing the normalized frequency of the second exemplary embodiment of the present invention.

FIG. 18 shows the change in the frequency range in which light can be guided in a single mode in the case where the defect widths 400w, 401w, 402w, and 403w are changed by the same amount at the same time. In FIG. 18, the abscissa represents the defect width and the ordinate represents the normalized frequency. The continuous line and the broken line that join the points in FIG. 18 represent the high frequency and the low frequency, respectively, in the frequency range in which light can be guided in a single mode. By changing the defect widths 400w, 401w, 402w, and 403w, the frequency range in which light can be guided in a single mode is changed. This result shows that the range in which light can be guided in a single mode can be controlled by controlling the shape of the second linear defects provided in layers different from the layer having the first linear defect, regardless of the refractive index of the medium constituting the three-dimensional photonic crystal structure.

As described above, this exemplary embodiment describes waveguide structures prepared by forming defects in the three-dimensional photonic crystal structure D.

According to the waveguide structures described in the embodiment, a waveguide that can guide light in a mode that is a single mode and that has a desired intensity distribution over a desired frequency range can be realized.

The medium that can constitute the above-described waveguides using the three-dimensional photonic crystal and a process for producing the three-dimensional photonic crystal are the same as those given in the first exemplary embodiment. Therefore, further description is omitted here.

As an embodiment of the second linear defects in which some of the columnar structures or some of the discrete structures are modified, instead of the shape, the position or the refractive index thereof can be changed. Alternatively, the position or the refractive index can be changed in addition to the change in the shape.

The embodiment describes a three-dimensional photonic crystal in which each additional layer includes two layers having discrete structures, but the three-dimensional photonic crystal is not limited thereto. For example, the three-dimensional photonic crystal can have a structure in which each additional layer includes one layer or three or more layers having discrete structures. Alternatively, the three-dimensional photonic crystal can have a structure in which discrete structures are provided at one side of a columnar structure. In these cases, the same features can also be achieved by forming linear defects at the positions described above. Cases where the number of layers having discrete structures is one and three will be described.

Figure 39A:
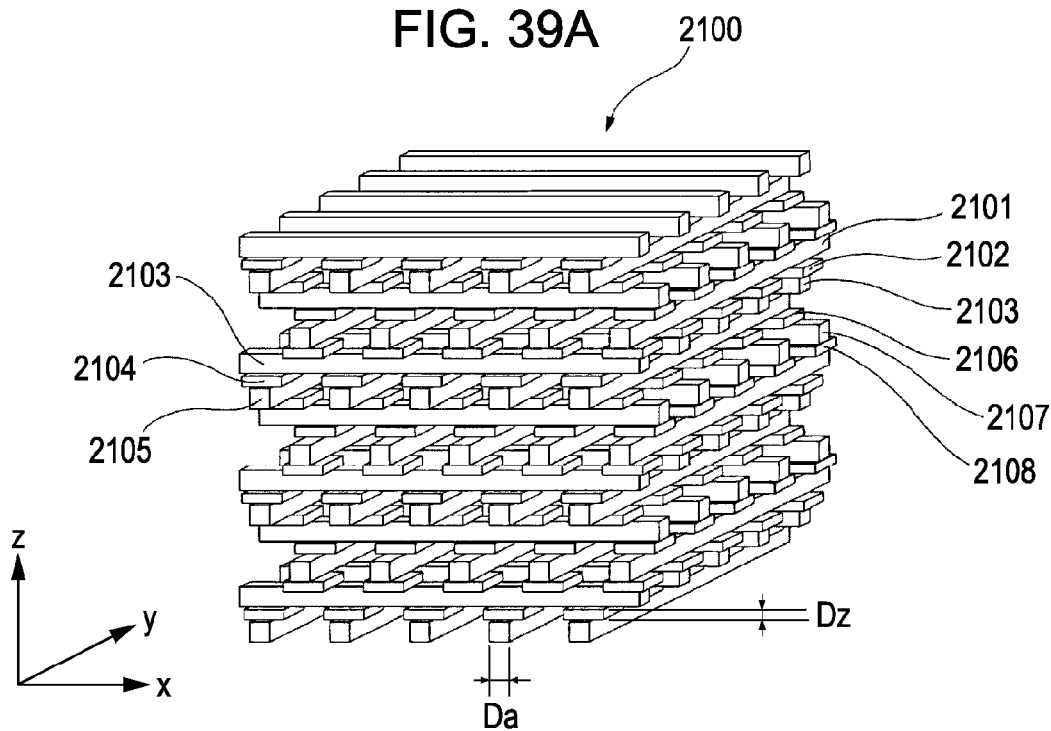
FIG. 39A is a view illustrating a photonic crystal having discrete structures.

FIG. 39A is a schematic view of the relevant part of a three-dimensional periodic structure in which the number of layers having discrete structures is one. A three-dimensional periodic structure 2100 includes eight layers 2101 to 2108 forming the fundamental period in the x-y plane.

Figure 39B:
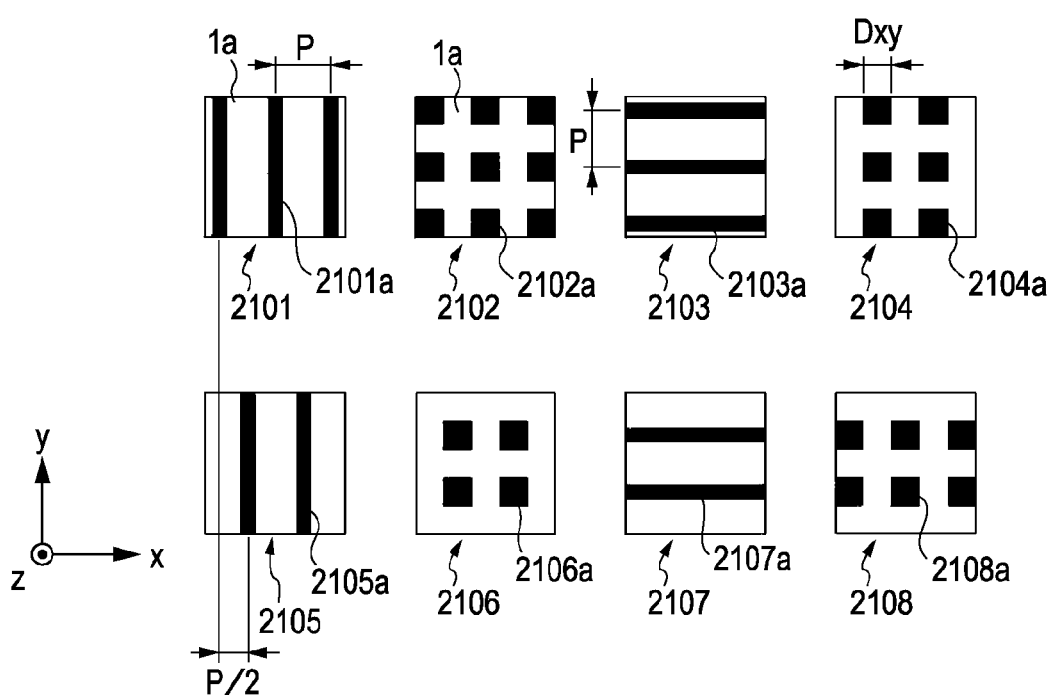
FIG. 39B includes views illustrating individual layers of the photonic crystal having the discrete structures.

FIG. 39B includes x-y cross-sectional views of each layer 2101 to 2108.

In a first layer 2101 and a fifth layer 2105, a plurality of columnar structures 2101a and 2105a including a first medium (having a high refractive index) and extending in the y-axis direction are disposed in the x-axis direction at a regular interval (pitch) P, respectively. Each of the columnar structures 2101a is disposed at a position shifted by P/2 from the position of the corresponding columnar structure 2105a in the x-axis direction. In a third layer 2103 and a seventh layer 2107, a plurality of columnar structures 2103a and 2107a including the first medium and extending in the x-axis direction are disposed in the y-axis direction at a regular interval (pitch) P, respectively. Each of the columnar structures 2103a is disposed at a position shifted by P/2 from the position of the corresponding columnar structure 2107a in the y-axis direction.

In a second layer 2102, discrete structures are arrayed at positions corresponding to the intersections of the columnar structures 2101a of the first layer 2101 and the columnar structures 2103a of the third layer 2103. Discrete structures 2102a including the first medium are discretely arrayed so as not to be in contact with each other in the x-y plane. Similarly, in a fourth layer 2104, a sixth layer 2106, and an eight layer 2108, which are disposed between layers including the columnar structures, discrete structures are arrayed at positions corresponding to the intersections of the columnar structures of the adjacent layers. For example, discrete structures 2104a, 2106a, and 2108a including the first medium and having the same shape as the discrete structures 2102a that are discretely arrayed in the x-y plane are arrayed.

The columnar structures 2101a, 2103a, 2105a, and 2107a and the discrete structures 2102a, 2104a, 2106a, and 2108a of the layers are in contact with each other. Parts 1a other than the columnar structures and the parts 1a other than the discrete structures of the layers are filled with a second medium (having a low refractive index).

FIG. 40A is a schematic view of the relevant part of a three-dimensional periodic structure in which the number of layers having discrete structures is three. A three-dimensional periodic structure 2300 includes 16 layers 2301 to 2316 forming the fundamental period in the x-y plane.

Figure 40B:
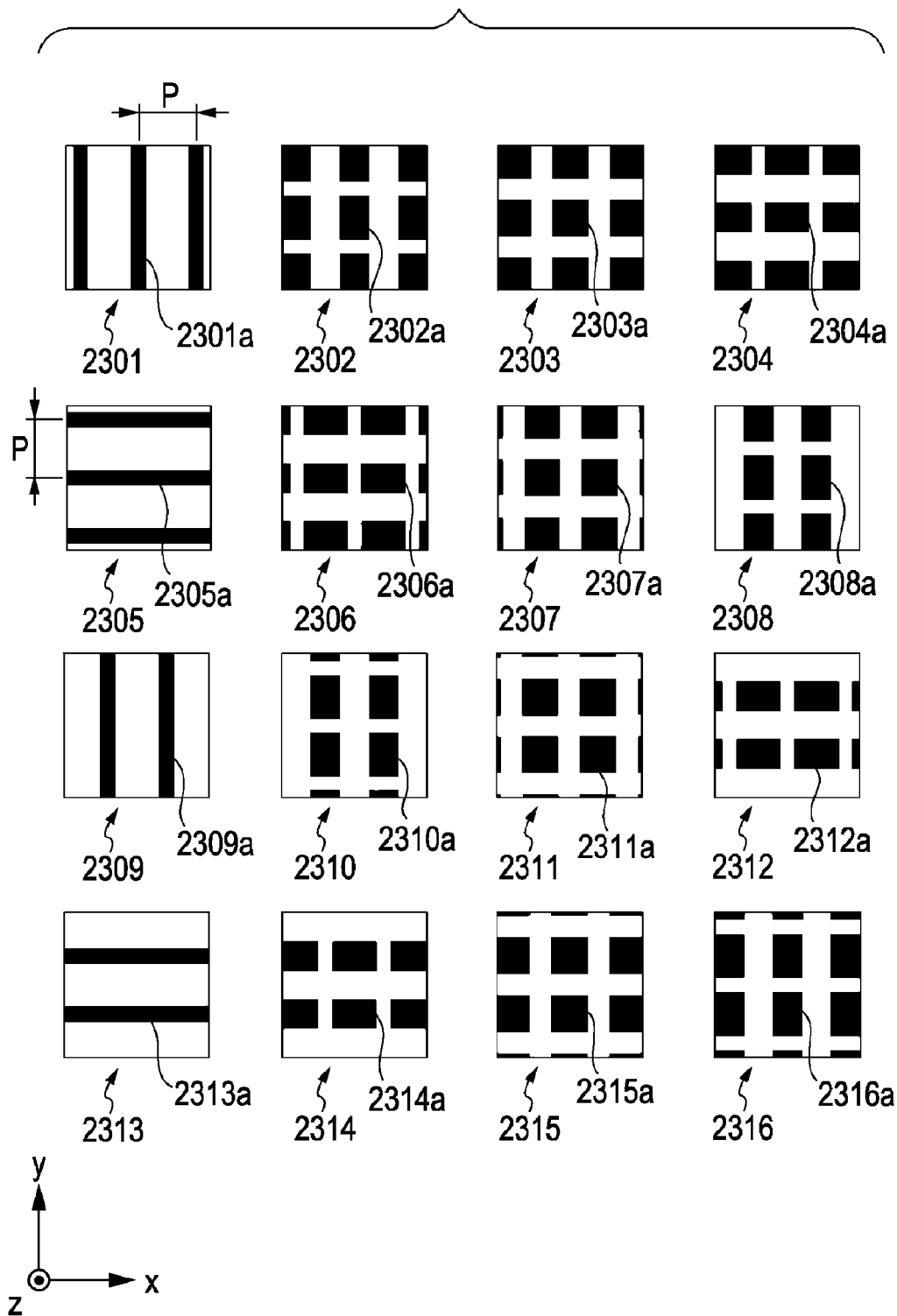
FIG. 40B includes views illustrating individual layers of the photonic crystal having the discrete structures.

FIG. 40B includes x-y cross-sectional views of each layer 2301 to 2316.

In a first layer 2301 and a ninth layer 2309, a plurality of columnar structures 2301a and 2309a including a first medium and extending in the y-axis direction are disposed in the x-axis direction at a regular interval P, respectively. Each of the columnar structures 2301a is disposed at a position shifted by P/2 from the position of the corresponding columnar structure 2309a in the x-axis direction. In a fifth layer 2305 and a 13th layer 2313, a plurality of columnar structures 2305a and 2313a including the first medium and extending in the x-axis direction are disposed in the y-axis direction at a regular interval P, respectively. Each of the columnar structures 2305a is disposed at a position shifted by P/2 from the position of the corresponding columnar structure 2313a in the y-axis direction.

In a second layer 2302, a third layer 2303, and a fourth layer 2304, discrete structures are arrayed at positions corresponding to the intersections of the columnar structures 2301a of the first layer 2301 and the columnar structures 2305a of the fifth layer 2305. For example, discrete structures 2302a, 2303a, and 2304a including the first medium are discretely arrayed so as not to be in contact with each other in the x-y plane.

The discrete structures 2302a and 2304a have a symmetry such that the discrete structures have the same shape and overlap with each other when rotated by 90 degrees in the x-y plane. Similarly, a sixth layer 2306, a seventh layer 2307, an eighth layer 2308, a tenth layer 2310, an eleventh layer 2311, a twelfth layer 2312, a 14th layer 2314, a 15th layer 2315, and a 16th layer 2316, which are disposed between layers including the columnar structures, include discrete structures. Specifically, discrete structures 2306a, 2307a, 2308a, 2310a, 2311a, 2312a, 2314a, 2315a, and 2316a including the first medium are discretely arrayed in the x-y plane at positions corresponding to the intersections of the columnar structures of the adjacent layers.

The columnar structures and the discrete structures of the layers are in contact with each other. Parts other than the columnar structures and the discrete structures of the layers are filled with a second medium. A complete photonic bandgap can be obtained over a desired and a very wide frequency range (wavelength range) by optimizing the refractive indices of the first medium and the second medium, the shape of the columnar structures or the discrete structures, the intervals at which the columnar structures or the discrete structures are disposed, and the thickness of each layer.

As in the structure shown in FIG. 39A, the shapes of the columnar structures and the discrete structures, the extending direction of the columnar structures, the intervals at which the columnar structures or the discrete structures are disposed, and the refractive indices of the media used are not limited to those of the structure described above.

The three types of discrete structures of the additional layer provided between the layers having the columnar structures can have different areas in the x-y plane. For example, the additional layer can include layers having three types of discrete structures whose areas sequentially vary in the z-axis direction.

In order to obtain a wider complete photonic bandgap, the number of layers having discrete structures can be four or more. In such a case, however, since the production process becomes complex, the number of layers having discrete structures can be selected according to the intended purpose of the waveguide structure.

As described above, layers having discrete structures that are discretely arrayed are provided between layers having columnar structures that are periodically disposed, thereby obtaining a wide complete photonic bandgap compared with known structures.

Third Exemplary Embodiment

FIGS. 25A to 25D are schematic views of a waveguide structure I in which linear defects are provided inside the woodpile structure A. The waveguide structure I includes a first linear defect 120 and second linear defects 1200, 1201, 1202, and 1203 that extend in the y-axis direction inside the woodpile structure A.

The first linear defect 120 is an area where one of the columnar structures is removed in the first layer 101. The second linear defects 1200, 1201, 1202, and 1203 are disposed in layers different from the layer having the first linear defect 120 and formed by shifting the position of some of the columnar structures extending in the y-axis direction in the layer.

Figure 25B:
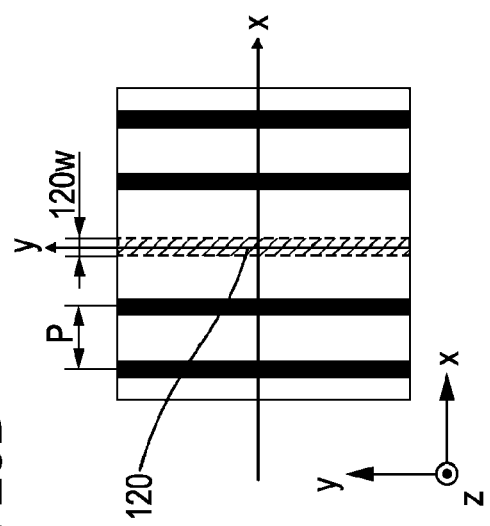
FIGS. 25A to 25D are schematic views of the relevant parts according to a third exemplary embodiment of the present invention.
Figure 25D:
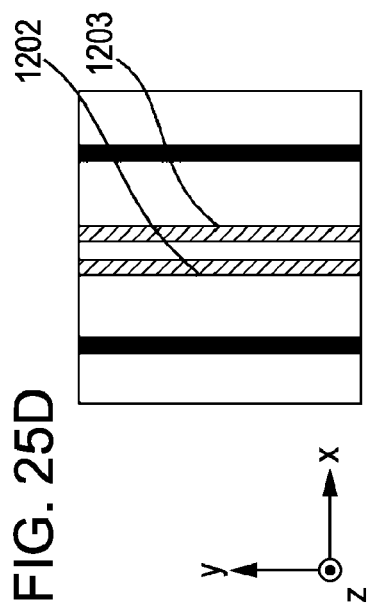
Figure 25A:
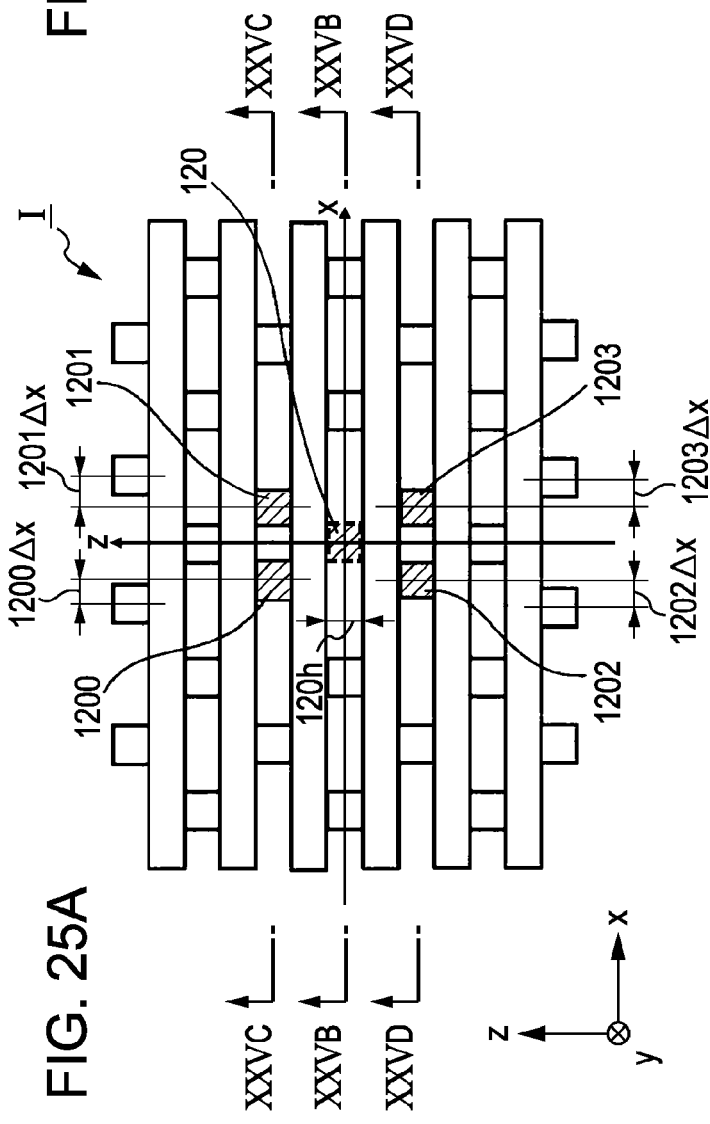
Figure 25C:
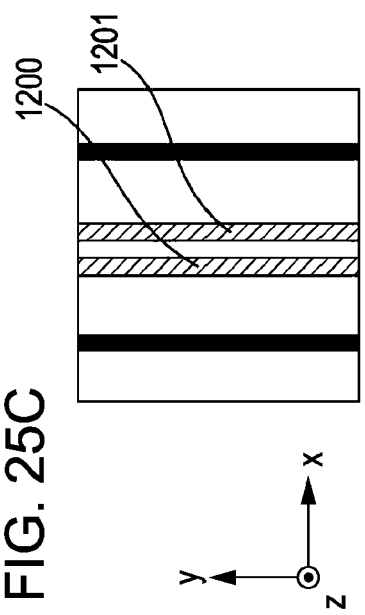

FIG. 25A is an x-z cross-sectional view of the waveguide structure I. FIGS. 25B to 25D are x-y cross-sectional views of the waveguide structure I. In this exemplary embodiment, as shown in FIGS. 25C and 25D, a description will be made of a structure including the second linear defects 1200, 1201, 1202, and 1203 formed by shifting some of the columnar structures extending in the y-axis direction by 0.10P in the x-axis direction.

Table 9 shows the structural parameters of the waveguide structure I. The center of the first linear defect 120 in the x-z cross-section is defined as the origin of the coordinates. The length of the first linear defect 120 in the x-axis direction in the layer is defined as defect width. The length of the first linear defect 120 in the stacking direction is defined as the defect height.

Furthermore, in the layers having the second linear defects, the length ranging from the central coordinates of a columnar structure before displacement to the central coordinates of the columnar structure after the displacement is defined as an amount of displacement. Regarding the sign of the direction, the direction approaching the origin in the x-axis direction is defined as the positive direction, whereas the direction away from the origin in the x-axis direction is defined as the negative direction. In Table 9 and FIGS. 25A and 25B, the defect width is represented by 120W, the defect height is represented by 120h, and the amounts of displacement are represented by 1200Δx, 1201Δx, 1202Δx, and 1203Δx.

TABLE 9

| ◆Waveguide structure I | |
|---|---|
| •Photonic crystal structure | |
| Refractive index | 2.4 |
| In-plane lattice period | P |
| Out-of-plane lattice period | 1.4 P |
| Columnar structure width | 0.35 P |
| Columnar structure height | 0.35 P |
| •First linear defect 120 | |
| Central coordinates (x, z) | (0.00 P, 0.00 P) |
| Refractive index | 1.0 |
| Defect width 120 w | 0.35 P |
| Defect height 120 h | 0.35 P |
| •Second linear defect 1200 | |
| Central coordinates (x, z) | (−0.40 P, 0.70 P) |
| Amount of displacement 1200Δx | 0.10 P |
| •Second linear defect 1201 | |
| Central coordinates (x, z) | (0.40 P, 0.70 P) |
| Amount of displacement 1201Δx | 0.10 P |

TABLE 9-continued

| ♦Waveguide structure I | |
|---|---|
| •Second linear defect 1202 | |
| Central coordinates (x, z) | (−0.40 P, −0.70 P) |
| Amount of displacement 1202Δx | 0.10 P |
| •Second linear defect 1203 | |
| Central coordinates (x, z) | (0.40 P, −0.70 P) |
| Amount of displacement 1203Δx | 0.10 P |

Figure 26A:
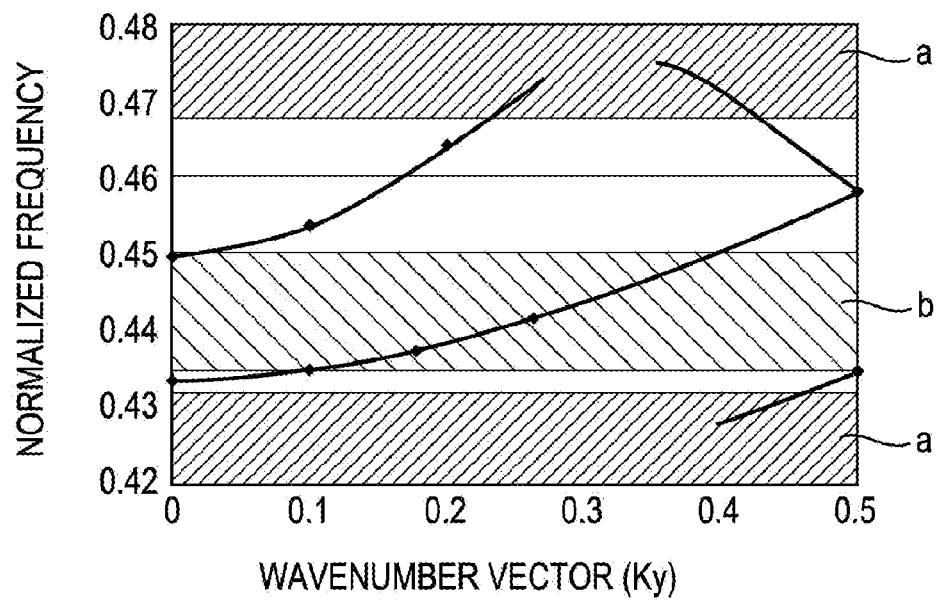
FIGS. 26A and 26B are views showing the waveguide mode of the third exemplary embodiment of the present invention.

FIG. 26A is a graph showing the waveguide mode of the waveguide structure I calculated by the FDTD method. In FIG. 26A, the abscissa of the graph represents the dimension of a component in the waveguide direction (y-axis direction) of the wavenumber vector normalized by the lattice period P. The ordinate of the graph represents the frequency normalized by the lattice period P (normalized frequency). The frequency ranges shown by areas a in FIG. 26A show the frequency range other than the complete photonic bandgap. The mode present in the complete photonic bandgap shows defect modes due to the defects. The frequency range shown by area b in FIG. 26A shows the frequency range in which light can be guided in a single mode among the defect modes. As shown in FIG. 26A, the frequency range in which light can be guided in single mode is in the range of about 0.434 to about 0.449. When the waveguide mode in the case where only the first linear defect 120 is provided and the second linear defects 1200 to 1203 are not provided in the waveguide structure I is calculated by the FDTD method, the frequency range in which light can be guided in a single mode is in the range of about 0.433 to about 0.440. These results show that the formation of the second linear defects 1200 to 1203 can provide a waveguide that can guide light in a single mode over a wide frequency range.

Figure 26B:
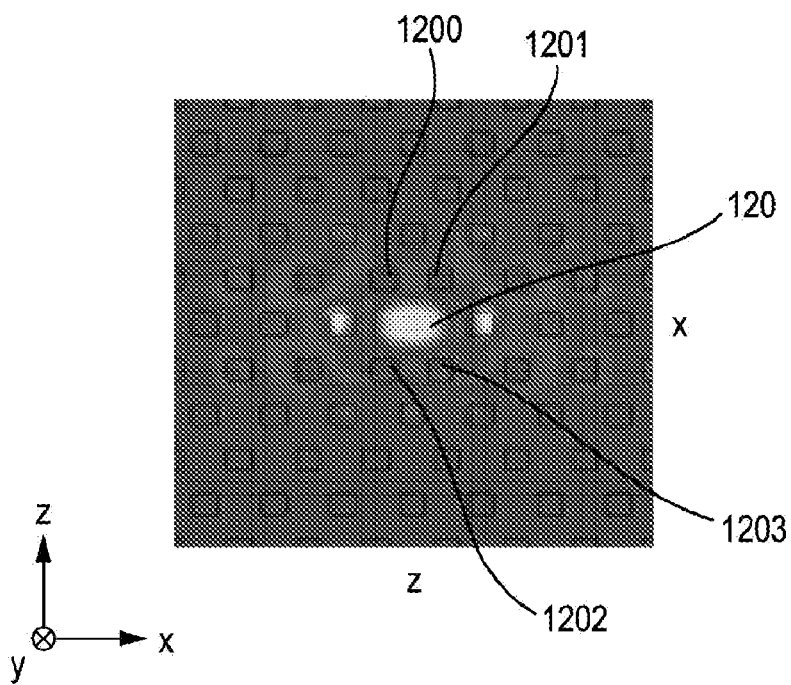

FIG. 26B shows the electromagnetic field intensity distribution in the x-z cross-section of the waveguide mode in the frequency range in which light can be guided in a single mode in the waveguide structure I. The parts shown by the white area represent the area having high electromagnetic field intensity. This result shows that the waveguide mode has a single-peaked electromagnetic field intensity distribution in which the electromagnetic field intensity is highly concentrated near the center of the waveguide.

Figure 27:
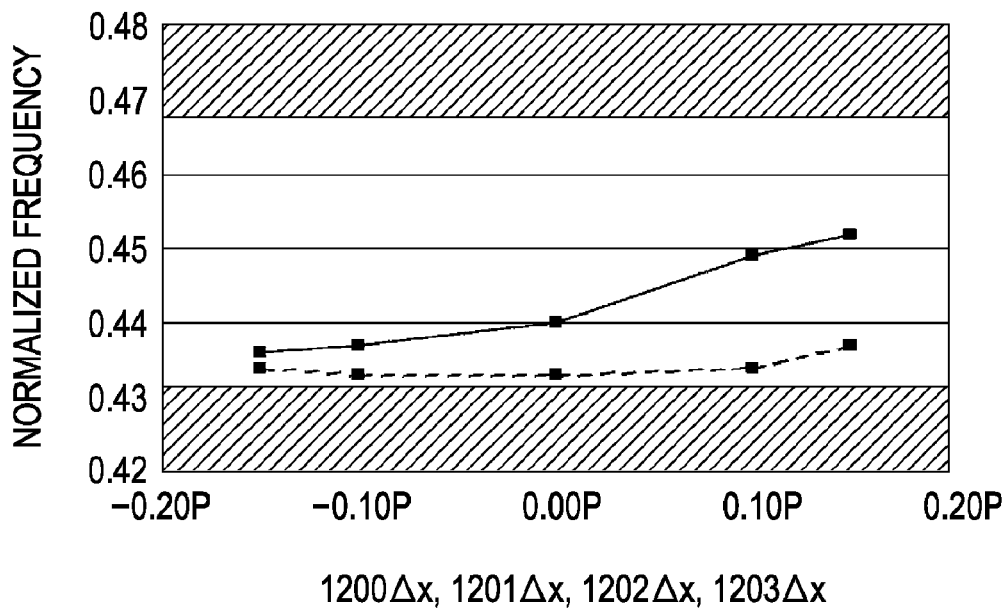
FIG. 27 is a graph showing the normalized frequency of the third exemplary embodiment of the present invention.

FIG. 27 shows the change in the frequency range in which light can be guided in a single mode in the case where the amounts of displacement 1200Δx, 1201Δx, 1202Δx, and 1203Δx of the second linear defects in the waveguide structure I are changed by the same amount at the same time. The abscissa represents the amount of displacement and the ordinate represents the normalized frequency. The continuous line and the broken line that join the points in FIG. 27 represent the high frequency and the low frequency, respectively, in the frequency range in which light can be guided in a single mode. By changing the amounts of displacement 1200Δx, 1201Δx, 1202Δx, and 1203Δx in the positive direction or the negative direction, the frequency range in which light can be guided in a single mode is changed. Accordingly, in the waveguide structure I, the frequency range in which light can be guided in a single mode can be controlled by changing the amount of displacement of the second linear defects.

In this exemplary embodiment, layers that include columnar structures extending in the same direction as the first linear defect and that are disposed nearest to the first linear defect are selected, and the second linear defects are provided at columnar structures disposed nearest to the first linear defect. Alternatively, the defects can be provided at other columnar structures. For example, layers that include columnar structures extending in the same direction as the first linear defect and that are disposed nearest to the first linear defect are selected, and the second linear defects can be provided at columnar structures disposed at positions more distant from the first linear defect. In this case, the same features can be achieved. Alternatively, the second linear defects can be provided at columnar structures disposed in layers that are more distant from the first linear defect in the stacking direction. In this case, the same features can be achieved. It is effective if the distance between the first linear defect and the second linear defects in the stacking direction is in the range of about 0.5 to about 1.5 times the out-of-plane lattice period. The reason for this is as follows. At positions nearer than about 0.5 times the out-of-plane lattice period, it is difficult to obtain the waveguide mode in which the electromagnetic field intensity distribution in the plane perpendicular to the waveguide direction is a single-peaked distribution. At positions farther than about 1.5 times the out-of-plane lattice period, the electromagnetic field of the waveguide mode is weak. Therefore, even when the second linear defects are provided, the second linear defects do not significantly affect the waveguide mode.

The number of columnar structures having the second linear defects is not limited to that given in this exemplary embodiment. When a plurality of linear defects are provided, the amounts of displacement and the directions of displacement of the linear defects can be different from each other. The frequency of the waveguide mode can be controlled more precisely by controlling the number and the position of the second linear defects.

Furthermore, the fact that features of at least one exemplary embodiment of the present invention can be achieved regardless of the refractive index of the medium of the columnar structures constituting the photonic crystal will be described. A description will be made of a waveguide structure J that includes a three-dimensional photonic crystal having columnar structures including a medium with a refractive index of about 3.6 and that has the same structure as the waveguide structure I (FIGS. 25A to 25D). Table 10 shows the structural parameters of the waveguide structure J.

TABLE 10

| ♦Waveguide structure J | |
|---|---|
| •Photonic crystal structure | |
| Refractive index | 23.6 |
| In-plane lattice period | P |
| Out-of-plane lattice period | 1.2 P |
| Columnar structure width | 0.70 P |
| Columnar structure height | 0.30 P |
| •First linear defect 120 | |
| Central coordinates (x, z) | (0.00 P, 0.00 P) |
| Refractive index | 1.0 |
| Defect width 120 w | 0.30 P |
| Defect height 120 h | 0.30 P |
| •Second linear defect 1200 | |
| Central coordinates (x, z) | (−0.65 P to −0.35 P, 0.60 P) |
| Amount of displacement 1200Δx | −0.15 P to 0.15 P |

TABLE 10-continued

◆Waveguide structure J

•Second linear defect 1201

| | |
|---|---|
| Central coordinates (x, z) | (0.65 P to 0.35 P, 0.60 P) |
| Amount of displacement 1201Δx | −0.15 P to 0.15 P |

•Second linear defect 1202

| | |
|---|---|
| Central coordinates (x, z) | (−0.65 P to −0.35 P, −0.60 P) |
| Amount of displacement 1202Δx | −0.15 P to 0.15 P |

•Second linear defect 1203

| | |
|---|---|
| Central coordinates (x, z) | (0.65 P to 0.35 P, −0.60 P) |
| Amount of displacement 1203Δx | −0.15 P to 0.15 P |

Figure 28:
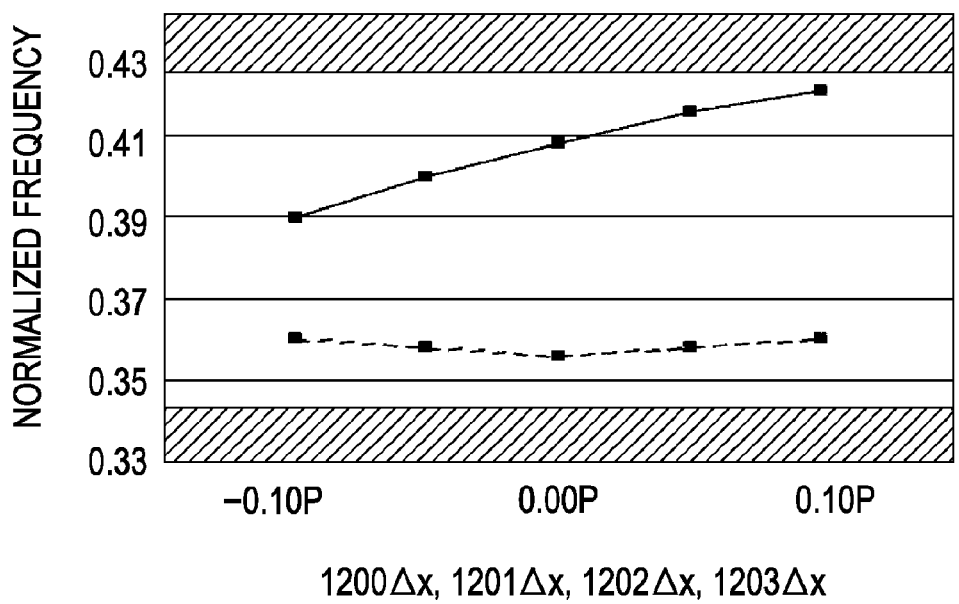
FIG. 28 is a graph showing the normalized frequency of the third exemplary embodiment of the present invention.
Figure 29B:
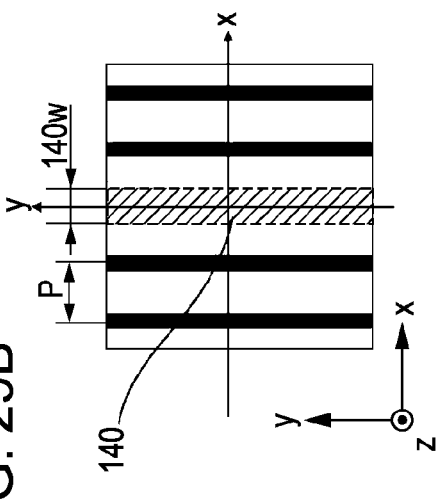
FIGS. 29A to 29D are schematic views of the relevant parts according to a fourth exemplary embodiment of the present invention.
Figure 29D:
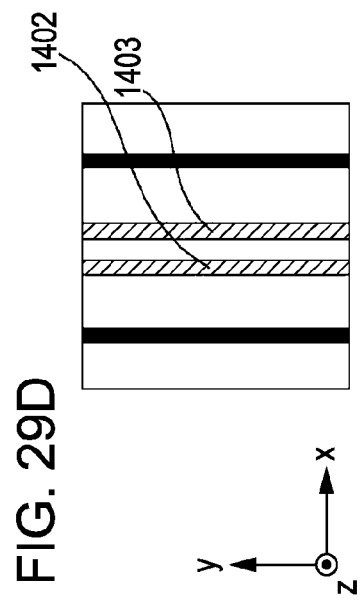
Figure 29A:
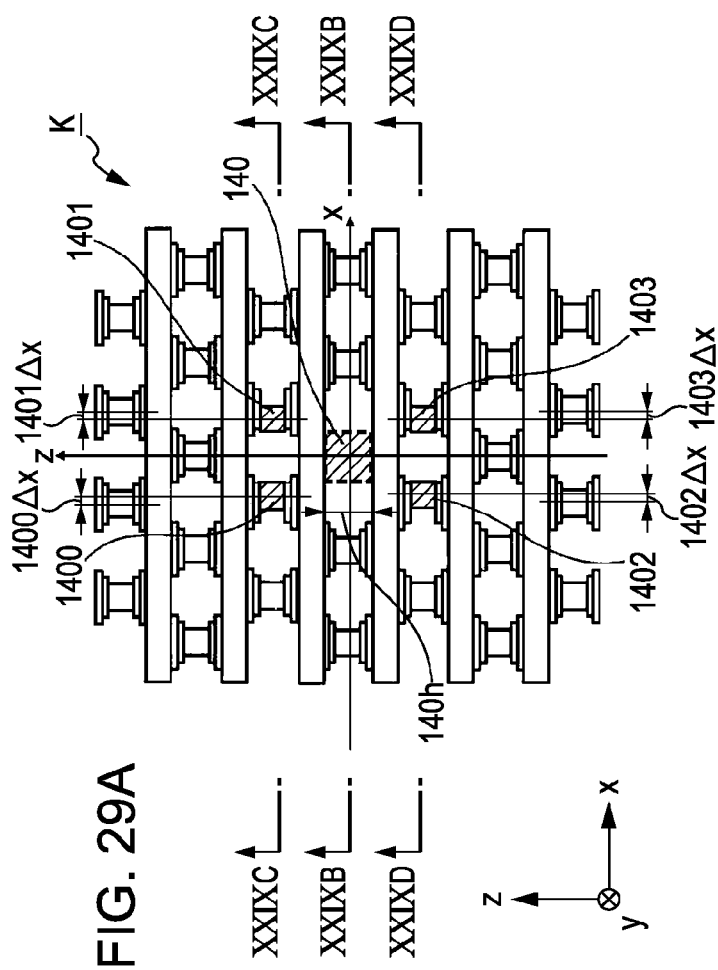
Figure 29C:
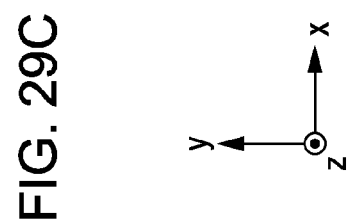

FIG. 28 shows the change in the frequency range in which light can be guided in a single mode in the case where the amounts of displacement 1200Δx, 1201Δx, 1202Δx, and 1203Δx in the waveguide structure J are changed by the same amount at the same time.

In FIG. 28, the abscissa represents the amount of displacement and the ordinate represents the normalized frequency. The continuous line and the broken line that join the points in FIG. 28 represent the high frequency and the low frequency, respectively, in the frequency range in which light can be guided in a single mode. The waveguide mode was calculated by the FDTD method. As shown in FIG. 28, by changing the amounts of displacement 1200Δx, 1201Δx, 1202Δx, and 1203Δx in the positive direction or the negative direction, the frequency range in which light can be guided in a single mode is changed. Accordingly, regardless of the refractive index of the medium constituting the three-dimensional photonic crystal structure, the frequency range in which light can be guided in a single mode can be controlled by changing the amount of displacement of the second linear defects.

Fourth Exemplary Embodiment

FIGS. 29A to 29D are schematic views showing a waveguide structure K in which linear defects are provided inside the three-dimensional photonic crystal structure D. The waveguide structure K includes a first linear defect 140 and second linear defects 1400, 1401, 1402, and 1403 that extend in the y-axis direction inside the three-dimensional photonic crystal structure D. The second linear defects 1400, 1401, 1402, and 1403 are disposed in layers different from the layer having the first linear defect 140 and formed by shifting the position of some of the columnar structures extending in the y-axis direction in the layer.

This exemplary embodiment describes a structure including the second linear defects 1400, 1401, 1402, and 1403 formed by shifting some of the columnar structures extending in the y-axis direction by 0.10P in the x-axis direction. Table 11 shows the structural parameters of the waveguide structure K. A height 140h of the first linear defect 140 is the sum of the height of the first layer 301 and that of the two adjacent layers disposed on the first layer 301 and the two adjacent layers disposed under the first layer 301. A width 140w of the first linear defect 140 corresponds to the discrete structure width Dw1 of the third layer 303. The center of the first linear defect 140 in the x-z cross-section is defined as the origin of the coordinates. The length of the first linear defect in the x-axis direction in the layer is defined as defect width. The length of the first linear defect in the stacking direction is defined as defect height. In the layers having the second linear defects, the length ranging from the central coordinates of a columnar structure before displacement to the central coordinates of the columnar structure after the displacement is defined as an amount of displacement. Regarding the sign of the direction, the direction approaching the origin in the x-axis direction is defined as the positive direction, whereas the direction away from the origin in the x-axis direction is defined as the negative direction. In Table 11 and FIGS. 29A and 29B, the defect width is represented by 140W, the defect height is represented by 140h, and the amounts of displacement are represented by 1400Δx, 1401Δx, 1402Δx, and 1403Δx.

TABLE 11

◆Waveguide structure K

•Photonic crystal structure D

| | |
|---|---|
| Refractive index | 2.4 |
| In-plane lattice period | P |
| Out-of-plane lattice period | 1.4 P |
| Columnar structure width | 0.30 P |
| Columnar structure height | 0.25 P |
| Discrete structure width Dw1 | 0.60 P |
| Discrete structure width Dw2 | 0.40 P |
| Discrete structure height Dh | 0.05 P |

•First linear defect 140

| | |
|---|---|
| Central coordinates (x, z) | (0.00 P, 0.00 P) |
| Refractive index | 1.0 |
| Defect width 140 w | 0.60 P |
| Defect height 140 h | 0.45 P |

•Second linear defect 1400

| | |
|---|---|
| Central coordinates (x, z) | (−0.45 P, 0.70 P) |
| Amount of displacement 1400Δx | 0.05 P |

•Second linear defect 1401

| | |
|---|---|
| Central coordinates (x, z) | (0.45 P, 0.70 P) |
| Amount of displacement 1401Δx | 0.05 P |

•Second linear defect 1402

| | |
|---|---|
| Central coordinates (x, z) | (−0.45 P, −0.70 P) |
| Amount of displacement 1402Δx | 0.05 P |

•Second linear defect 1403

| | |
|---|---|
| Central coordinates (x, z) | (0.45 P, −0.70 P) |
| Amount of displacement 1403Δx | 0.05 P |

Figure 30A:
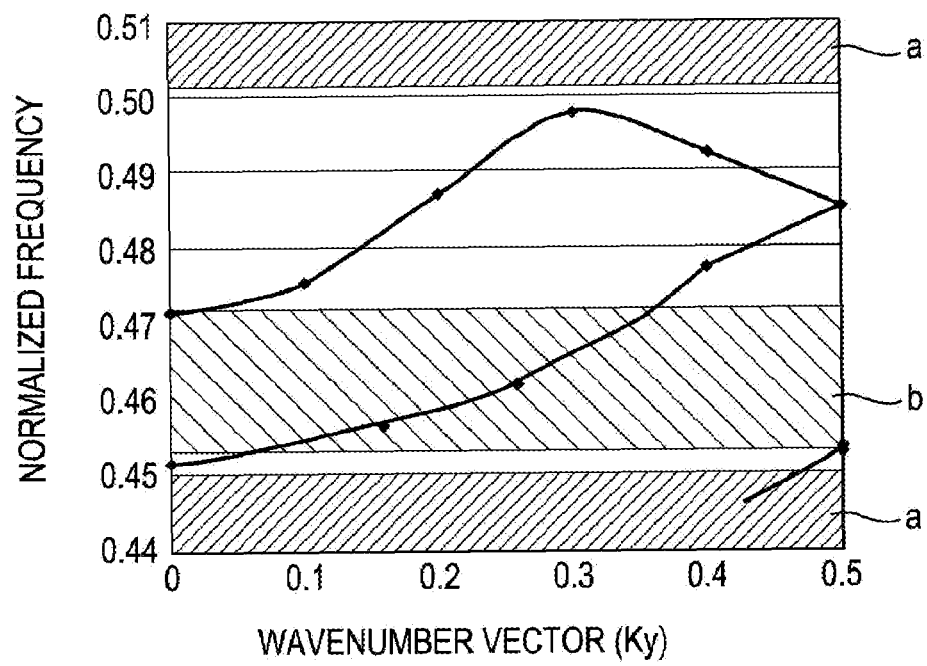
FIGS. 30A and 30B are views showing the waveguide mode of the fourth exemplary embodiment of the present invention.

FIG. 30A is a graph showing the waveguide mode of the waveguide structure K calculated by the FDTD method. The abscissa of the graph represents the dimension of a component in the waveguide direction (y-axis direction) of the wavenumber vector normalized by the lattice period P. The ordinate of the graph represents the frequency normalized by the lattice period P (normalized frequency). The frequency ranges shown by areas a in FIG. 30A show the frequency ranges other than the complete photonic bandgap. The frequency range shown by area b in FIG. 30A shows the frequency range in which light can be guided in a single mode among waveguide modes. The frequency range in which light can be guided in a single mode is in the range of about 0.454 to about 0.471. When the waveguide mode in the case where only the first linear defect 140 is provided and the second linear defects 1400 to 1403 are not provided in the waveguide structure K is calculated by the FDTD method, the frequency range in which light can be guided in a single mode is in the range of about 0.452 to about 0.466. These results show that the formation of the second linear defects 1400 to 1403 can provide a waveguide that can guide light in a single mode over a wider frequency range.

Figure 30B:
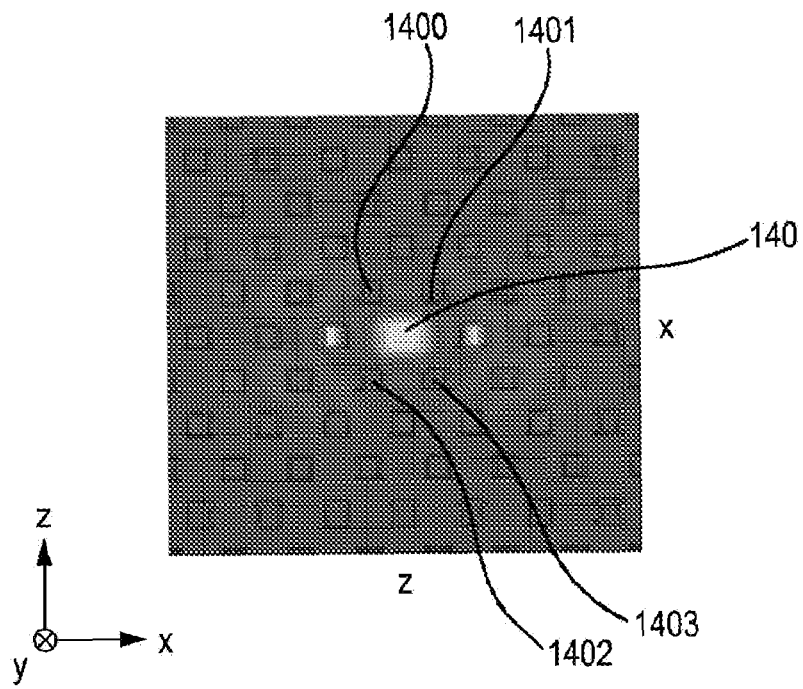

FIG. 30B shows the electromagnetic field intensity distribution in the x-z cross-section of the waveguide mode in the frequency range in which light can be guided in a single mode in the waveguide structure K. The parts shown by the whiter area represent the area having higher electromagnetic field intensity. This result shows that the waveguide mode has a single-peaked electromagnetic field intensity distribution in which the electromagnetic field intensity is highly concentrated near the center of the waveguide.

Figure 31:
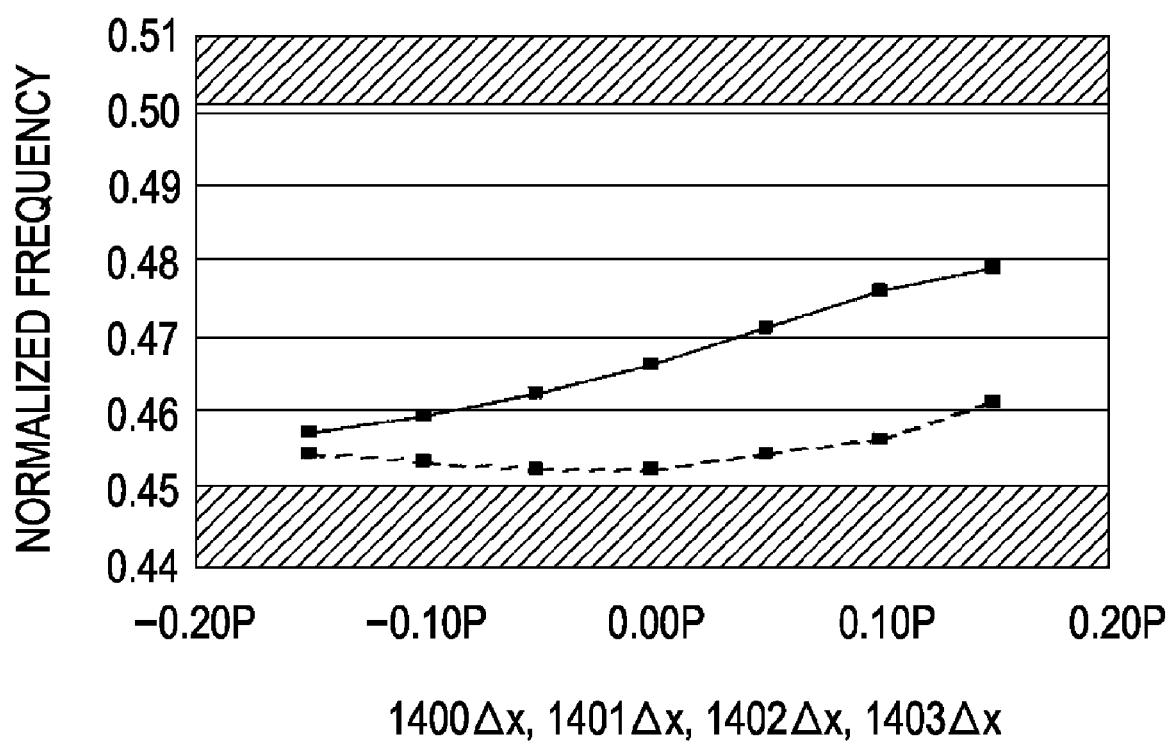
FIG. 31 is a graph showing the normalized frequency of the fourth exemplary embodiment of the present invention.

FIG. 31 shows the change in the frequency range in which light can be guided in a single mode in the case where the amounts of displacement 1400Δx, 1401Δx, 1402Δx, and 1403Δx of the second linear defects in the waveguide structure K are changed by the same amount at the same time. In FIG. 31, the abscissa represents the amount of displacement and the ordinate represents the normalized frequency. The continuous line and the broken line that join the points in FIG. 31 represent the high frequency and the low frequency, respectively, in the frequency range in which light can be guided in a single mode. By changing the amounts of displacement 1400Δx, 1401Δx, 1402Δ, and 1403Δ in the positive direction or the negative direction, the frequency range in which light can be guided in a single mode is changed. Accordingly, in the waveguide structure K, the frequency range in which light can be guided in a single mode can be controlled by changing the amount of displacement of the second linear defects.

The waveguide structure K of this exemplary embodiment can control the frequency range in which light can be guided in a single mode, and provide a substantially single-peaked intensity distribution in the plane perpendicular to the waveguide direction. The reason for this is the same as in the third exemplary embodiment.

In this exemplary embodiment, layers that include columnar structures extending in the same direction as the first linear defect and that are disposed nearest to the first linear defect are selected, and the second linear defects are provided at columnar structures disposed nearest to the first linear defect. Alternatively, the defects can be provided at other columnar structures. For example, layers that include columnar structures extending in the same direction as the first linear defect and that are disposed nearest to the first linear defect are selected, and the second linear defects can be provided at columnar structures disposed at positions further from the first linear defect. In this case, the same features can be achieved. Alternatively, the second linear defects can be provided at columnar structures disposed in layers that are further from the first linear defect in the stacking direction. In this case, the same features can be achieved.

It is effective if the distance between the first linear defect and the second linear defects in the stacking direction is in the range of about 0.5 to about 1.5 times the out-of-plane lattice period. The reason for this is as follows. At positions nearer than about 0.5 times the out-of-plane lattice period, it is difficult to obtain the waveguide mode in which the electromagnetic field intensity distribution in the plane perpendicular to the waveguide direction is a single-peaked distribution. At positions farther than about 1.5 times the out-of-plane lattice period, the electromagnetic field of the waveguide mode is weak. Therefore, even when the second linear defects are provided, the second linear defects do not significantly affect the waveguide mode. The number of the second linear defects is not limited to that given in this exemplary embodiment. When a plurality of linear defects are provided, the amounts of displacement and the directions of displacement of the linear defects can be different from each other. The frequency of the waveguide mode can be controlled by controlling the number, the position, and the amount of displacement of the second linear defects.

Figure 32B:
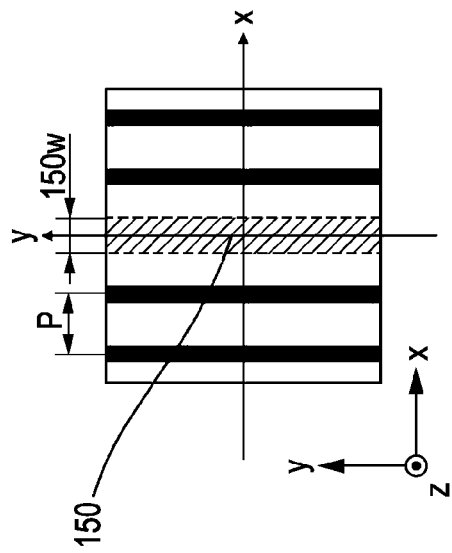
FIGS. 32A to 32D are schematic views of the relevant parts according to the fourth exemplary embodiment of the present invention.
Figure 32D:
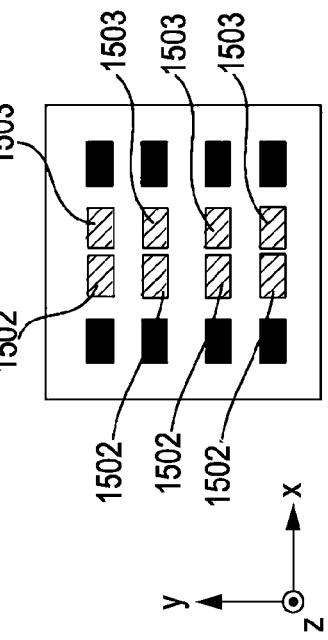
Figure 32A:
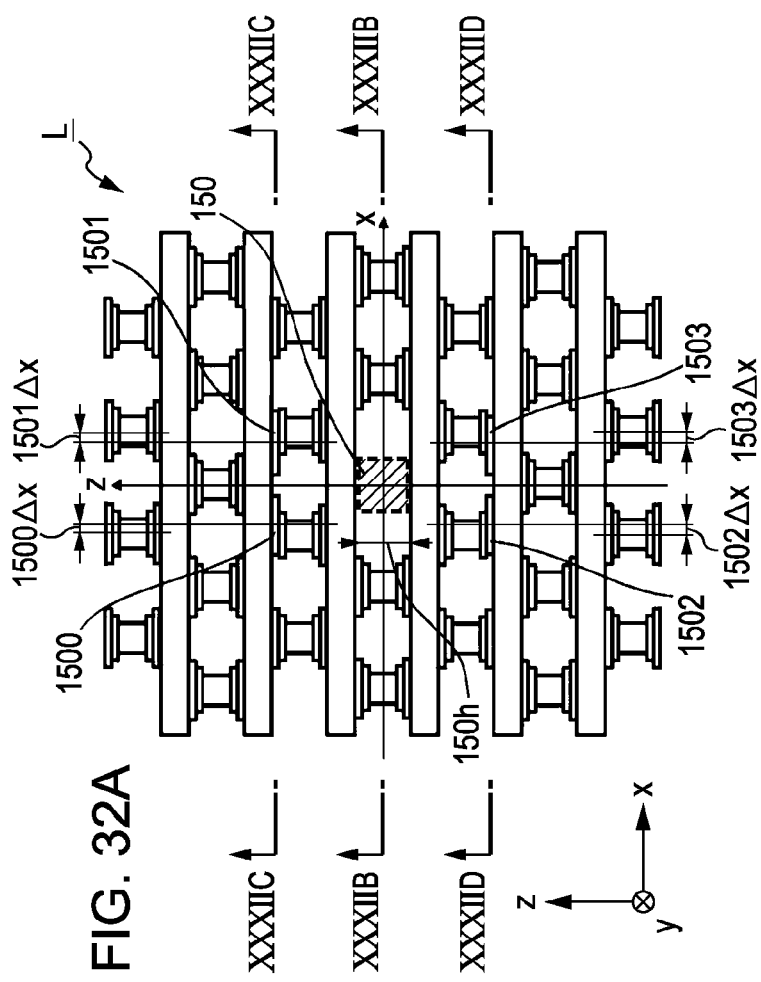
Figure 32C:
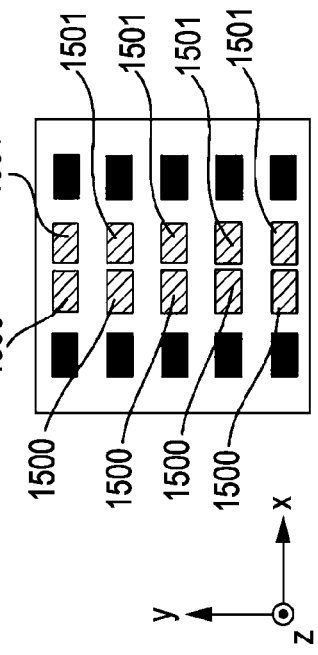

Next, a description will be made of an embodiment including the three-dimensional photonic crystal structure D in which second linear defects are provided not only at columnar structures extending in the same direction as a first linear defect but also at discrete structures. The fact that this structure can control the frequency range in which light can be guided in a single mode will be described. A waveguide structure L includes a first linear defect 150 and second linear defects 1500, 1501, 1502, and 1503 that extend in the y-axis direction inside the three-dimensional photonic crystal structure D. The area filling the first linear defect 150 is air. The second linear defects 1500, 1501, 1502, and 1503 are formed by shifting the position of some of discrete structures disposed in layers different from the layer having the first linear defect 150 in the in-plane direction. FIGS. 32C and 32D show a structure including the second linear defects 1500, 1501, 1502, and 1503 formed by shifting discrete structures disposed nearest to the first linear defect 150 in the x-axis direction. Table 12 shows the structural parameters of the waveguide structure L. A height 150h of the first linear defect 150 is the sum of the height of the first layer 301 and that of the two adjacent layers disposed on the first layer 301 and the two adjacent layers disposed under the first layer 301. In the layers having the second linear defects, the length ranging from the central coordinates of a discrete structure before displacement to the central coordinates of the discrete structure after the displacement is defined as an amount of displacement. Regarding the sign of the direction, the direction approaching the origin in the x-axis direction is defined as the positive direction, whereas the direction away from the origin in the x-axis direction is defined as the negative direction. In Table 12 and FIGS. 32A and 32B, the defect width of the first linear defect 150 is represented by 150W, the defect height of the first linear defect 150 is represented by 150h, and the amounts of displacement are represented by 1500Δx, 1501Δx, 1502Δx, and 1503Δx. The waveguide mode was calculated by the FDTD method as in the above embodiments.

TABLE 12

| ♦Waveguide structure L | |
|---|---|
| •Photonic crystal structure D | |
| Refractive index | 2.4 |
| In-plane lattice period | P |
| Out-of-plane lattice period | 1.4 P |
| Columnar structure width | 0.30 P |
| Columnar structure height | 0.25 P |
| Discrete structure width Dw1 | 0.60 P |
| Discrete structure width Dw2 | 0.40 P |
| Discrete structure height Dh | 0.05 P |
| •First linear defect 150 | |
| Central coordinates (x, z) | (0.00 P, 0.00 P) |
| Refractive index | 1.0 |
| Defect width 150 w | 0.60 P |
| Defect height 150 h | 0.45 P |
| •Second linear defect 1500 | |
| Central coordinates (x, z) | (−1.00 P to 0.00 P, 0.90 P) |
| Amount of displacement 1500Δx | −0.50 P to 0.50 P |
| •Second linear defect 1501 | |
| Central coordinates (x, z) | (1.00 P to 0.00 P, 0.90 P) |
| Amount of displacement 1501Δx | −0.50 P to 0.50 P |

TABLE 12-continued

◆Waveguide structure L

•Second linear defect 1502

| | |
|---|---|
| Central coordinates (x, z) | (−1.00 P to 0.00 P, −0.90 P) |
| Amount of displacement 1502Δx | −0.50 P to 0.50 P |
| •Second linear defect 1503 | |
| Central coordinates (x, z) | (1.00 P to 0.00 P, −0.90 P) |
| Amount of displacement 1503Δx | −0.50 P to 0.50 P |

Figure 33:
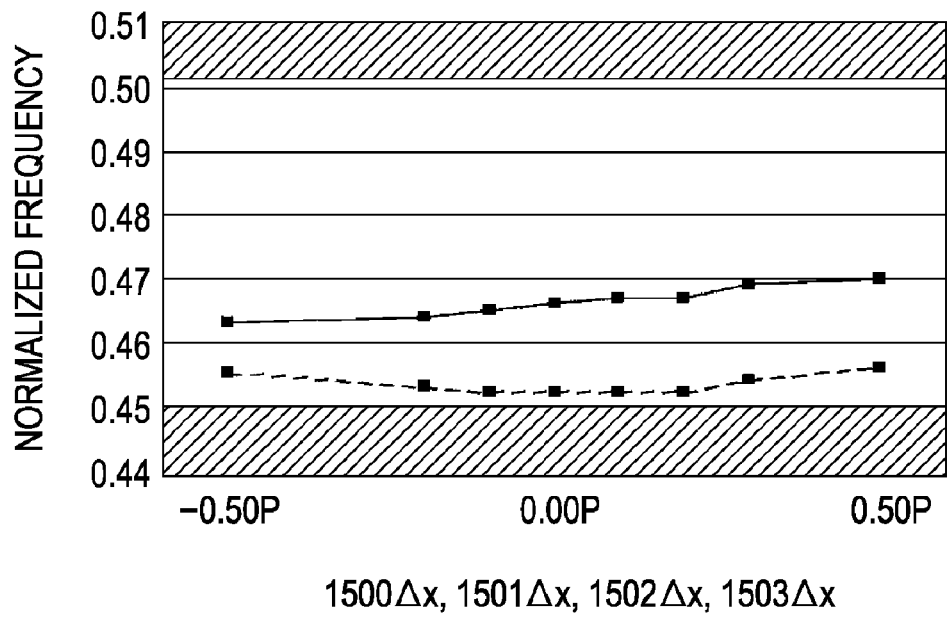
FIG. 33 is a graph showing the normalized frequency of the fourth exemplary embodiment of the present invention.

FIG. 33 shows the change in the frequency range in which light can be guided in a single mode in the case where the amounts of displacement 1500Δx, 1501Δx, 1502Δx, and 1503Δx in the waveguide structure L are changed by the same amount at the same time. In FIG. 33, the abscissa represents the amount of displacement and the ordinate represents the normalized frequency. The continuous line and the broken line that join the points in FIG. 33 represent the high frequency and the low frequency, respectively, in the frequency range in which light can be guided in a single mode. As shown in FIG. 33, by changing the amounts of displacement 1500Δx, 1501Δx, 1502Δ, and 1503Δ in the positive direction or the negative direction, the frequency range in which light can be guided in a single mode is changed.

As described above, the second linear defects are provided at some of the discrete structures disposed in layers different from the layer having the first linear defect, and the positions of the second linear defects are shifted in the direction perpendicular to the direction of extension of the first linear defect. Thereby, the frequency range in which light can be guided in a single mode can be controlled.

In this exemplary embodiment, the second linear defects are provided at discrete structures that are disposed in layers different from the layer having the first linear defect and that are disposed nearest to the first linear defect. Alternatively, the second linear defects can be provided at other discrete structures.

For example, the second linear defects can be provided at discrete structures that are disposed in layers different from the layer having the first linear defect and that are disposed at positions further from the first linear defect or discrete structures that are disposed in layers further from the first linear defect in the stacking direction. Alternatively, the second linear defects can be provided at discrete structures adjacent to columnar structures extending in the y-axis direction. In these cases, the same features can be achieved. It is effective if the distance between the first linear defect and the second linear defects in the stacking direction is in the range of about 0.5 to about 1.5 times the out-of-plane lattice period. Furthermore, the second linear defects can be provided at both the columnar structures and the discrete structures described above. The number of the second linear defects is not limited to that given in this exemplary embodiment. When a plurality of linear defects are provided, the amounts of displacement and the directions of displacement of the linear defects can be different from each other. The first linear defect in this exemplary embodiment can be formed by removing a columnar structure and discrete structures contained in additional layers adjacent to the columnar structure. Alternatively, the first linear defect can be formed by removing a columnar structure, or some of columnar structures and some of discrete structures.

Furthermore, the features of at least one exemplary embodiment of the present invention can be achieved regardless of the refractive index of the medium constituting the photonic crystal. A waveguide structure M having the same structure as the waveguide structure K shown in FIGS. 29A to 29D is formed using a photonic crystal which includes a medium with a refractive index of about 3.6. A description will be made of the fact that the frequency range in which light can be guided in a single mode can be controlled in this case. Table 13 shows the structural parameters of the waveguide structure M. The waveguide mode was calculated by the FDTD method.

TABLE 13

◆Waveguide structure M

•Photonic crystal structure D

| | |
|---|---|
| Refractive index | 3.6 |
| In-plane lattice period | P |
| Out-of-plane lattice period | 1.4 P |
| Columnar structure width | 0.25 P |
| Columnar structure height | 0.25 P |
| Discrete structure width Dw1 | 0.60 P |
| Discrete structure width Dw2 | 0.40 P |
| Discrete structure height Dh | 0.05 P |
| •First linear defect 140 | |
| Central coordinates (x, z) | (0.00 P, 0.00 P) |
| Refractive index | 1.0 |
| Defect width 140 w | 0.60 P |
| Defect height 140 h | 0.45 P |
| •Second linear defect 1400 | |
| Central coordinates (x, z) | (−0.40 P to −0.30 P, 0.70 P) |
| Amount of displacement 1400Δx | −0.10 P to 0.10 P |
| •Second linear defect 1401 | |
| Central coordinates (x, z) | (0.40 P to 0.30 P, 0.70 P) |
| Amount of displacement 1401Δx | −0.10 P to 0.10 P |
| •Second linear defect 1402 | |
| Central coordinates (x, z) | (−0.40 P to −0.30 P, −0.70 P) |
| Amount of displacement 1402Δx | −0.10 P to 0.10 P |
| •Second linear defect 1403 | |
| Central coordinates (x, z) | (0.40 P to 0.30 P, −0.70 P) |
| Amount of displacement 1403Δx | −0.10 P to 0.10 P |

Figure 34:
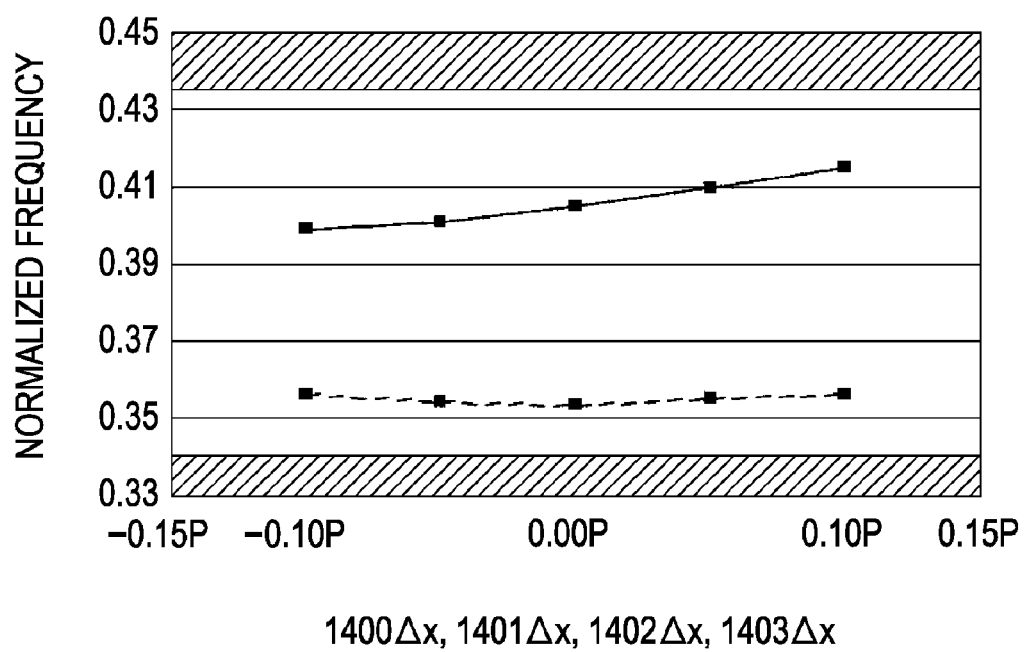
FIG. 34 is a graph showing the normalized frequency of the fourth exemplary embodiment of the present invention.

FIG. 34 shows the change in the frequency range in which light can be guided in a single mode in the case where the amounts of displacement 1400Δx, 1401Δx, 1402Δx, and 1403Δx are changed by the same amount at the same time. In FIG. 34, the abscissa represents the amount of displacement and the ordinate represents the normalized frequency. The continuous line and the broken line that join the points in FIG. 34 represent the high frequency and the low frequency, respectively, in the frequency range in which light can be guided in a single mode. The frequency range therebetween represents a frequency range in which light can be guided in a single mode. By changing the amounts of displacement 1400Δx, 1401Δx, 1402Δ, and 1403Δ, the frequency range in which light can be guided in a single mode is changed. Accordingly, regardless of the refractive index of the medium constituting the three-dimensional photonic crystal structure, the frequency range in which light can be guided in a single mode can be controlled by changing the amount of displacement of the second linear defects provided in layers different from the layer having the first linear defect.

As described above, according to the waveguide structures of at least one exemplary embodiment of the present invention, a waveguide that can guide light in a mode that is a single mode and that has a desired intensity distribution over a desired frequency range can be realized.

The medium that can constitute the above-described waveguide structures using the three-dimensional photonic crystal and a process for producing the three-dimensional photonic crystal are the same as those given in the third exemplary embodiment. The present exemplary embodiment describes a three-dimensional photonic crystal in which each additional layer includes two layers having discrete structures, but the three-dimensional photonic crystal is not limited thereto. For example, the three-dimensional photonic crystal can have a structure in which each additional layer includes one layer or three layers having discrete structures. Alternatively, the three-dimensional photonic crystal can have a structure in which discrete structures are provided at one side of a columnar structure. In these cases, the same features can also be achieved by forming linear defects at the positions described above.

Fifth Exemplary Embodiment

Embodiments of a device including a waveguide of at least one exemplary embodiment of the present invention will now be described.

First, a light-emitting device will be described. A point defect and a linear defect are provided in a three-dimensional photonic crystal. By optimizing the shape and the medium of the point defect, a resonator having a resonant mode at a desired frequency in the photonic bandgap can be produced.

A luminescent medium whose emission spectrum includes the resonant wavelength is disposed inside the resonator, and energy is supplied by means of electromagnetic waves or current to the luminescent medium from the outside. Thereby, light-emitting devices such as a laser and an LED that have a very high efficiency can be realized. When a waveguide formed by a linear defect is provided in the vicinity of the point defect resonator and the waveguide has a waveguide mode at a frequency included in the resonant mode of the resonator, light generated inside the resonator is coupled with the waveguide mode and is extracted outside the resonator. The extracted light propagates inside the waveguide as the waveguide mode and is coupled with a mode propagating in a free space outside the three-dimensional photonic crystal at an end of the waveguide. Thereby, the light can be guided outside the three-dimensional photonic crystal.

Figure 19:
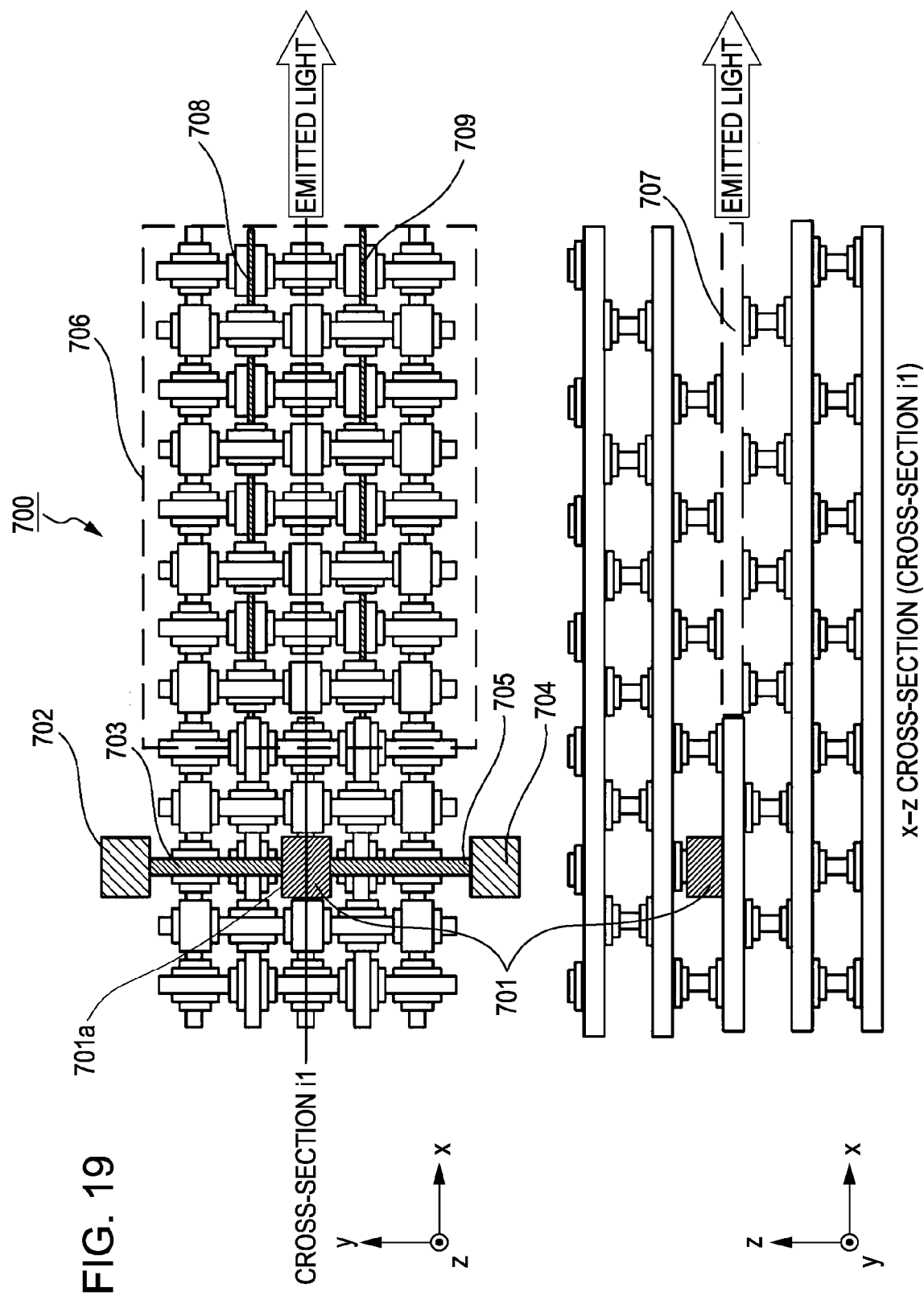
FIG. 19 includes schematic views of the relevant part according to a fifth exemplary embodiment of the present invention.

FIG. 19 includes schematic views (a top view (x-y plane) and a view representing a cross-section i1 (x-z plane)) of a light-emitting device 700 including a waveguide of at least one exemplary embodiment of the present invention and a point defect having an active part that emits light by carrier injection. The light-emitting device 700 includes a resonator 701a formed by providing a point defect 701 in a three-dimensional photonic crystal structure, a p-type electrode 702, a p-type carrier conduction path 703, an n-type electrode 704, and an n-type carrier conduction path 705.

The resonator 701a includes the active part that emits light by carrier injection. Holes are supplied to the resonator 701a through the p-type electrode 702 and the p-type carrier conduction path 703, and electrons are supplied to the resonator 701a through the n-type electrode 704 and the n-type carrier conduction path 705. The holes and the electrons are coupled inside the resonator 701a, resulting in light emission and laser oscillation.

A waveguide 706 is provided to guide the light to the outside of the resonator 701a. The waveguide 706 is formed by providing a first linear defect 707 and second linear defects 708 and 709. The first linear defect 707 is formed by removing some of columnar structures of the three-dimensional photonic crystal. The second linear defects 708 and 709 are disposed in layers different from the layer having the first linear defect 707. Optimization of the shape of the second linear defects 708 and 709 can provide a waveguide 706 having a waveguide mode in which light can be guided in a single mode at a frequency included in the resonant mode of the resonator 701a. When the waveguide 706 is disposed at an appropriate position with respect to the position of the resonator 701a, the resonant mode of the resonator 701a is effectively converted to the waveguide mode, and the light can be guided outside the three-dimensional photonic crystal from an end of the waveguide. The use of such a waveguide structure can control the waveguide mode so that the frequency of the resonant mode corresponds to the frequency range in which the light is guided in a single mode of the waveguide.

Furthermore, the waveguide 706 has a waveguide mode in which the electromagnetic field intensity is highly concentrated at the center of the waveguide in the plane perpendicular to the waveguide direction. Consequently, light in which the electromagnetic field intensity distribution does not have asymmetric distortion can be obtained from the end of the waveguide.

As described above, with the use of the waveguide according to one of the embodiments and a point defect resonator, a light-emitting device having a high performance can be realized.

Figure 20:
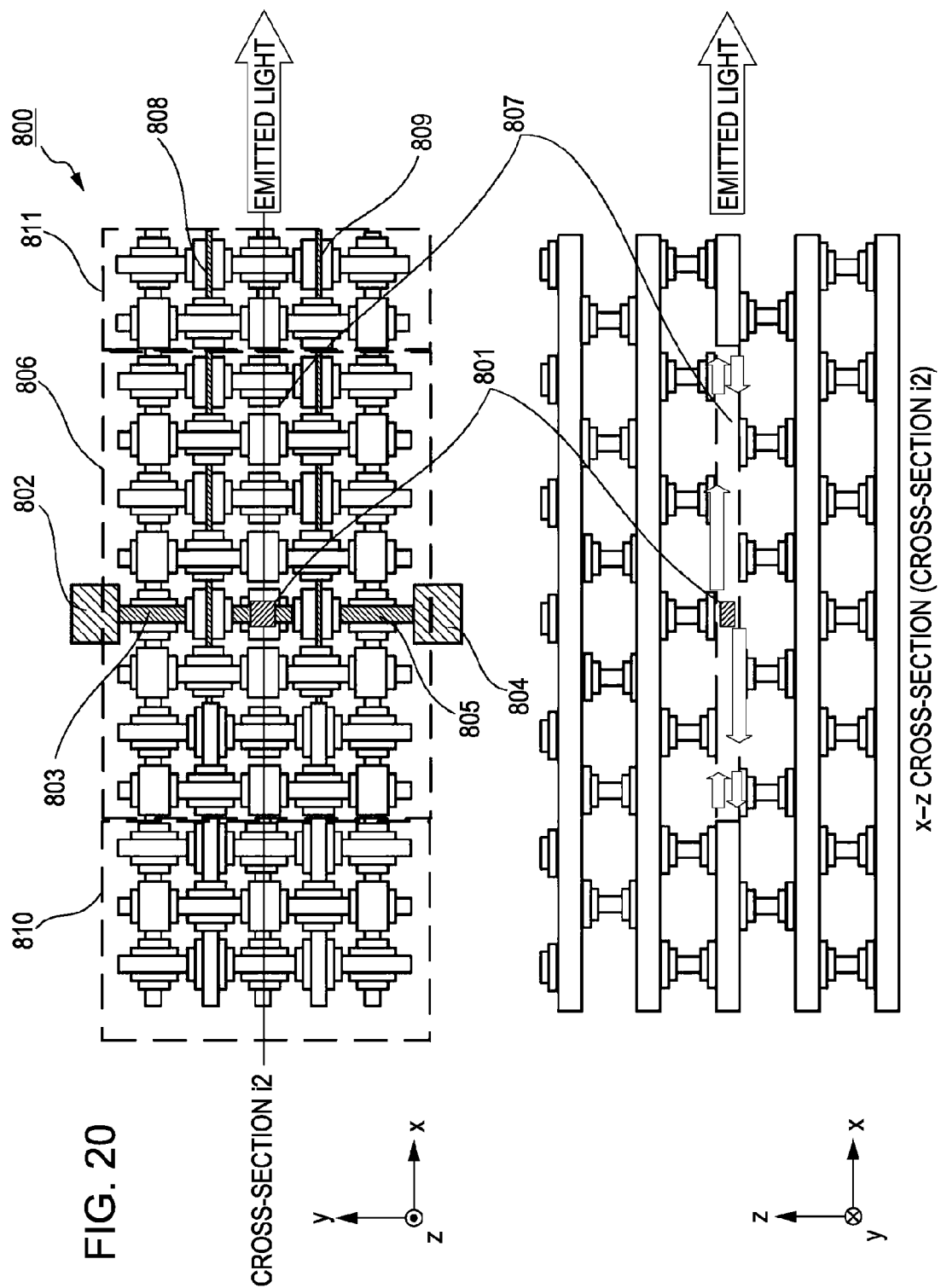
FIG. 20 includes schematic views of the relevant part according to the fifth exemplary embodiment of the present invention.

Next, FIG. 20 shows (in a top view (x-y plane) and a view representing a cross-section i2 (x-z plane)) an example of a light-emitting device 800 including a waveguide in which an active medium is provided in a linear defect of a waveguide including the linear defect of at least one exemplary embodiment of the present invention, and an excitation device that excites the active medium.

A waveguide 806 is provided in a three-dimensional photonic crystal. In FIG. 20, the waveguide 806 includes a first linear defect 807 formed by removing some of the columnar structures. The waveguide 806 includes second linear defects 808 and 809 formed by changing the shape of some of the columnar structures that are disposed in layers different from the layer having the first linear defect 807 and extend in the same direction as the first linear defect 807. In this structure, three-dimensional photonic crystals 810 and 811 are disposed outside the waveguide so that both ends of the waveguide are high reflection planes. Furthermore, an active part 801 that emits light by carrier injection is provided inside the first linear defect 807. The light-emitting device 800 includes a p-type electrode 802, a p-type carrier conduction path 803, an n-type electrode 804, and an n-type carrier conduction path 805. Holes are supplied to the active part 801 through the p-type electrode 802 and the p-type carrier conduction path 803, and electrons are supplied to the active part 801 through the n-type electrode 804 and the n-type carrier conduction path 805. The holes and the electrons are coupled inside the active part 801, resulting in light emission. The emitted light is guided in the first linear defect 807, and reflected on end faces of the waveguide. Thus, the emitted light propagates in a reciprocating manner in the first linear defect 807. In this case, the length of the waveguide 806 in the waveguide direction and the structural parameters thereof are appropriately designed so that the resonance condition is satisfied for the waveguide mode of the light emitted from the active part 801. In this case, the emitted light resonates in the first linear defect 807 and laser oscillation is performed.

The waveguide of this exemplary embodiment has a waveguide mode in which the electromagnetic field intensity is highly concentrated at the center of the waveguide in the plane perpendicular to the waveguide direction. Consequently, light in which the electromagnetic field intensity distribution does not have asymmetric distortion can be obtained from an end of the waveguide.

Furthermore, the waveguide mode can be controlled by changing the shape of the second linear defects 808 and 809. Therefore, the resonance condition is satisfied for light having an arbitrary wavelength to perform laser oscillation.

As described above, a light-emitting device including a waveguide having an active medium provided in a linear defect of the waveguide according to this exemplary embodiment, and an excitation device that excites the active medium can be used for realizing a laser device having a high performance.

Figure 21:
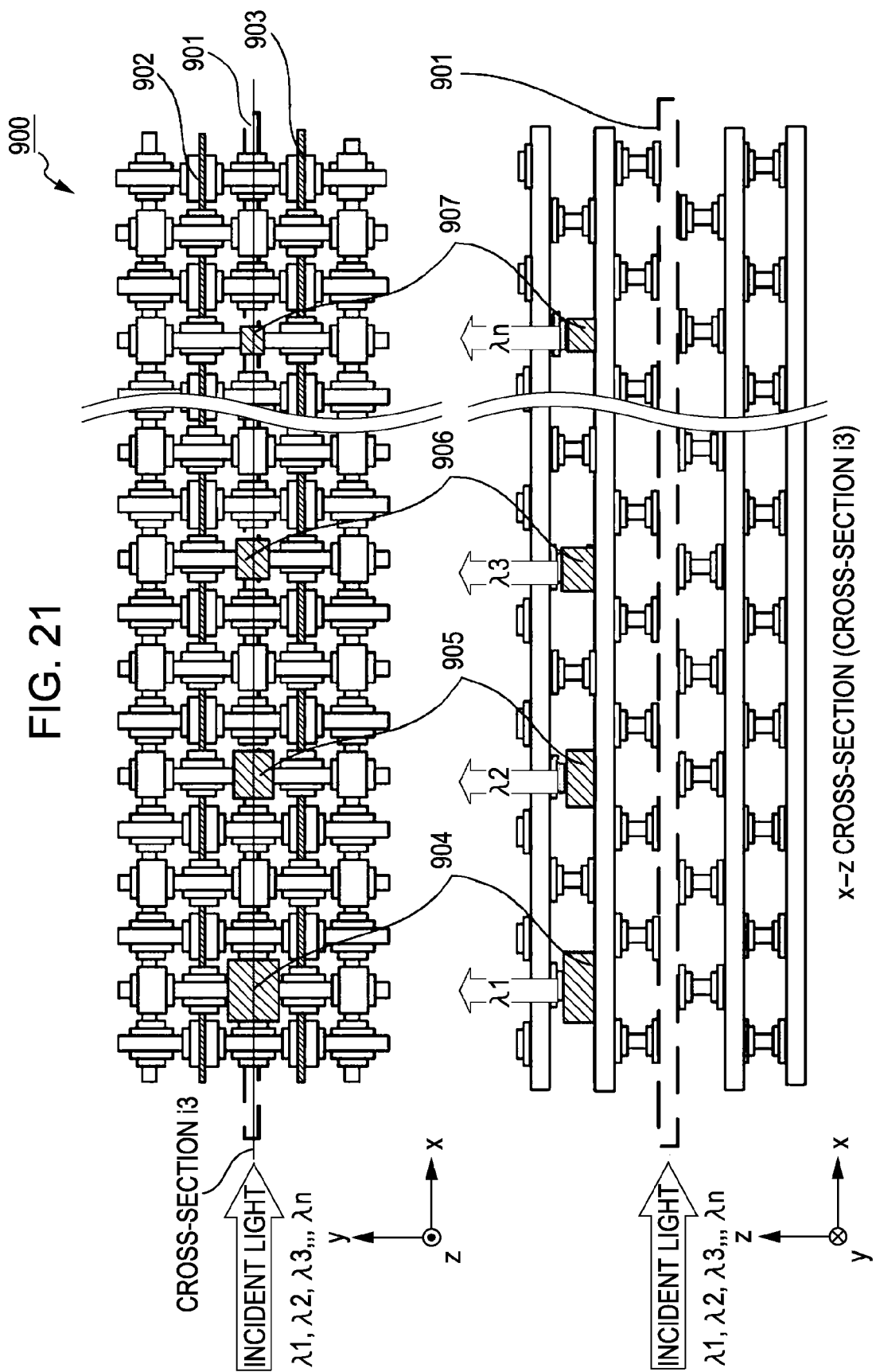
FIG. 21 includes schematic views of the relevant part according to the fifth exemplary embodiment of the present invention.

FIG. 21 shows (in a top view (x-y plane) and a view representing a cross-section i3 (x-z plane)) an example of an optical branching circuit 900 produced by combining a linear defect waveguide of at least one exemplary embodiment of the present invention and point defect resonators. A waveguide is provided in a three-dimensional photonic crystal. A waveguide shown in FIG. 21 includes a first linear defect 901 formed by removing some of the columnar structures and second linear defects 902 and 903 formed by changing the shape of some of the columnar structures that are disposed in layers different from the layer having the first linear defect 901 and extend in the same direction as the first linear defect 901. Furthermore, resonator structures 904 to 907 including points defects are provided in the vicinity of the waveguide. A desired optical branching can be realized by forming n resonators when the number of wavelengths to be branched is n. The resonator structures 904 to 907 are designed so that each of the resonator structures operates at a resonant wavelength different to that of the others. The waveguide structure is designed so that light is guided in a single mode in a wavelength range including the wavelengths at which optical branching is performed. By changing the combination of the position, the number, and the shape of the second linear defects, the waveguide mode can be controlled so that light is guided in a single mode in a range including the resonant wavelengths.

Figure 22:
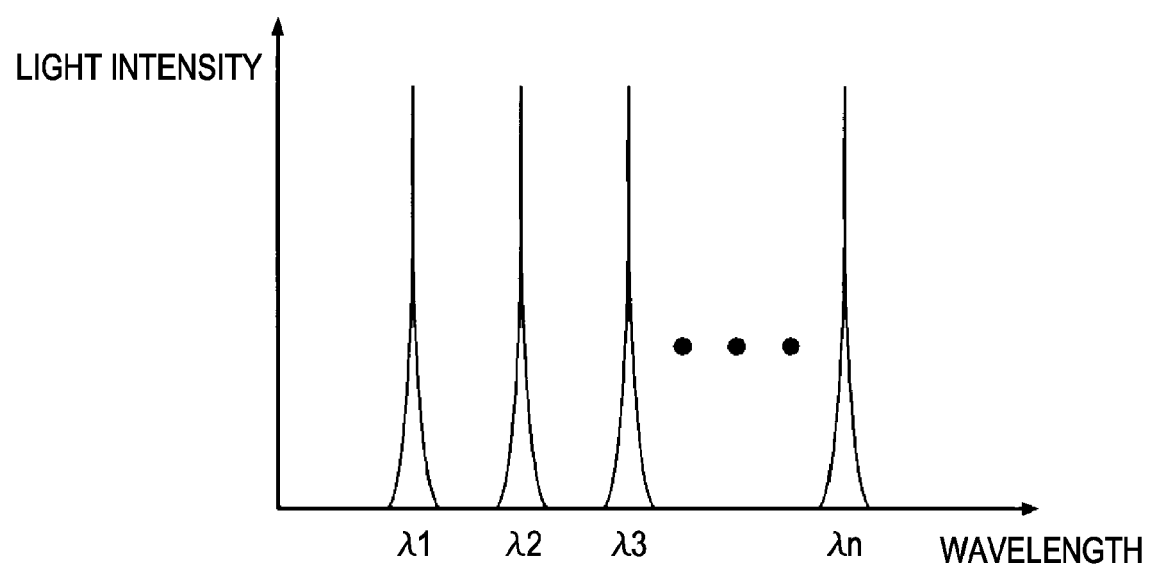
FIG. 22 is a graph illustrating a spectrum of the fifth exemplary embodiment of the present invention.
Figure 23B:
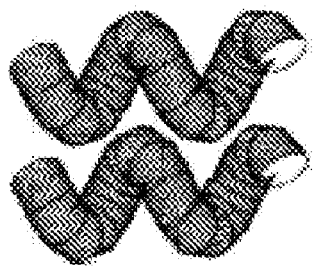
FIGS. 23A to 23F are views illustrating known photonic crystals.
Figure 23C:
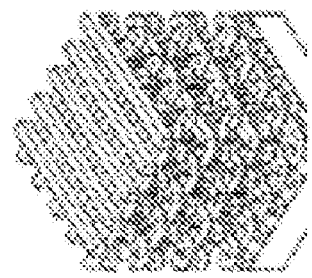
Figure 23A:
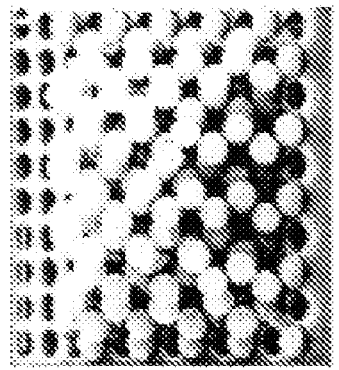
Figure 23F:
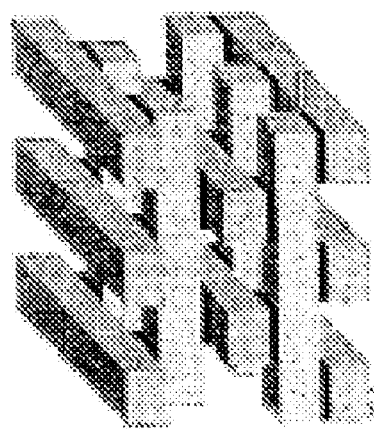
Figure 23E:
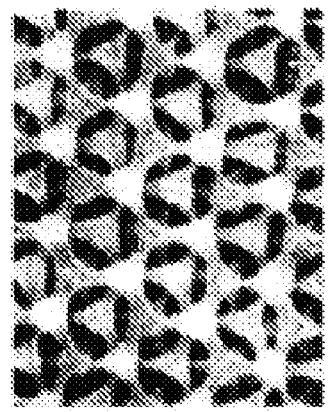
Figure 23D:
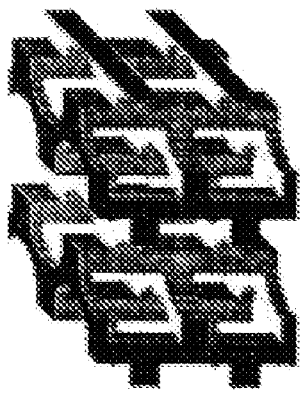
Figure 24A:
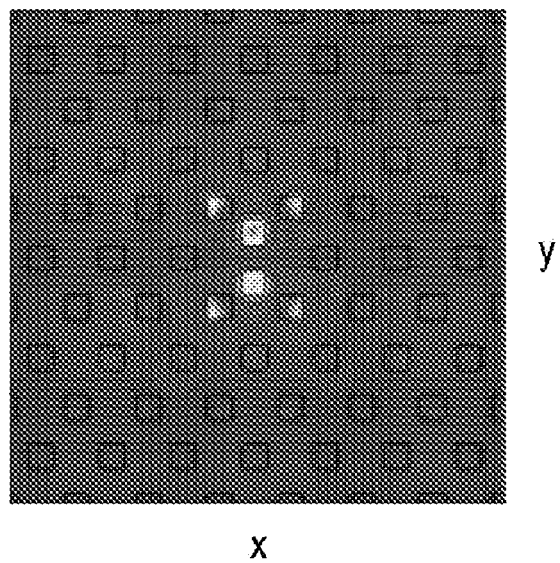
FIG. 24A is a view showing the electromagnetic field intensity distribution of a known photonic crystal.
Figure 24B:
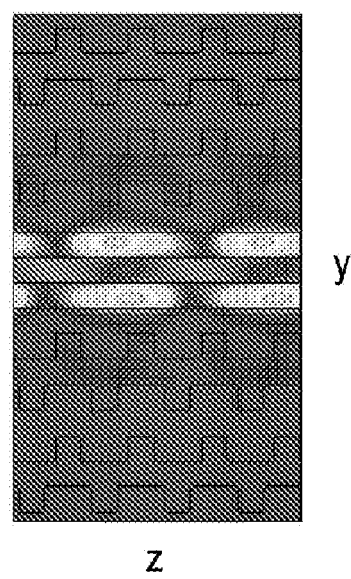
FIG. 24B is a view showing the electromagnetic field intensity distribution of the known photonic crystal.

A beam of light including resonant wavelengths λ1, λ2, λ3, . . ., and λn of the individual point defect resonators, whose spectrum is shown in FIG. 22, is led to such a waveguide structure. In this case, a beam of light having the wavelength component corresponding to each resonant wavelength can be taken up in each resonator. On the other hand, multiplexing can also be performed from the resonators into the waveguide. Such an optical device is particularly useful for an optical add-drop device used in the optical communication band.

As described above, the use of a wavelength filter including a linear defect waveguide and point defect resonators according to this exemplary embodiment can realize an optical add-drop circuit having a high performance.

Sixth Exemplary Embodiment

Figure 35:
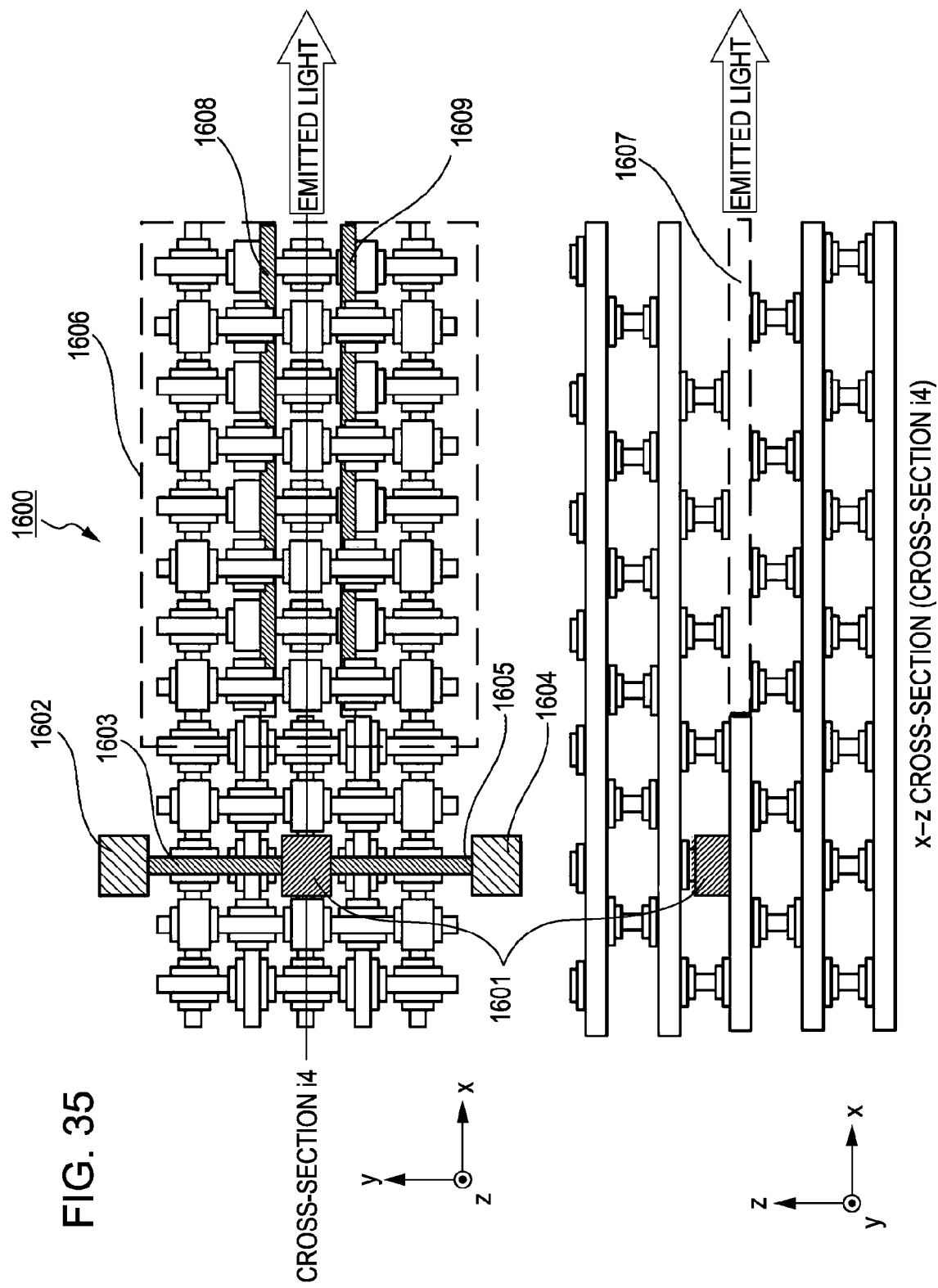
FIG. 35 includes schematic views of the relevant part according to a sixth exemplary embodiment of the present invention.

FIG. 35 includes schematic views (a top view (x-y plane) and a view representing a cross-section i4 (x-z plane)) of a light-emitting device 1600 including a waveguide of at least one exemplary embodiment of the present invention and a point defect having an active part that emits light by carrier injection. The light-emitting device 1600 includes a resonator formed by providing a point defect 1601 in a three-dimensional photonic crystal structure, a p-type electrode 1602, a p-type carrier conduction path 1603, an n-type electrode 1604, and an n-type carrier conduction path 1605. The active part that emits light by carrier injection is provided inside the resonator. Holes are supplied to the resonator through the p-type electrode 1602 and the p-type carrier conduction path 1603, and electrons are supplied to the resonator through the n-type electrode 1604 and the n-type carrier conduction path 1605. The holes and the electrons are coupled inside the resonator, resulting in light emission and laser oscillation. A waveguide 1606 according to at least one exemplary embodiment of the present invention is provided to guide the light to the outside of the resonator. The waveguide 1606 is formed by providing a first linear defect 1607 and second linear defects 1608 and 1609. The first linear defect 1607 is formed by removing some of the columnar structures of the three-dimensional photonic crystal. The second linear defects 1608 and 1609 are disposed in layers different from the layer having the first linear defect 1607. By shifting the positions of the second linear defects 1608 and 1609 to optimize the amount of displacement, a waveguide having a waveguide mode in which light can be guided in a single mode at a frequency included in the resonant mode of the resonator can be obtained. When the waveguide is disposed at an appropriate position with respect to the position of the resonator, the resonant mode of the resonator is effectively converted to the waveguide mode and the light can be guided outside the three-dimensional photonic crystal from an end of the waveguide. Thus, the use of the waveguide structure according to at least one exemplary embodiment of the present invention can control the waveguide mode so that the frequency of the resonant mode corresponds to the frequency range in which the light is guided in a single mode of the waveguide. Furthermore, the waveguide of at least one exemplary embodiment of the present invention has a waveguide mode in which the electromagnetic field intensity is highly concentrated at the center of the waveguide in the plane perpendicular to the waveguide direction. Consequently, light in which the electromagnetic field intensity distribution does not have asymmetric distortion can be obtained from the end of the waveguide. As described above, with the use of the waveguide according to at least one exemplary embodiment of the present invention and a point defect resonator, a laser device having a high performance can be realized.

Figure 36:
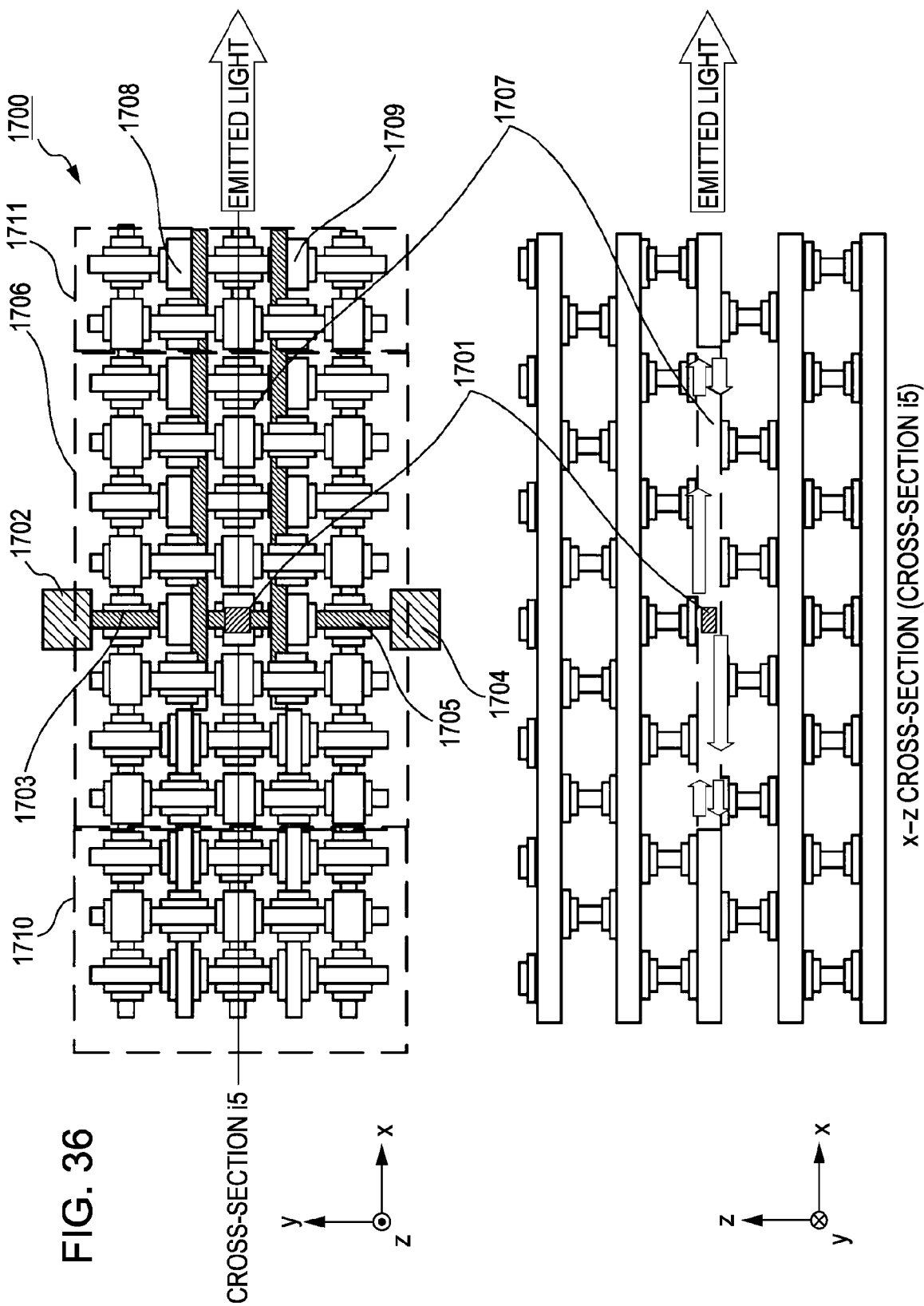
FIG. 36 includes schematic views of the relevant part according to the sixth exemplary embodiment of the present invention.

Next, FIG. 36 shows (in a top view (x-y plane) and a view representing a cross-section i5 (x-z plane)) an example of a light-emitting device 1700 including a waveguide in which an active medium is provided in a linear defect of a linear defect waveguide according to at least one exemplary embodiment of the present invention, and an excitation device that excites the active medium.

A waveguide 1706 according to at least one exemplary embodiment of the present invention is provided in a three-dimensional photonic crystal. In FIG. 36, the waveguide 1706 includes a first linear defect 1707 formed by removing some of the columnar structures. The waveguide 1706 includes second linear defects 1708 and 1709 formed by shifting the position of some of the columnar structures that are disposed in layers different from the layer having the first linear defect 1707 and extend in the same direction as the first linear defect 1707. In this structure, three-dimensional photonic crystals 1710 and 1711 are disposed outside the waveguide so that both ends of the waveguide are high reflection planes.

Furthermore, an active part 1701 that emits light by carrier injection is provided inside the first linear defect 1707. The light-emitting device 1700 includes a p-type electrode 1702, a p-type carrier conduction path 1703, an n-type electrode 1704, and an n-type carrier conduction path 1705. Holes are supplied to the active part 1701 through the p-type electrode 1702 and the p-type carrier conduction path 1703, and electrons are supplied to the active part 1701 through the n-type electrode 1704 and the n-type carrier conduction path 1705. The holes and the electrons are coupled inside the active part 1701, resulting in light emission. The emitted light is guided in the first linear defect 1707, and reflected on end faces of the waveguide. Thus, the emitted light propagates in a reciprocating manner in the first linear defect 1707. In this case, the length of the waveguide 1706 in the waveguide direction and the structural parameters thereof are appropriately designed so that the resonance condition is satisfied for the waveguide mode of the light emitted from the active part 1701. In this case, the emitted light resonates in the first linear defect 1707 and laser oscillation is performed. The waveguide of this exemplary embodiment has a waveguide mode in which the electromagnetic field intensity is highly concentrated at the center of the waveguide in the plane perpendicular to the waveguide direction. Consequently, light in which the electromagnetic field intensity distribution does not have asymmetric distortion can be obtained from an end of the waveguide.

Furthermore, the wavelength of the waveguide mode can be controlled by changing the amount of displacement of the second linear defects 1708 and 1709. Therefore, the resonance condition is satisfied for light having an arbitrary wavelength to perform laser oscillation. As described above, a light-emitting device including a waveguide having an active medium provided in a linear defect of the waveguide according to at least one exemplary embodiment of the present invention, and an excitation device that excites the active medium can be used for realizing a laser device having a high performance.

Various media can be used as the luminescent medium described in the above embodiments according to a desired resonant wavelength. Examples of the luminescent medium that can be used include compound semiconductors, inorganic luminescent materials, organic luminescent materials, polymer luminescent materials, quantum dots, and nanocrystals. Examples of a method of excitation include photo-excitation using an outer light source, and excitation by current injection. When excitation by current injection is performed, the luminescent medium can be sandwiched between electrodes including a metal such as Al or Cr or a transparent conductive material such as indium tin oxide (ITO) to perform light emission. Furthermore, electrodes that independently operate can be prepared for a plurality of resonator structures, thereby separately controlling light emitted from each resonator.

These devices can be suitably used as light sources for display, light sources for optical communication, light sources for THz, and light sources for optical pickup of DVDs, next-generation blue optical recording medium, or other light sources as known by one of ordinary skill in the relevant arts.

Figure 37:
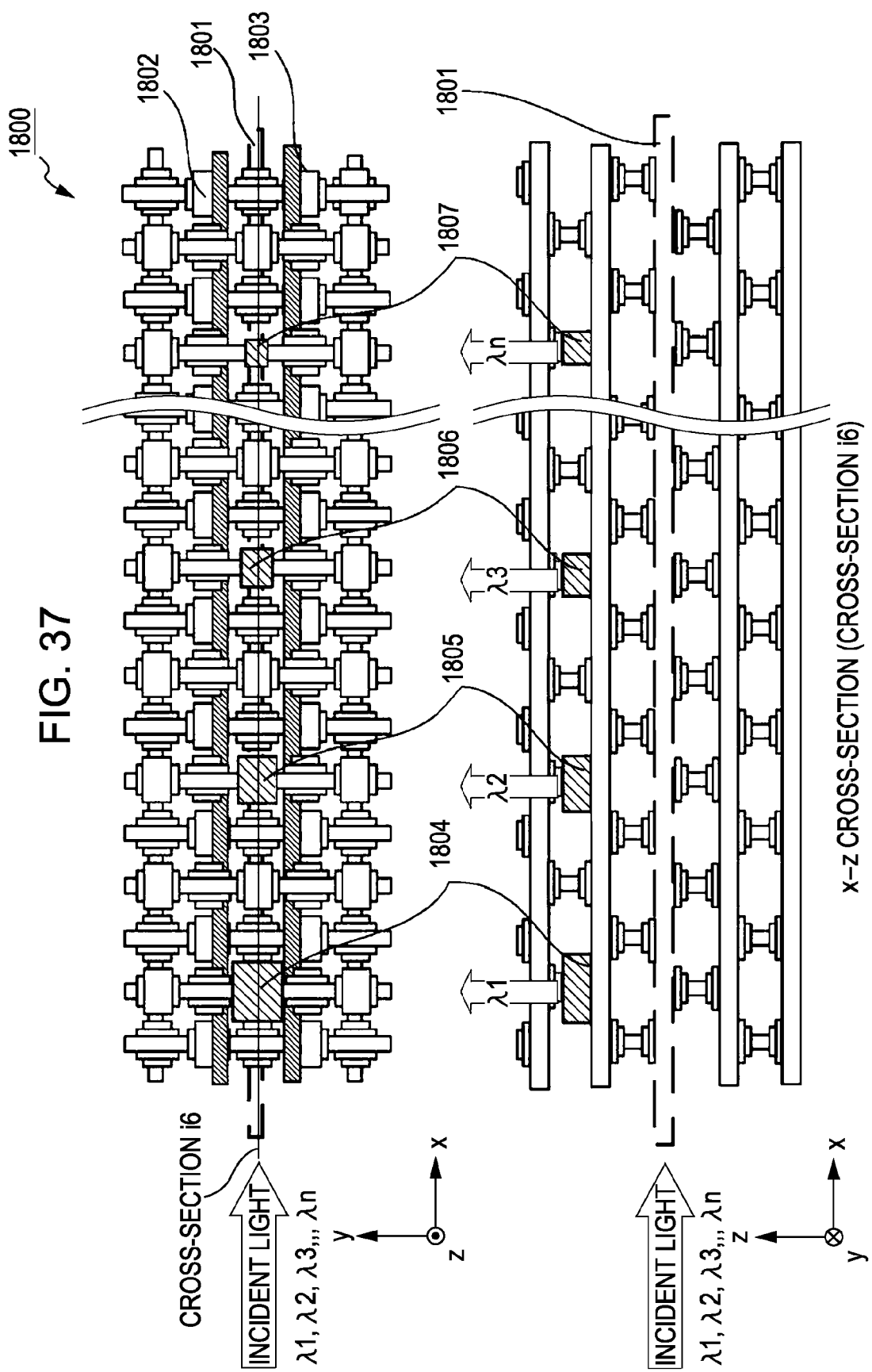
FIG. 37 includes schematic views of the relevant part according to the sixth exemplary embodiment of the present invention.

FIG. 37 shows (in a top view (x-y plane) and a view representing a cross-section i6 (x-z plane)) an example of an optical branching circuit 1800 produced by combining a linear defect waveguide of at least one exemplary embodiment of the present invention and point defect resonators. A waveguide of at least one exemplary embodiment of the present invention is provided in a three-dimensional photonic crystal. A waveguide shown in FIG. 37 includes a first linear defect 1801 formed by removing some of the columnar structures and second linear defects 1802 and 1803 formed by shifting the position of some of the columnar structures that are disposed in layers different from the layer having the first linear defect 1801 and extend in the same direction as the first linear defect 1801. Furthermore, point defect resonator structures 1804 to 1807 are provided in the vicinity of the waveguide. A desired optical branching can be realized by forming n resonators when the number of the types of wavelength to be branched is n. The resonator structures 1804 to 1807 are designed so that each of the resonator structures operates at a resonant wavelength different that of the others. The waveguide structure is designed so that light is guided in a single mode in a wavelength range including the wavelengths at which optical branching is performed. By changing the combination of the position, the number, and the amount of displacement of the second linear defects, the waveguide mode can be controlled so that light is guided in a single mode in a range including the resonant wavelengths.

Figure 38:
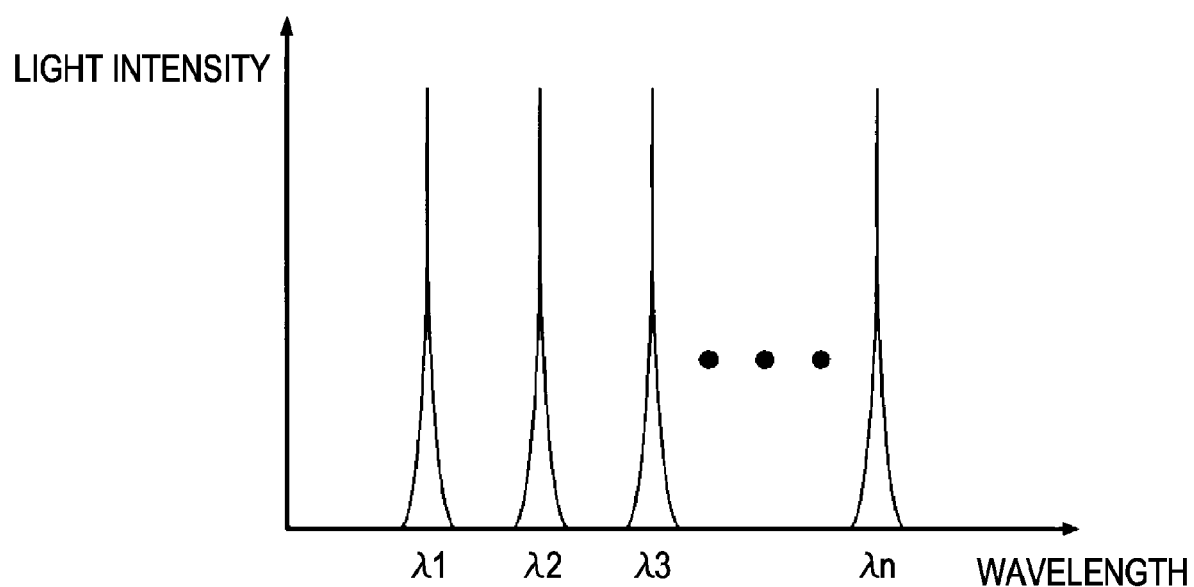
FIG. 38 is a graph illustrating a spectrum of the sixth exemplary embodiment of the present invention.

A beam of light including resonant wavelengths $\lambda 1$, $\lambda 2$, $\lambda 3$, . . ., and $\lambda n$ of the individual point defect resonators, whose spectrum is shown in FIG. 38, is led to such a waveguide structure. In this case, a beam of light having the wavelength component corresponding to each resonant wavelength can be taken up in each resonator. On the other hand, multiplexing can also be performed from the resonators into the waveguide. Such an optical device is particularly useful for an optical add-drop device used in the optical communication band.

As described above, the use of a wavelength filter including a linear defect waveguide and point defect resonators according to at least one exemplary embodiment of the present invention can realize an optical add-drop circuit having a high performance.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the priority of Japanese Application No. 2005-329025 filed Nov. 14, 2005, which is hereby incorporated by reference herein in its entirety.

What is claimed is:

1. A waveguide comprising:
a plurality of linear defects of a three-dimensional photonic crystal, wherein the three-dimensional photonic crystal includes:
   a first layer including a plurality of columnar structures disposed at a predetermined interval;
   a second layer including a plurality of columnar structures disposed at the predetermined interval, the columnar structures extending in a direction different from that in which the columnar structures in the first layer extend;
   a third layer including a plurality of columnar structures disposed at the predetermined interval, the columnar structures extending in the same direction as the columnar structures in the first layer; and
   a fourth layer including a plurality of columnar structures disposed at the predetermined interval, the columnar structures extending in the same direction as the columnar structures in the second layer, wherein the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, wherein the plurality of linear defects include a first linear defect formed by changing the medium of some of the columnar structures to a medium different from that of the unchanged columnar structures and a second linear defect formed by shifting the position or changing the shape of some of the columnar structures extending in the same direction as the first linear defect, and wherein the first linear defect and the second linear defect are disposed apart by 0.5 times the out-of-plane lattice period or more in the stacking direction of the three-dimensional photonic crystal.

2. A waveguide comprising:

a plurality of linear defects of a three-dimensional photonic crystal wherein the three-dimensional photonic crystal includes:

a first layer including a plurality of columnar structures disposed at a predetermined interval;

a second layer including a plurality of columnar structures disposed at the predetermined interval, the columnar structures extending in a direction different from that in which the columnar structures in the first layer extend;

a third layer including a plurality of columnar structures disposed at the predetermined interval, the columnar structures extending in the same direction as the columnar structures in the first layer;

a fourth layer including a plurality of columnar structures disposed at the predetermined interval, the columnar structures extending in the same direction as the columnar structures in the second layer; and additional layers, each including at least one layer containing discrete structures disposed discretely in a plane parallel to at least one of the first to fourth layers, wherein the first layer to the fourth layer are stacked sequentially with one of the additional layers disposed between the individual layers of each adjacent pair of the four layers, the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, the discrete structures contained in the additional layers are disposed at the positions corresponding to the intersections of projections of the columnar structures in at least two of the first to fourth layers, wherein the plurality of linear defects include a first linear defect formed by changing the medium of some of the columnar structures or the medium of some of the columnar structures and some of the discrete structures contained in the additional layers adjacent to the columnar structures to a medium different from that of the unchanged columnar structures and the discrete structures, and a second linear defect formed by shifting the position or changing the shape of some of the columnar structures extending in the same direction as the first linear defect, and the first linear defect and the second linear defect are disposed apart by 0.5 times the out-of-plane lattice period or more in the stacking direction of the three-dimensional photonic crystal.

3. A waveguide comprising:

a plurality of linear defects of a three-dimensional photonic crystal wherein the three-dimensional photonic crystal includes:

a first layer including a plurality of columnar structures disposed at a predetermined interval;

a second layer including a plurality of columnar structures disposed at the predetermined interval, the columnar structures extending in a direction different from that in which the columnar structures in the first layer extend;

a third layer including a plurality of columnar structures disposed at the predetermined interval, the columnar structures extending in the same direction as the columnar structures in the first layer;

a fourth layer including a plurality of columnar structures disposed at the predetermined interval, the columnar structures extending in the same direction as the columnar structures in the second layer; and additional layers, each including at least one layer containing discrete structures disposed discretely in a plane parallel to at least one of the first to fourth layers, wherein the first layer to the fourth layer are stacked sequentially with one of the additional layers disposed between the individual layers of each adjacent pair of the four layers, the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, the discrete structures contained in the additional layers are disposed at the positions corresponding to the intersections of projections of the columnar structures in at least two of the first to fourth layers, wherein the plurality of linear defects include a first linear defect formed by changing the medium of some of the columnar structures or the medium of some of the columnar structures and some of the discrete structures contained in the additional layers adjacent to the columnar structures to a medium different from that of the unchanged columnar structures and the discrete structures, and a second linear defect formed by shifting the position or changing the shape of some of the discrete structures, and wherein the first linear defect and the second linear defect are disposed apart by 0.5 times the out-of-plane lattice period or more in the stacking direction of the three-dimensional photonic crystal.

4. A waveguide comprising:
a plurality of linear defects of a three-dimensional photonic crystal wherein the three-dimensional photonic crystal includes:
 a first layer including a plurality of columnar structures disposed at a predetermined interval;
 a second layer including a plurality of columnar structures disposed at the predetermined interval, the columnar structures extending in a direction different from that in which the columnar structures in the first layer extend;
 a third layer including a plurality of columnar structures disposed at the predetermined interval, the columnar structures extending in the same direction as the columnar structures in the first layer;
 a fourth layer including a plurality of columnar structures disposed at the predetermined interval, the columnar structures extending in the same direction as the columnar structures in the second layer; and
 additional layers, each including at least one layer containing discrete structures disposed discretely in a plane parallel to at least one of the first to fourth layers, wherein the first layer to the fourth layer are stacked sequentially with one of the additional layers disposed between the individual layers of each adjacent pair of the four layers, the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, the discrete structures contained in the additional layers are disposed at the positions corresponding to the intersections of projections of the columnar structures in at least two of the first to fourth layers,
wherein the plurality of linear defects include a first linear defect formed by changing the medium of some of the columnar structures or the medium of some of the columnar structures and some of the discrete structures contained in the additional layers adjacent to the columnar structures to a medium different from that of the unchanged columnar structures and the discrete structures, and a second linear defect formed by shifting the positions or changing the shapes of some of the columnar structures extending in the same direction as the columnar structures and some of the discrete structures, and
wherein the first linear defect and the second linear defect are disposed apart by 0.5 times the out-of-plane lattice period or more in the stacking direction of the three-dimensional photonic crystal.

5. A waveguide comprising:
a plurality of linear defects of a three-dimensional photonic crystal wherein the three-dimensional photonic crystal includes:
 a first layer including a plurality of columnar structures disposed at a predetermined interval;
 a second layer including a plurality of columnar structures disposed at the predetermined interval, the columnar structures extending in a direction different from that in which the columnar structures in the first layer extend;
 a third layer including a plurality of columnar structures disposed at the predetermined interval, the columnar structures extending in the same direction as the columnar structures in the first layer; and
 a fourth layer including a plurality of columnar structures disposed at the predetermined interval, the columnar structures extending in the same direction as the columnar structures in the second layer, wherein the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures,
wherein the plurality of linear defects include a first linear defect formed by changing the medium of some of the columnar structures to a medium different from that of the unchanged columnar structures and a second linear defect formed by shifting the position and changing the shape of some of the columnar structures extending in the same direction as the first linear defect, and
wherein the first linear defect and the second linear defect are disposed apart by 0.5 times the out-of-plane lattice period or more in the stacking direction of the three-dimensional photonic crystal.

6. A waveguide comprising:
a plurality of linear defects of a three-dimensional photonic crystal wherein the three-dimensional photonic crystal includes:
 a first layer including a plurality of columnar structures disposed at a predetermined interval;
 a second layer including a plurality of columnar structures disposed at the predetermined interval, the columnar structures extending in a direction different from that in which the columnar structures in the first layer extend;
 a third layer including a plurality of columnar structures disposed at the predetermined interval, the columnar structures extending in the same direction as the columnar structures in the first layer;

a fourth layer including a plurality of columnar structures disposed at the predetermined interval, the columnar structures extending in the same direction as the columnar structures in the second layer; and additional layers, each including at least one layer containing discrete structures disposed discretely in a plane parallel to at least one of the first to fourth layers, wherein the first layer to the fourth layer are stacked sequentially with one of the additional layers disposed between the individual layers of each adjacent pair of the four layers, the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, the discrete structures contained in the additional layers are disposed at the positions corresponding to the intersections of projections of the columnar structures in at least two of the first to fourth layers, wherein the plurality of linear defects include a first linear defect formed by changing the medium of some of the columnar structures or the medium of some of the columnar structures and some of the discrete structures contained in the additional layers adjacent to the columnar structures to a medium different from that of the unchanged columnar structures and the discrete structures, and a second linear defect formed by shifting the position and changing the shape of some of the columnar structures extending in the same direction as the first linear defect, and the first linear defect and the second linear defect are disposed apart by 0.5 times the out-of-plane lattice period or more in the stacking direction of the three-dimensional photonic crystal.

7. A waveguide comprising:

a plurality of linear defects of a three-dimensional photonic crystal wherein the three-dimensional photonic crystal includes:

a first layer including a plurality of columnar structures disposed at a predetermined interval;

a second layer including a plurality of columnar structures disposed at the predetermined interval, the columnar structures extending in a direction different from that in which the columnar structures in the first layer extend;

a third layer including a plurality of columnar structures disposed at the predetermined interval, the columnar structures extending in the same direction as the columnar structures in the first layer;

a fourth layer including a plurality of columnar structures disposed at the predetermined interval, the columnar structures extending in the same direction as the columnar structures in the second layer; and additional layers, each including at least one layer containing discrete structures disposed discretely in a plane parallel to at least one of the first to fourth layers, wherein the first layer to the fourth layer are stacked sequentially with one of the additional layers disposed between the individual layers of each adjacent pair of the four layers, the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, the discrete structures contained in the additional layers are disposed at the positions corresponding to the intersections of projections of the columnar structures in at least two of the first to fourth layers, wherein the plurality of linear defects include a first linear defect formed by changing the medium of some of the columnar structures or the medium of some of the columnar structures and some of the discrete structures contained in the additional layers adjacent to the columnar structures to a medium different from that of the unchanged columnar structures and the discrete structures, and a second linear defect formed by shifting the position and changing the shape of some of the discrete structures, and wherein the first linear defect and the second linear defect are disposed apart by 0.5 times the out-of-plane lattice period or more in the stacking direction of the three-dimensional photonic crystal.

8. A waveguide comprising:

a plurality of linear defects of a three-dimensional photonic crystal wherein the three-dimensional photonic crystal includes:

a first layer including a plurality of columnar structures disposed at a predetermined interval;

a second layer including a plurality of columnar structures disposed at the predetermined interval, the columnar structures extending in a direction different from that in which the columnar structures in the first layer extend;

a third layer including a plurality of columnar structures disposed at the predetermined interval, the columnar structures extending in the same direction as the columnar structures in the first layer;

a fourth layer including a plurality of columnar structures disposed at the predetermined interval, the columnar structures extending in the same direction as the columnar structures in the second layer; and additional layers, each including at least one layer containing discrete structures disposed discretely in a plane parallel to at least one of the first to fourth layers, wherein the first layer to the fourth layer are stacked sequentially with one of the additional layers disposed between the individual layers of each adjacent pair of the four layers, the first layer and the third layer are stacked such that the positions at which the columnar structures contained in the first layer are disposed are shifted by one-half the predetermined interval with respect to the positions at which the columnar structures contained in the third layer are disposed in a direction perpendicular to the direction of extension of the columnar structures, and the second layer and the fourth layer are stacked such that the positions at which the columnar structures contained in the second layer are disposed are shifted by one-half the predetermined interval with respect to the positions at which the columnar structures contained in the fourth layer are disposed in a direction perpendicular to the direction of extension of the columnar structures, the discrete structures contained in the additional layers are disposed at the positions corresponding to the intersections of projections of the columnar structures in at least two of the first to fourth layers, wherein the plurality of linear defects include a first linear defect formed by changing the medium of some of the columnar structures or the medium of some of the columnar structures and some of the discrete structures contained in the additional layers adjacent to the columnar structures to a medium different from that of the unchanged columnar structures and the discrete structures, and a second linear defect formed by shifting the positions and changing the shapes of some of the columnar structures extending in the same direction as the columnar structures and some of the discrete structures, and wherein the first linear defect and the second linear defect are disposed apart by 0.5 times the out-of-plane lattice period or more in the stacking direction of the three-dimensional photonic crystal.

9. The waveguide according to claim 1, wherein the first linear defect and the second linear defect are disposed apart by 1.5 times the out-of-plane lattice period or less in the stacking direction of the three-dimensional photonic crystal.

10. The waveguide according to claim 1, wherein the second linear defect is provided at the columnar structures disposed nearest to the first linear defect.

11. A light-emitting device comprising:
the waveguide according to claim 1; and
a resonator including a point defect of the three-dimensional photonic crystal, wherein light emitted from the resonator is guided in the waveguide.

12. A light-emitting device comprising:
the waveguide according to claim 1; and
an excitation device, wherein the first linear defect or the second linear defect in the waveguide includes an active medium and the excitation device excites the active medium.

13. An optical add-drop circuit comprising:
the waveguide according to claim 1; and
a resonator including a point defect of the three-dimensional photonic crystal.

14. A waveguide comprising a three-dimensional photonic crystal including:
a first layer including a plurality of columnar structures arranged at a predetermined interval;
a second layer including a plurality of columnar structures arranged at said interval so as to extend in a direction different from the longitudinal direction of the columnar structures of the first layer;
a third layer including a plurality of columnar structures arranged at said interval so as to extend in the longitudinal direction of the columnar structures of the first layer, the columnar structures of the third layer being shifted from the columnar structures of the first layer by half said interval in a direction perpendicular to the longitudinal direction thereof; and
a fourth layer including a plurality of columnar structures arranged at said interval so as to extend in the longitudinal direction of the columnar structures of the second layer, the columnar structures of the fourth layer being shifted from the columnar structures of the second layer by half said interval in a direction perpendicular to the longitudinal direction thereof,
wherein the three dimensional photonic crystal includes a first linear defect disposed at part of the columnar structures, the first linear defect comprising a medium different from the columnar structures, and a second linear defect disposed at part of the columnar structures extending in the longitudinal direction of the first linear defect, the second linear defect having a structure which differs from the columnar structures and being separated from the first linear defect by a distance of at least 0.5 times the out-of-plane lattice period of the three-dimensional photonic crystal in a direction in which the layers are stacked.

* * * * *